United States Patent
Horii et al.

(10) Patent No.: US 10,636,968 B2
(45) Date of Patent: *Apr. 28, 2020

(54) VARIABLE RESISTANCE MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Hideki Horii, Seoul (KR); Seong-Geon Park, Seongnam-si (KR); Dong-Ho Ahn, Hwaseong-si (KR); Jung-Moo Lee, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/277,491

(22) Filed: Feb. 15, 2019

(65) Prior Publication Data

US 2019/0189920 A1    Jun. 20, 2019

Related U.S. Application Data

(63) Continuation of application No. 15/432,346, filed on Feb. 14, 2017, now Pat. No. 10,236,444.

(30) Foreign Application Priority Data

Aug. 11, 2016  (KR) .................. 10-2016-0102316

(51) Int. Cl.
*H01L 45/00* (2006.01)
*H01L 27/24* (2006.01)

(52) U.S. Cl.
CPC ...... *H01L 45/1683* (2013.01); *H01L 27/2427* (2013.01); *H01L 27/2463* (2013.01);
(Continued)

(58) Field of Classification Search
CPC ............ H01L 27/2427; H01L 27/2463; H01L 45/1233; H01L 45/126; H01L 45/1683
See application file for complete search history.

(56) References Cited

U.S. PATENT DOCUMENTS 7,824,954 B2    11/2010   An et al.
7,995,374 B2     8/2011   Komura et al.
(Continued)

FOREIGN PATENT DOCUMENTS

| | | |
|---|---|---|
| CN | 103872067 | 6/2014 |
| KR | 10-2013-0135603 | 12/2013 |

OTHER PUBLICATIONS

Office Action dated Aug. 2, 2019 in corresponding Chinese Patent Application No. 201710679593.2 (10 pages).
(Continued)

*Primary Examiner* — Allison Bernstein
(74) *Attorney, Agent, or Firm* — F. Chau & Associates, LLC

(57) ABSTRACT

A variable resistance memory device includes first conductive lines positioned above a substrate. Each of the first conductive lines extends in a first direction and a second direction. Second conductive lines extend in the first direction and the second direction. The second conductive lines are positioned above the first conductive lines. A memory is positioned between the first and second conductive lines. The memory unit overlaps the first and second conductive lines in a third direction. The memory unit includes a first electrode, a variable resistance pattern positioned on the first electrode, and a second electrode positioned on the variable resistance pattern. A selection pattern is positioned on each memory unit. A third electrode is positioned above the selection pattern. The third electrode is in direct contact with a lower surface of each of the second conductive lines.

20 Claims, 57 Drawing Sheets

(52) U.S. Cl.
CPC ........ *H01L 27/2481* (2013.01); *H01L 45/065* (2013.01); *H01L 45/06* (2013.01); *H01L 45/126* (2013.01); *H01L 45/1233* (2013.01); *H01L 45/1273* (2013.01); *H01L 45/144* (2013.01)

(56) References Cited

U.S. PATENT DOCUMENTS

| | | |
|---|---|---|
| 8,384,060 B2 | 2/2013 | Ryoo et al. |
| 8,404,514 B2 | 3/2013 | Lee et al. |
| 8,507,889 B2 | 8/2013 | Nagashima |
| 8,518,790 B2 | 8/2013 | Kim et al. |
| 8,614,135 B2 | 12/2013 | Eun et al. |
| 8,753,973 B2 | 6/2014 | Furuhashi |
| 8,765,581 B2 | 7/2014 | Lee et al. |
| 9,118,003 B2 | 8/2015 | Park et al. |
| 9,306,165 B2 | 4/2016 | Lee et al. |
| 9,431,610 B2 | 8/2016 | Park et al. |
| 9,620,566 B2 | 4/2017 | Park |
| 2012/0040508 A1 | 2/2012 | Oh et al. |
| 2015/0280118 A1 | 10/2015 | Lee et al. |
| 2017/0271581 A1 | 9/2017 | Seong et al. |
| 2018/0047899 A1 | 2/2018 | Horii et al. |

OTHER PUBLICATIONS

Chinese Office Action for Application Serial No. 201710679593.2 dated Mar. 11, 2020.

FIG. 3
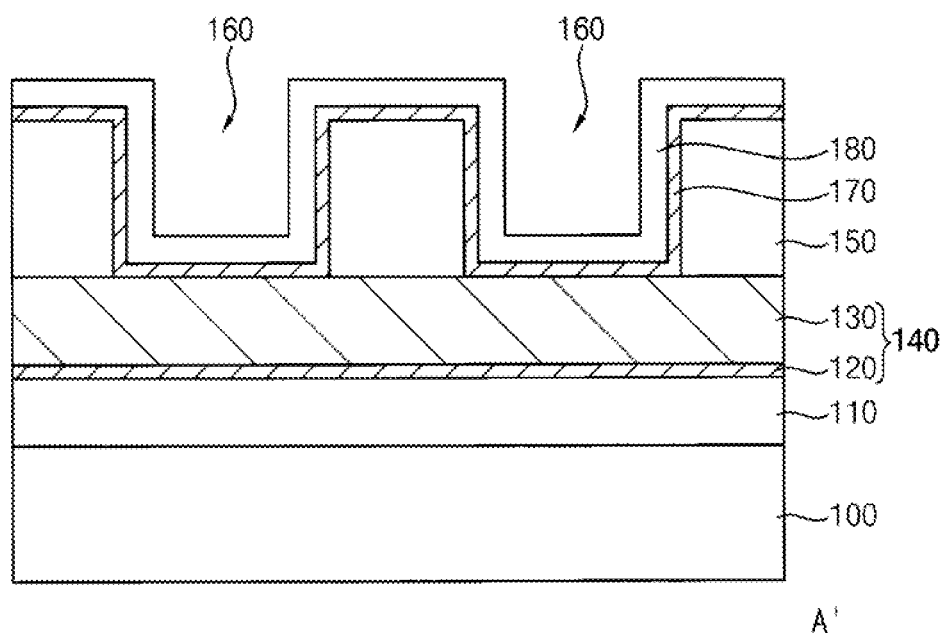
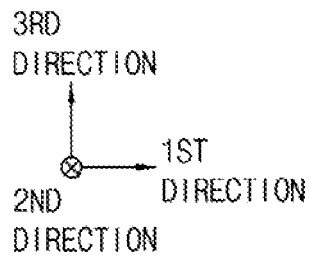

FIG. 5
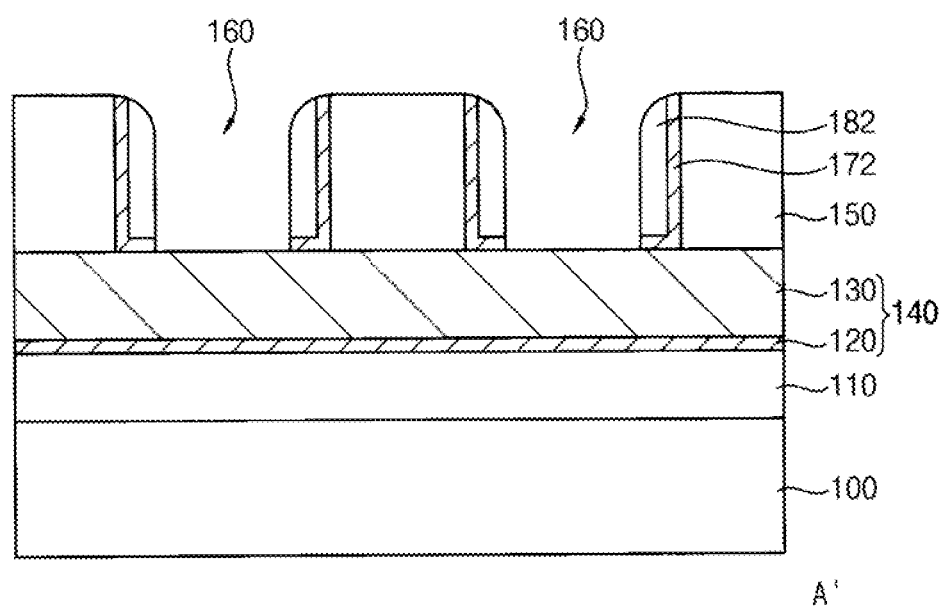
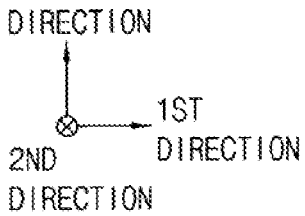

FIG. 6
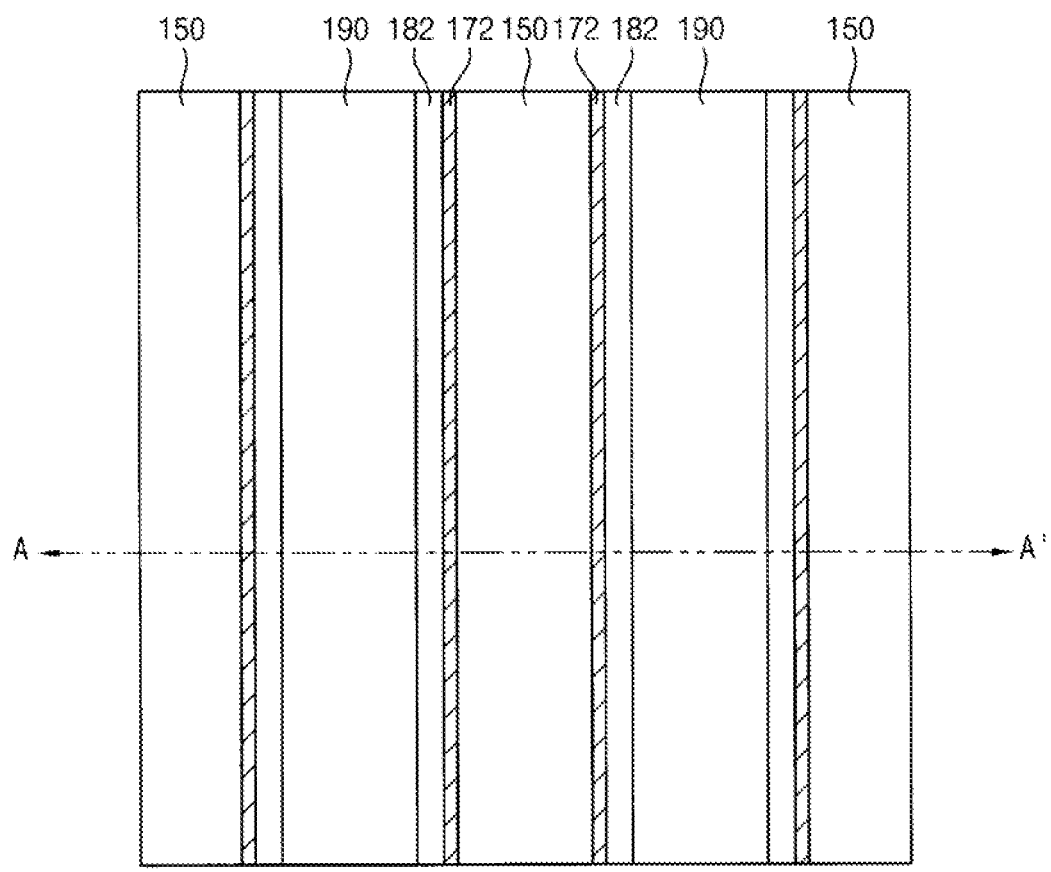
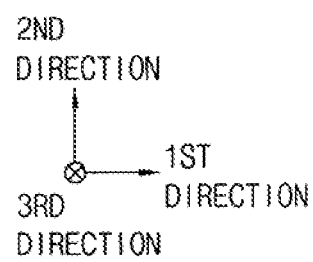

FIG. 7
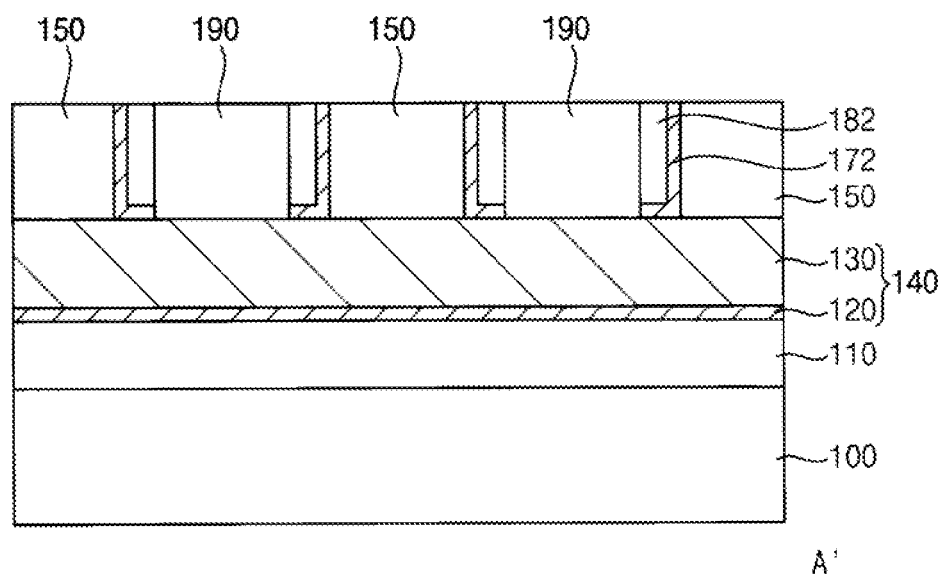
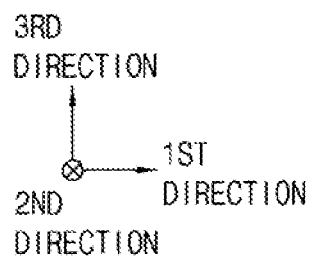

FIG. 11
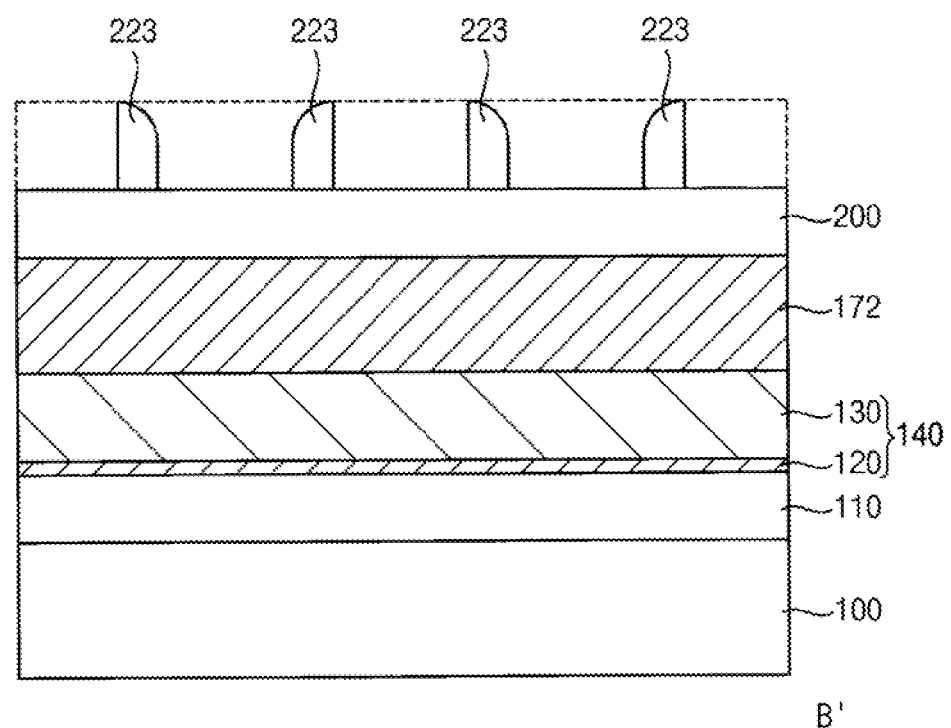
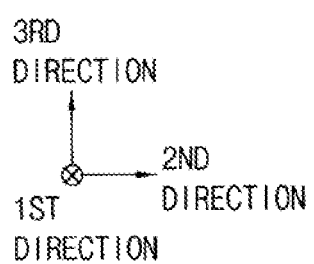

FIG. 14
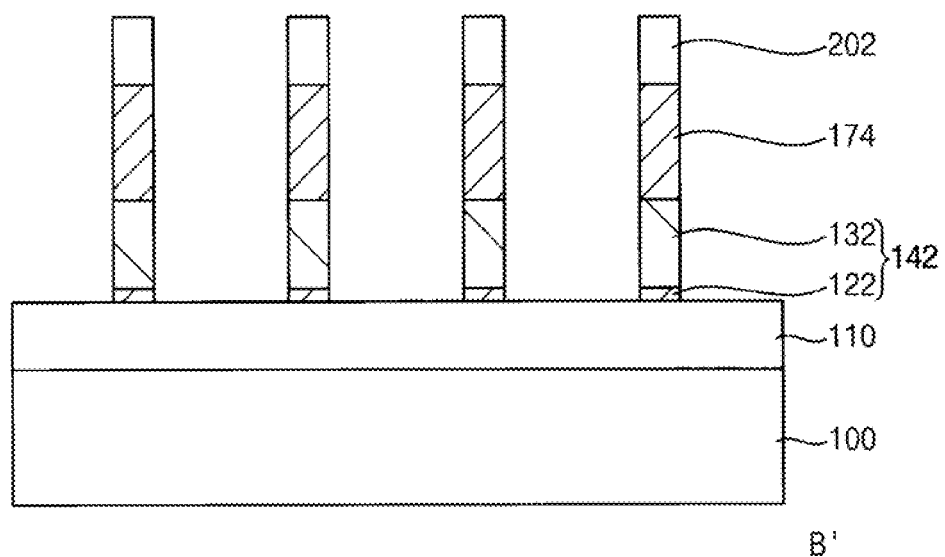
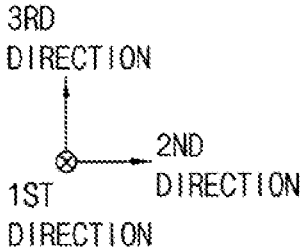

FIG. 17
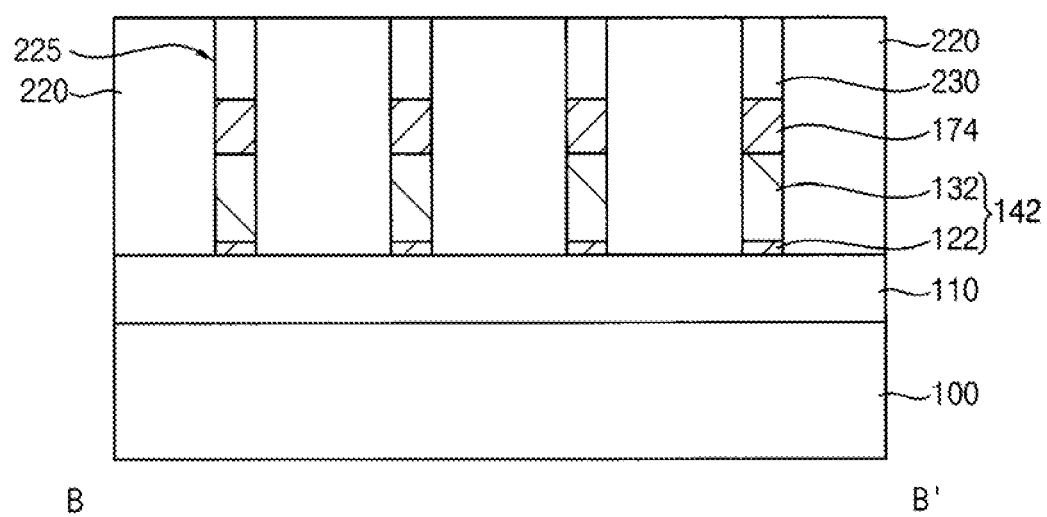
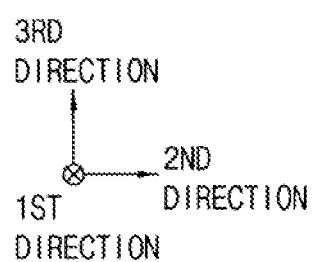

FIG. 20
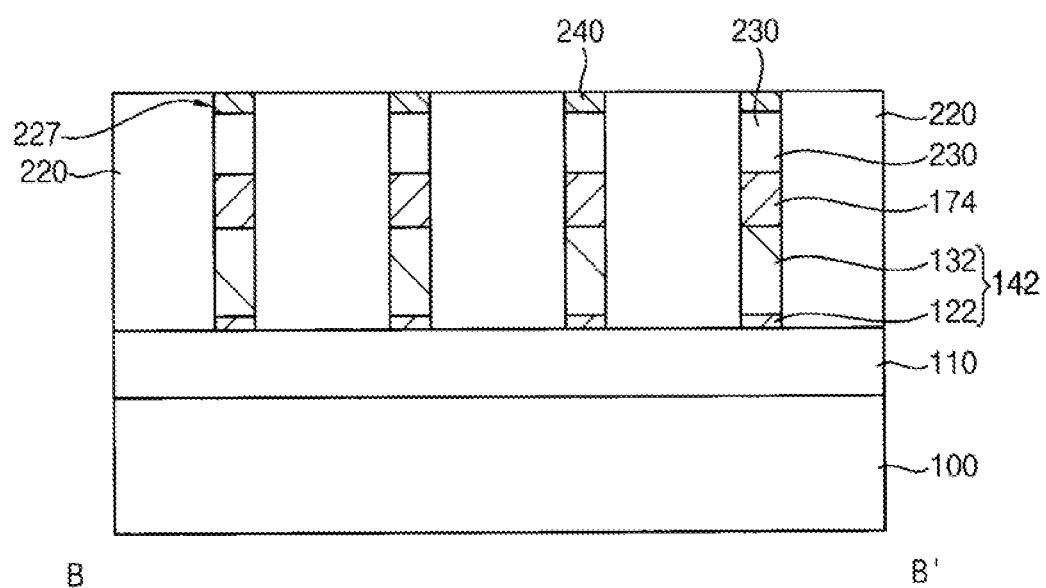
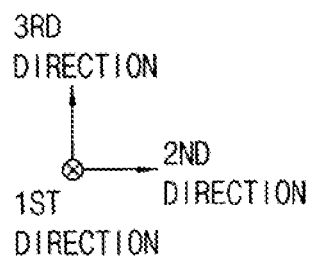

FIG. 24
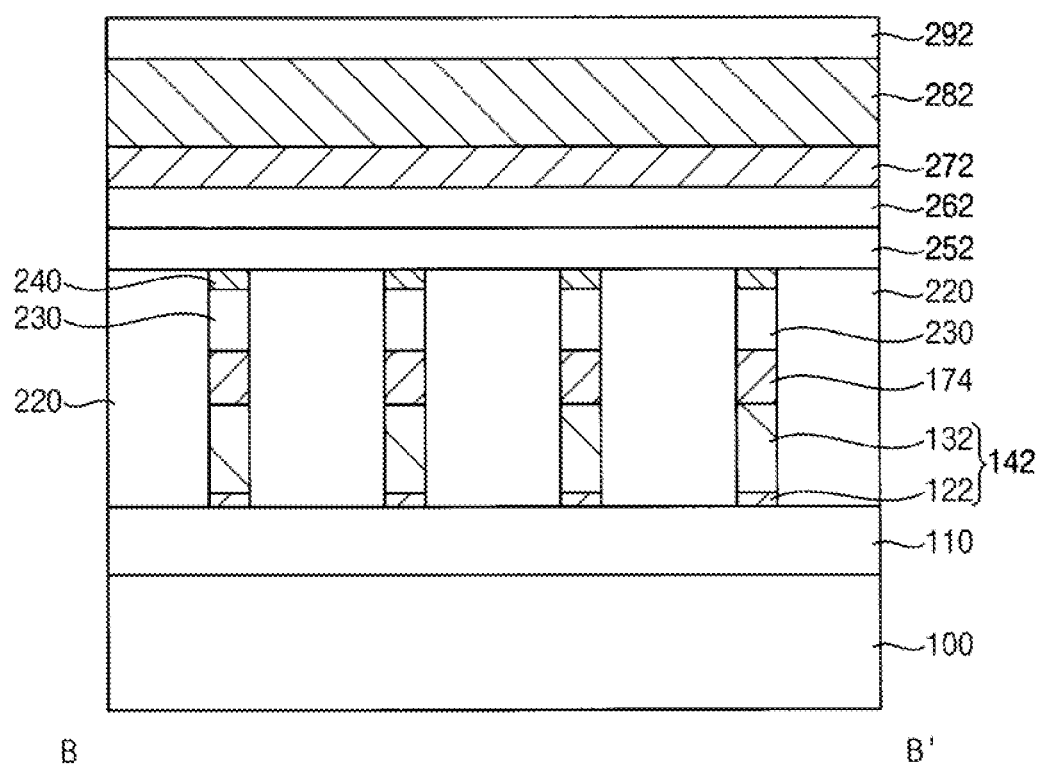
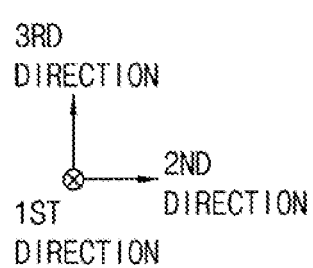

FIG. 30
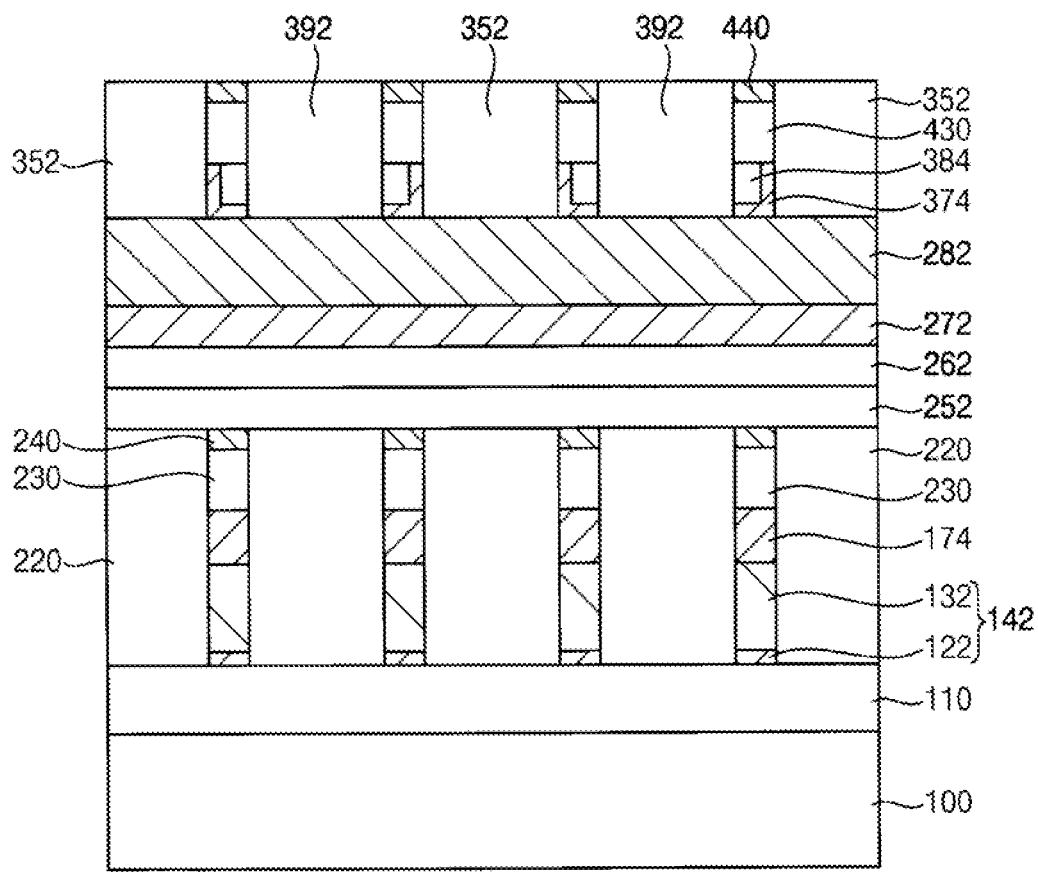
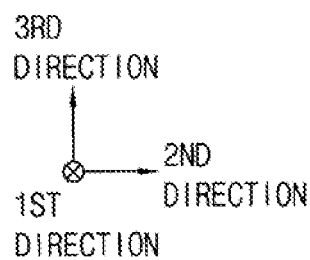

FIG. 35
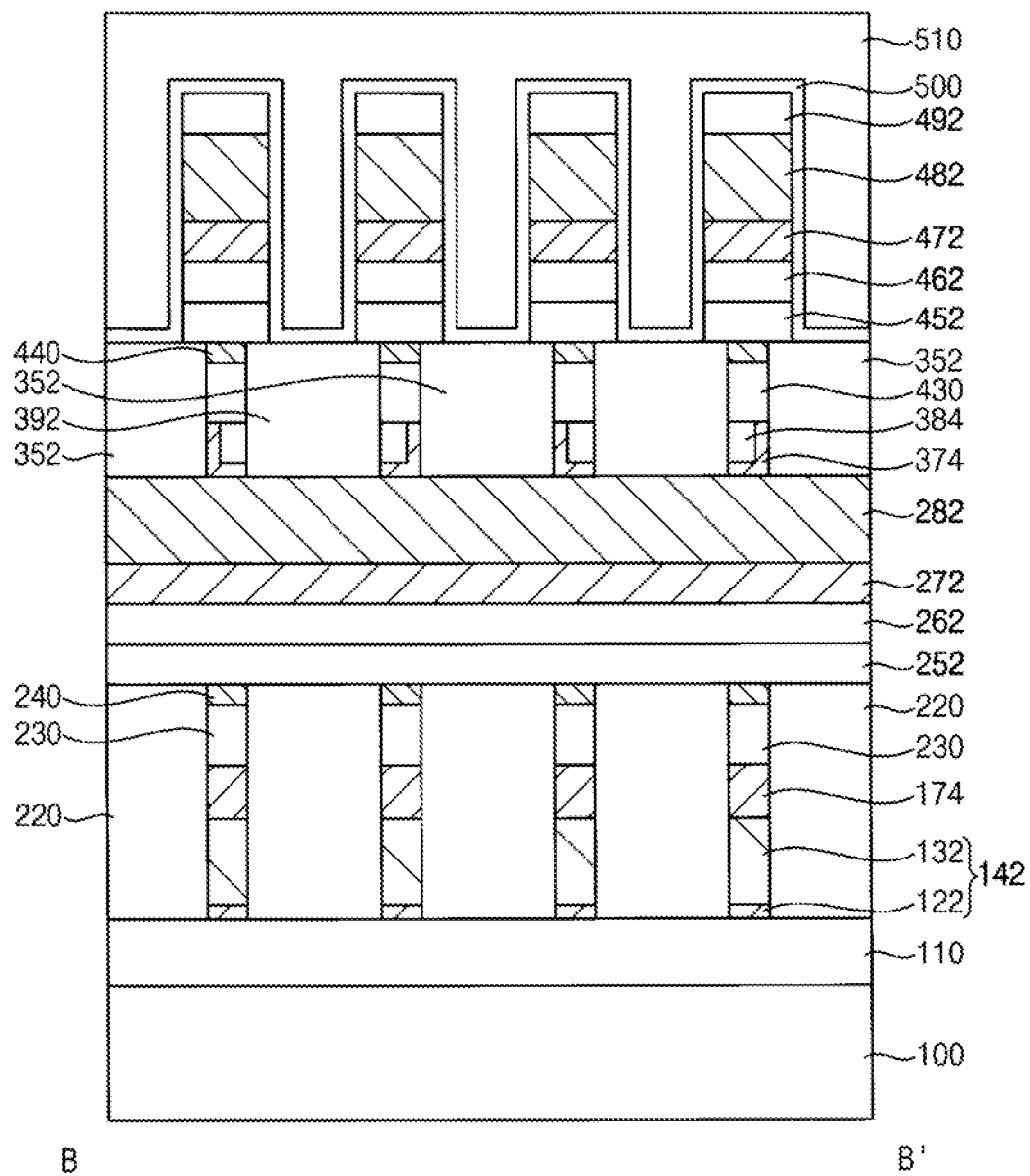
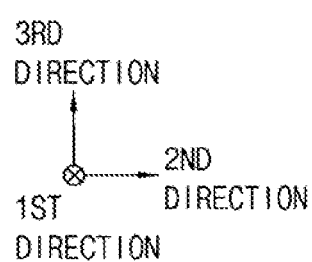

FIG. 36
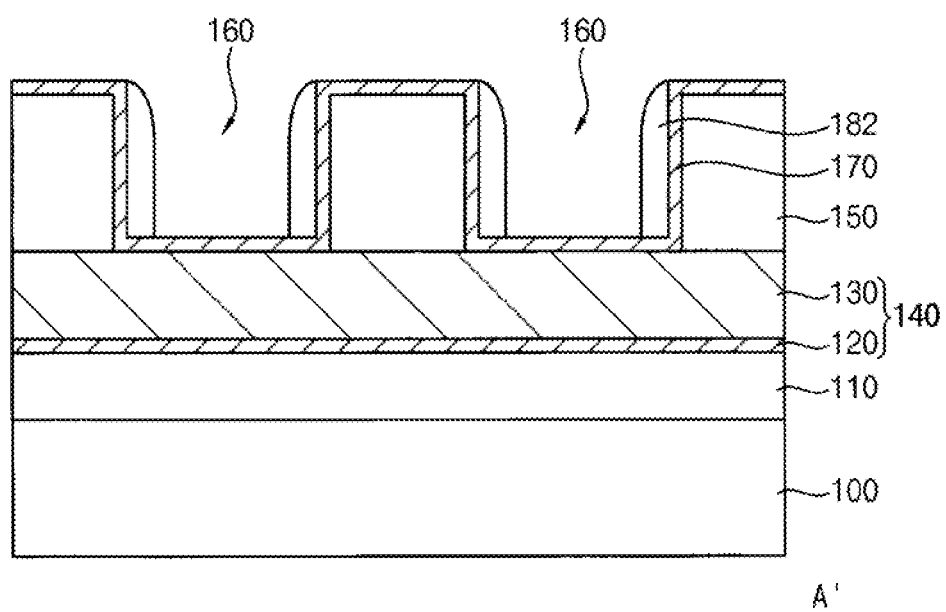
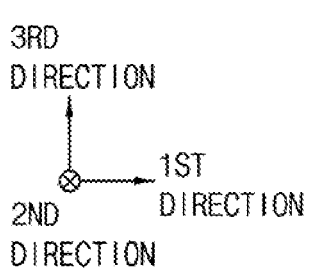

FIG. 39
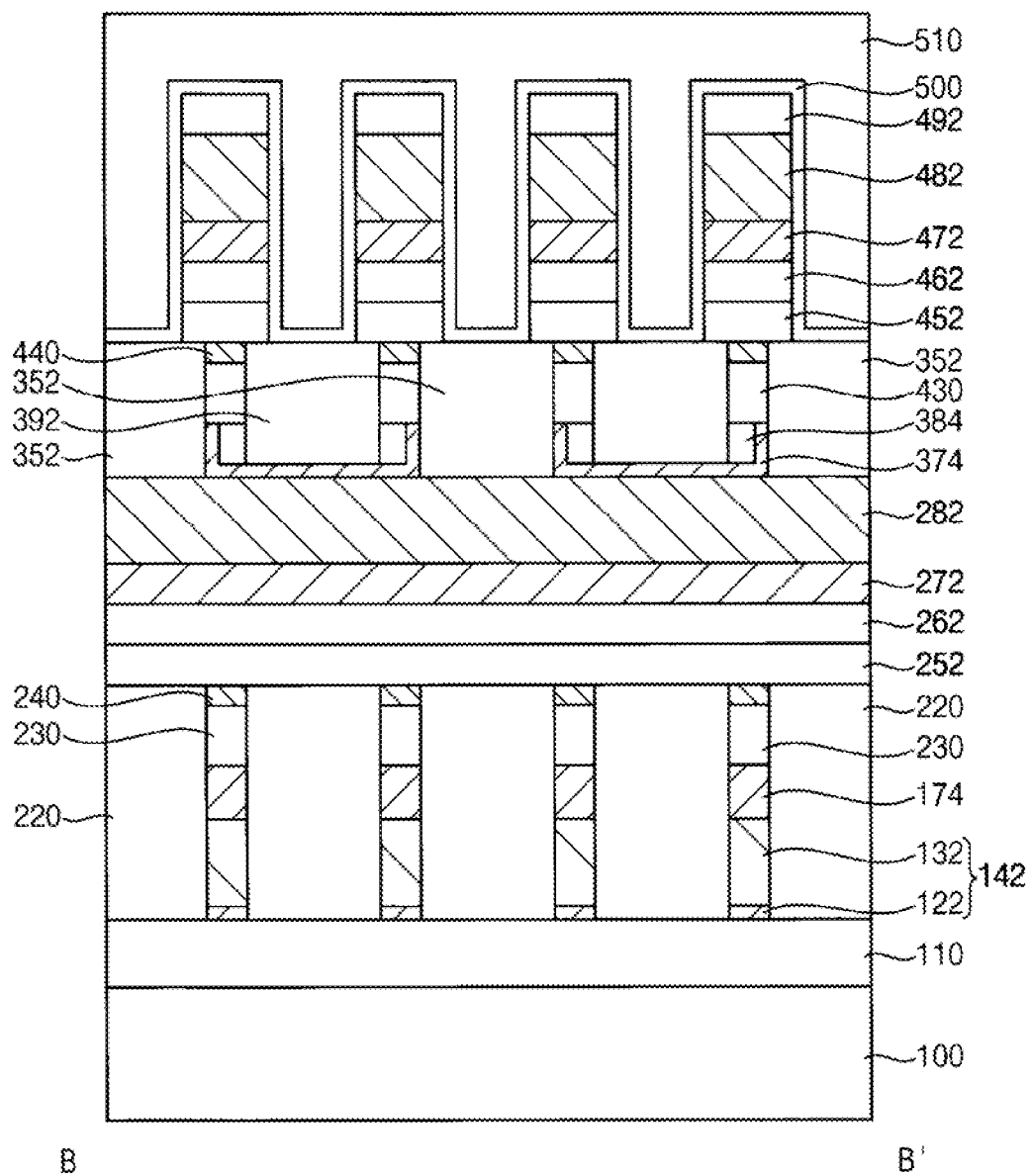
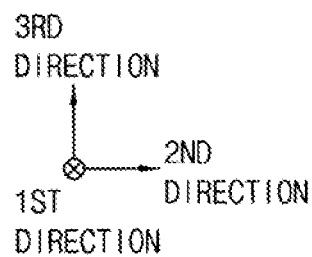

FIG. 42
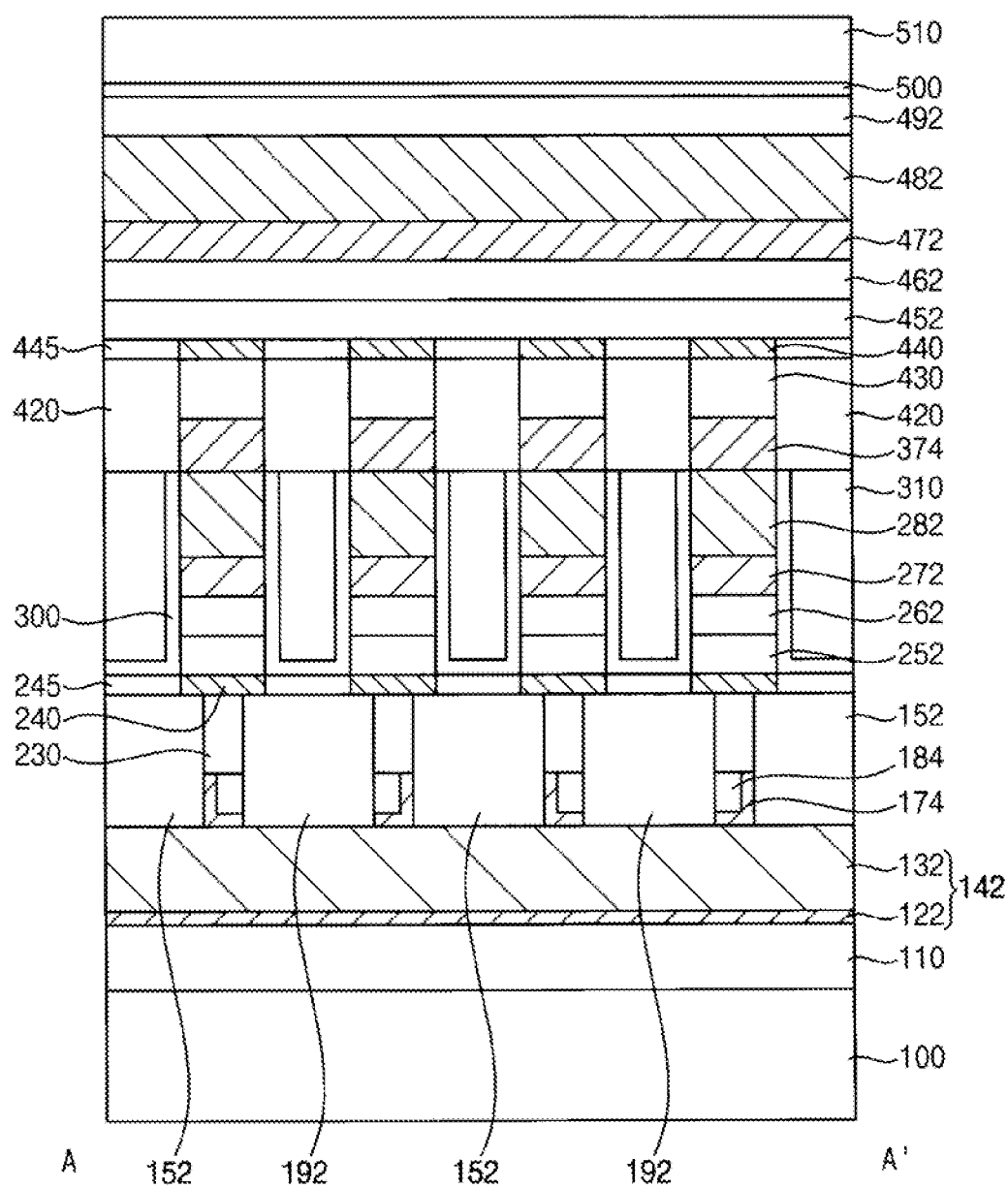
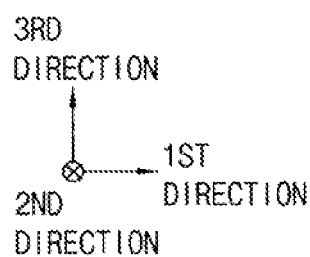

FIG. 43
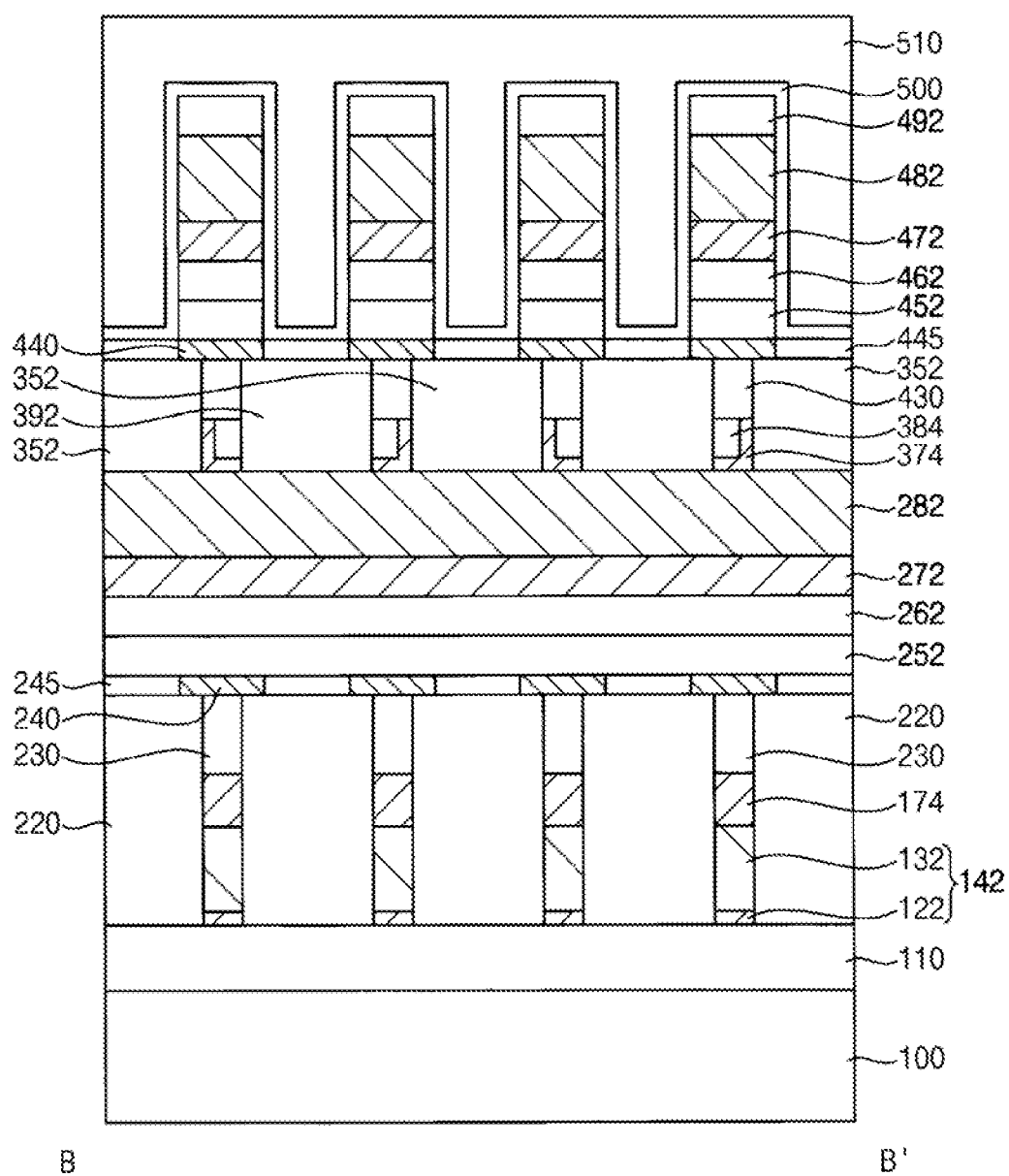
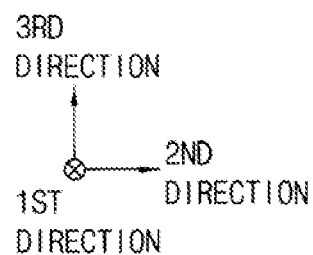

FIG. 45
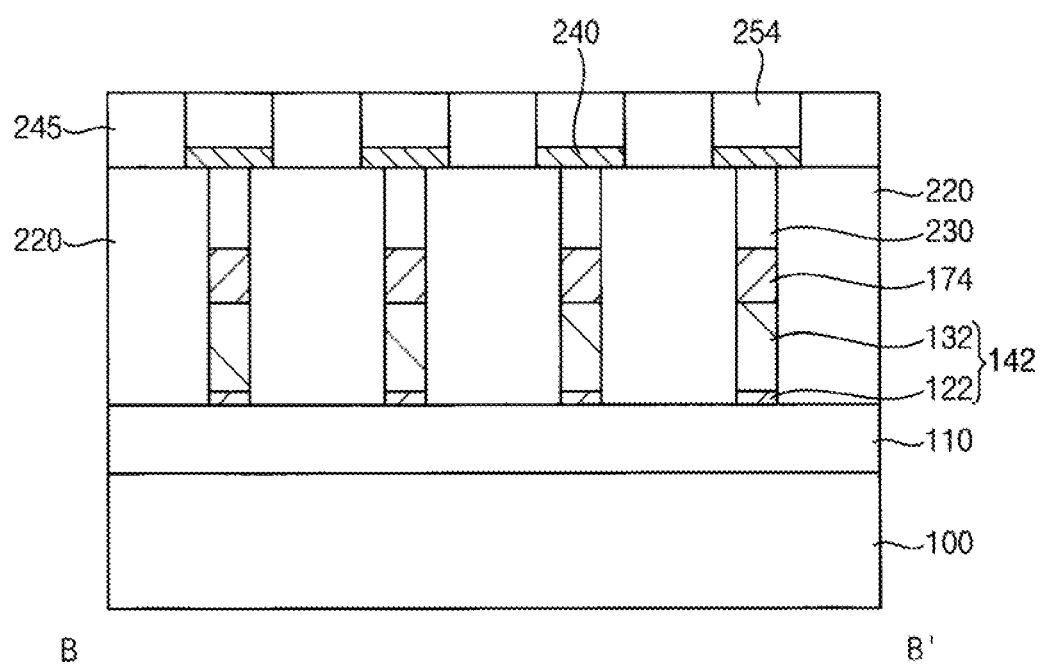
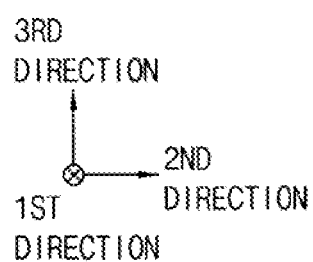

FIG. 46
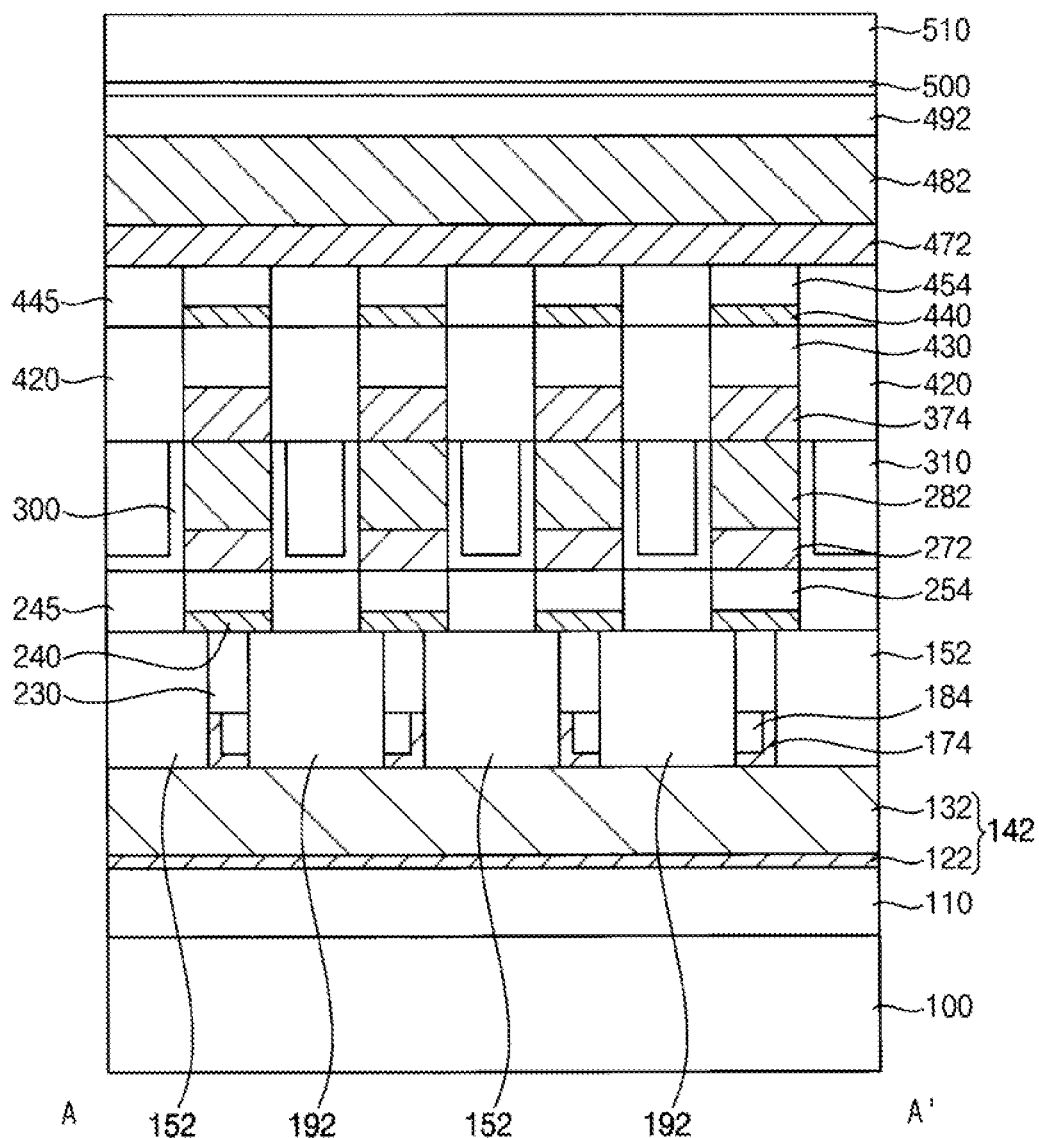
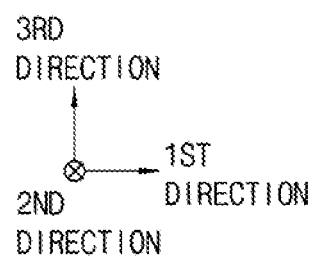

FIG. 48
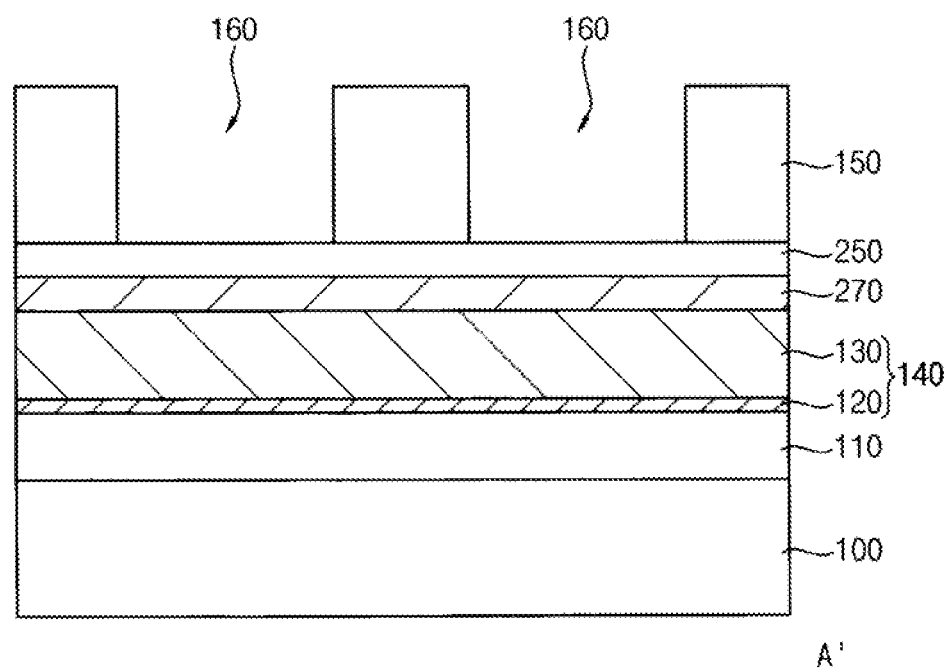
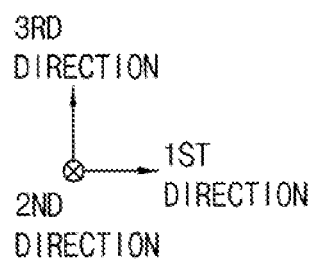

FIG. 49
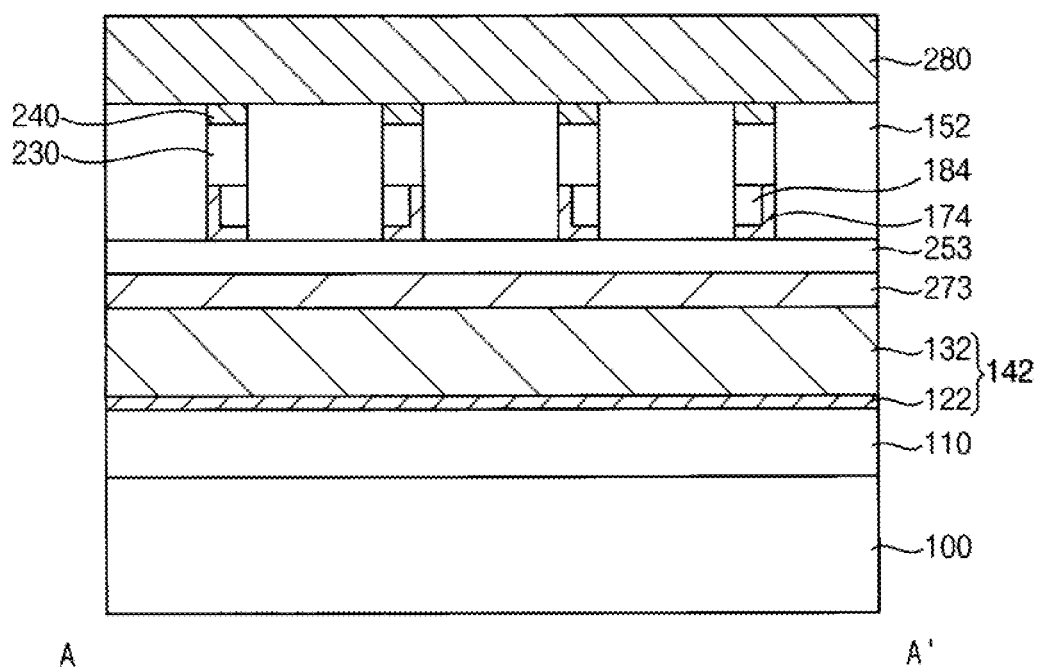
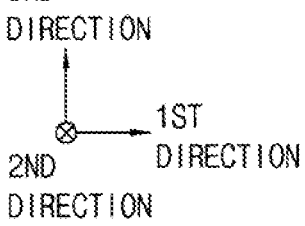

FIG. 50
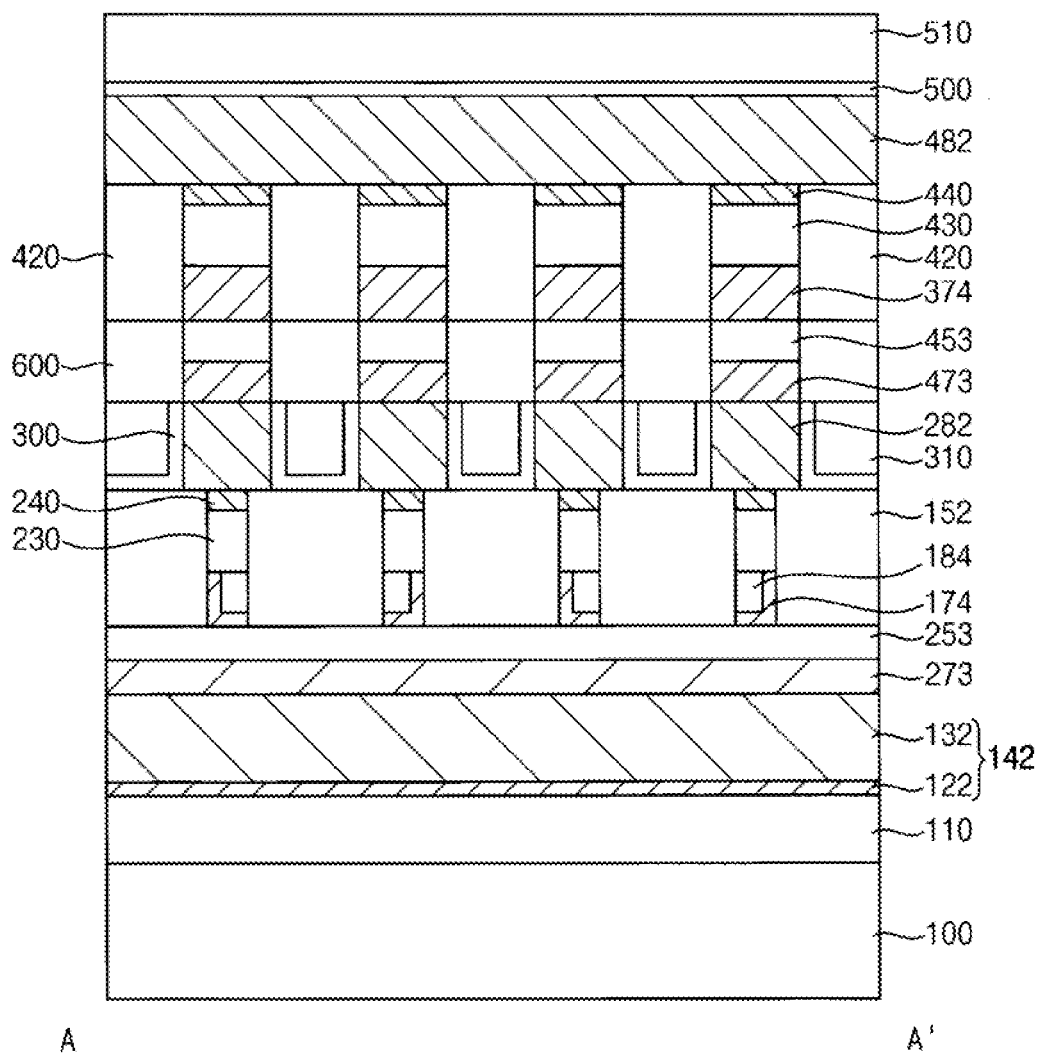
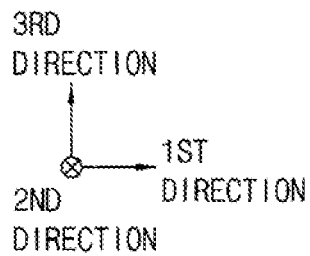

FIG. 51
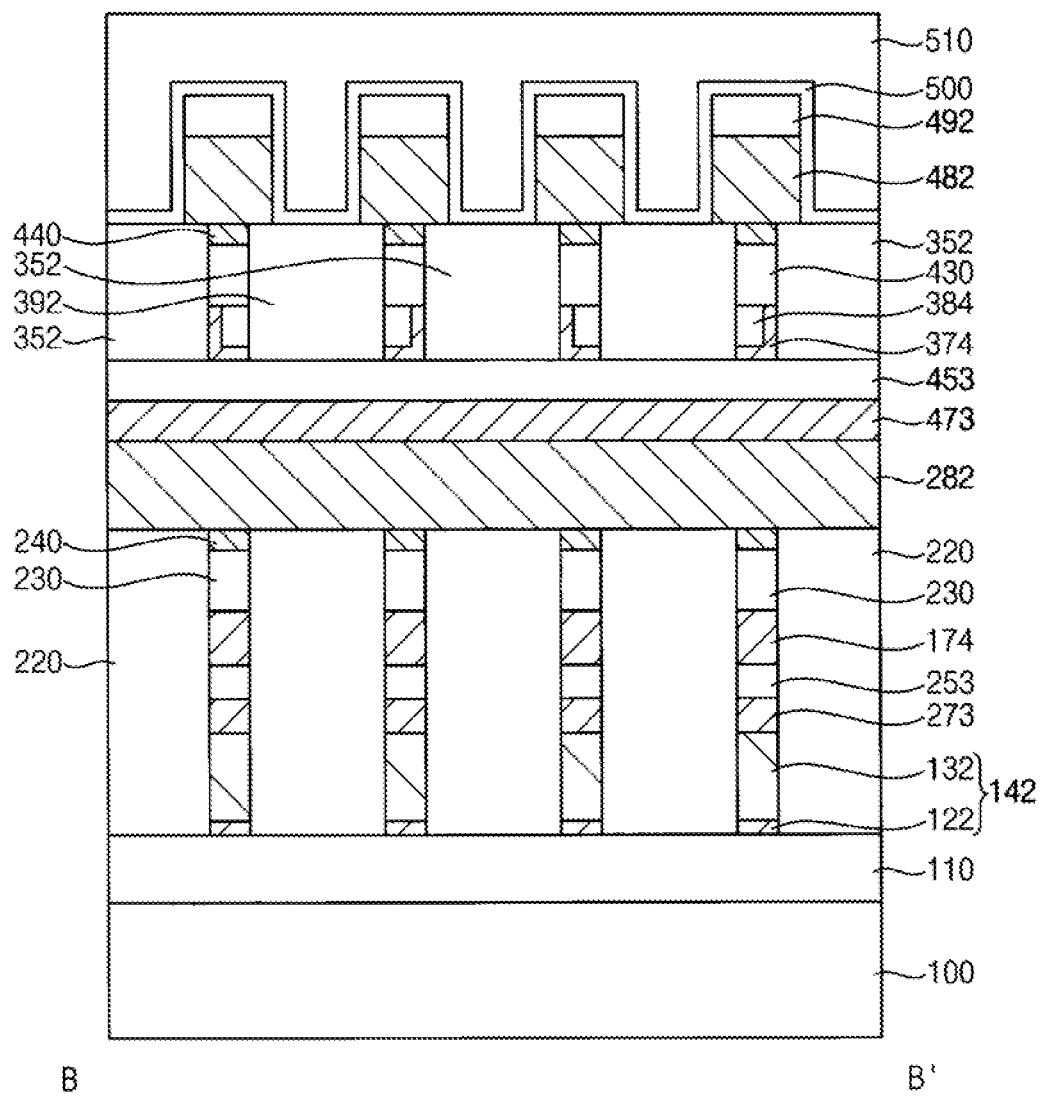
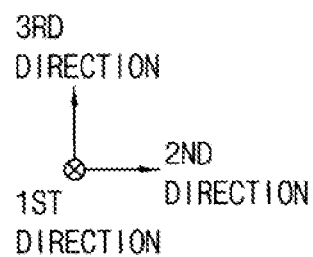

FIG. 53
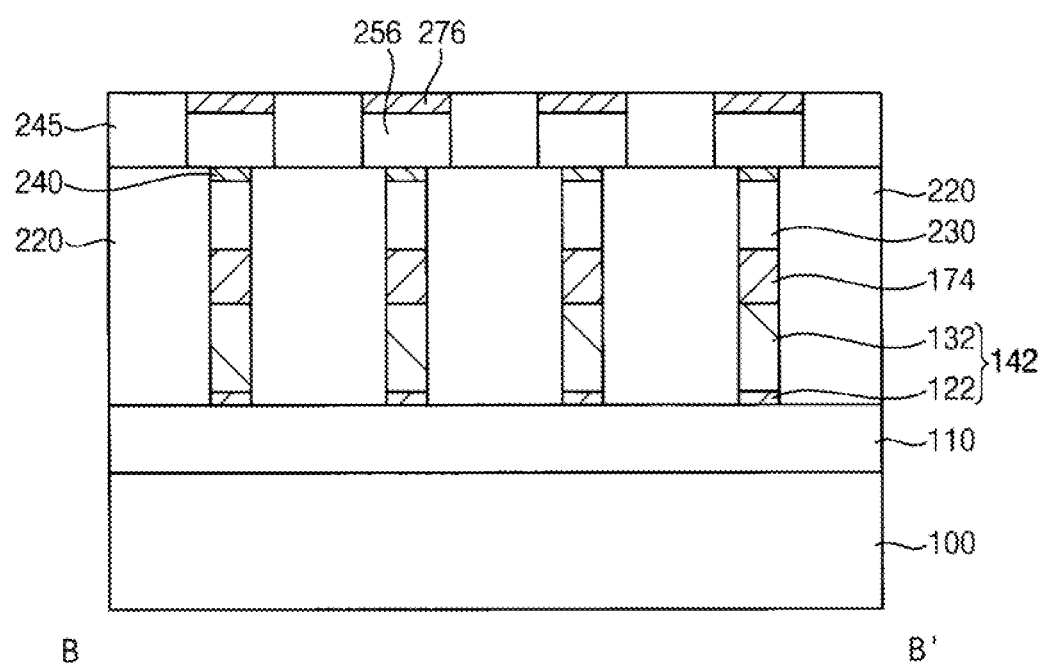
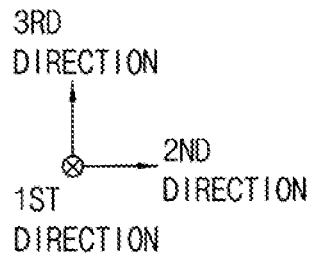

FIG. 56
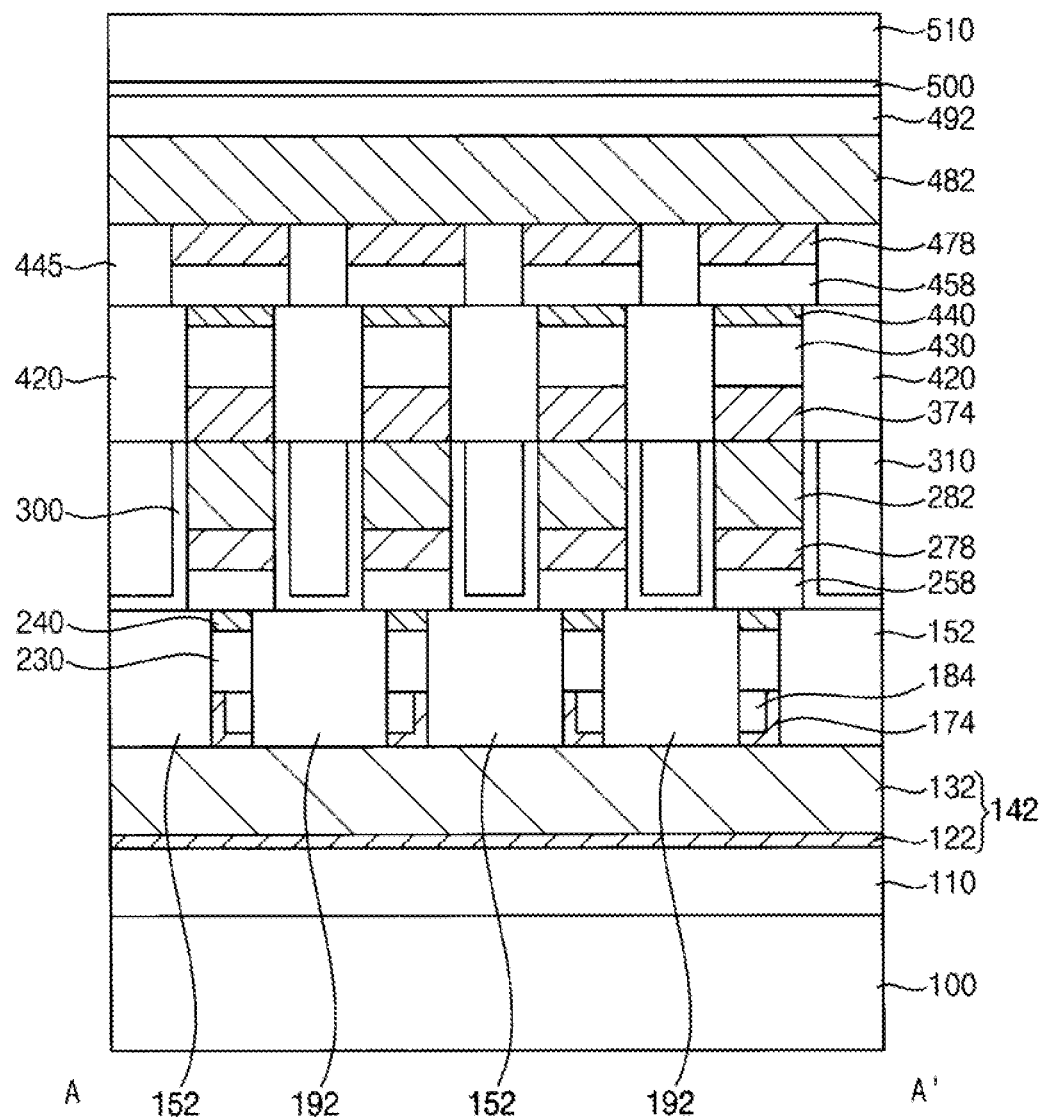
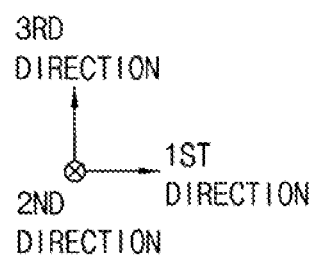

FIG. 57
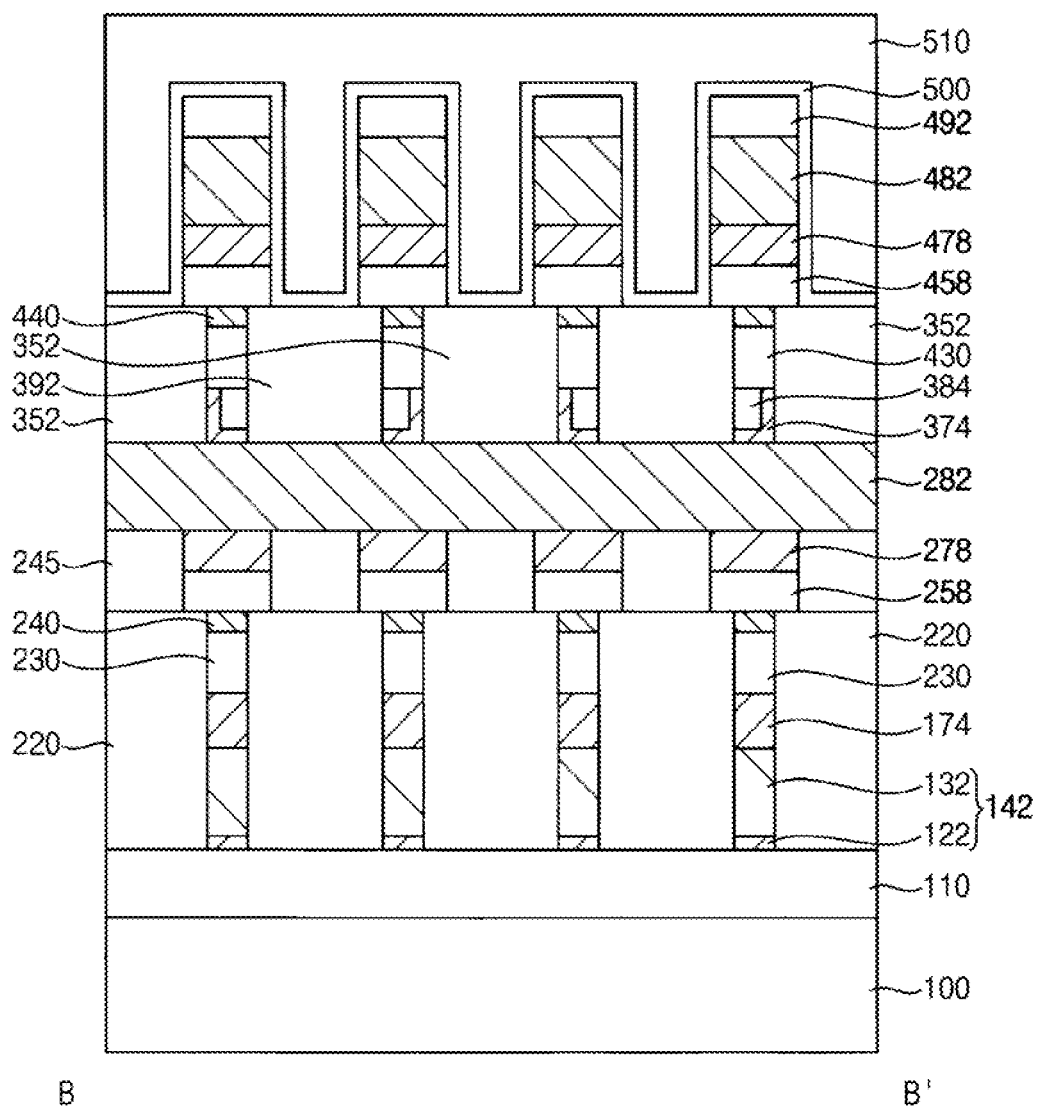
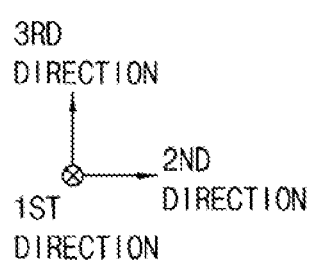

VARIABLE RESISTANCE MEMORY DEVICE AND METHOD OF MANUFACTURING THE SAME

CROSS-REFERENCE TO RELATED APPLICATION

This application is a continuation of U.S. application Ser. No. 15/432,346, filed on Feb. 14, 2017, which claims priority under 35 USC § 119 to Korean Patent Application No. 10-2016-0102316, filed on Aug. 11, 2016 in the Korean Intellectual Property Office (KIPO), the disclosures of which are incorporated by reference herein in their entirety.

TECHNICAL FIELD

Exemplary embodiments of the present inventive concept relate to a variable resistance memory device, and more particularly to a method of manufacturing the same.

DISCUSSION OF RELATED ART

When a variable resistance memory device having a cross-point array structure is manufactured, a selection layer and a variable resistance layer may be etched along two directions to form a selection pattern and a variable resistance pattern, respectively. Thus, the selection pattern may be damaged due to the etching process. The selection layer and the variable resistance layer may be etched by the same etching process, and the selection pattern and the variable resistance pattern may be damaged.

SUMMARY

An exemplary embodiment of the present inventive concept provides a variable resistance memory device having increased quality and reliability.

An exemplary embodiment of the present inventive concept provides a method of manufacturing a variable resistance memory device having increased quality and reliability.

According to an exemplary embodiment of the present inventive concept, a variable resistance memory device includes first conductive lines positioned above a substrate. Each of the first conductive lines extends in a first direction and a second direction crossing the substrate, and the first and second directions are substantially parallel to an upper surface of the substrate. Second conductive lines extend in the first direction and the second direction. The second conductive lines are positioned above the first conductive lines. A memory unit is positioned between the first and second conductive lines. The memory unit overlaps the first and second conductive lines in a third direction substantially perpendicular to the upper surface of the substrate. The memory unit includes a first electrode, a variable resistance pattern positioned on the first electrode, and a second electrode positioned on the variable resistance pattern. A selection pattern is positioned on each memory unit. A third electrode is positioned above the selection pattern. The third electrode is in direct contact with a lower surface of each of the second conductive lines. An upper surface of the selection pattern and a lower surface of the third electrode may have substantially a same shape and width as each other.

According to an exemplary embodiment of the present inventive concept, a variable resistance memory device includes first conductive lines positioned above a substrate. Each of the first conductive lines extends in a first direction and a second direction crossing, the substrate, and the first and second directions are substantially parallel to an upper surface of the substrate. Second conductive lines extend in the first direction and the second direction. The second conductive lines are positioned above the first conductive lines. A memory unit is positioned between the first and second conductive lines. The memory unit overlaps the first and second conductive lines in a third direction substantially perpendicular to the upper surface of the substrate. The memory unit includes a first electrode, a variable resistance pattern positioned on the first electrode, and a second electrode positioned on the variable resistance pattern. The selection pattern is positioned under each of the second conductive lines. The selection pattern extends in the second direction and is in direct contact with upper surfaces of the memory units.

According to an exemplary embodiment of the present inventive concept, a variable resistance memory device includes first conductive lines positioned above a substrate. Each of the first conductive lines extends in a first direction and a second direction crossing the substrate, and the first and second directions are substantially parallel to an upper surface of the substrate. Second conductive lines extend in the first direction and the second direction. The second conductive lines are positioned above the first conductive lines. A memory unit is positioned between the first and second conductive lines. The memory unit overlaps the first and second conductive lines in a third direction substantially perpendicular to the upper surface of the substrate. The memory unit includes a first electrode, a variable resistance pattern positioned on the first electrode, and a second electrode positioned on the variable resistance pattern. The selection pattern is positioned on each of the second conductive lines. The selection pattern extends in the first direction and is in direct contact with lower surfaces of the memory units.

According to an exemplary embodiment of the present inventive concept, a variable resistance memory device includes first conductive lines positioned above a substrate. Each of the first conductive lines extends in a first direction and a second direction crossing the substrate, and the first and second directions are substantially parallel to an upper surface of the substrate. Second conductive lines extend in the first direction and the second direction. The second conductive lines are positioned above the first conductive lines. A memory unit is positioned between the first and second conductive lines. The memory unit overlaps the first and second conductive lines in a third direction substantially perpendicular to the upper surface of the substrate. The memory unit includes a first electrode, a variable resistance pattern positioned on the first electrode, and a second electrode positioned on the variable resistance pattern. The selection pattern is positioned on each memory unit under each of the second conductive lines. An upper surface of the second electrode and a lower surface of the selection pattern may have substantially a same shape and width as each other.

According to an exemplary embodiment of the present inventive concept, a method of manufacturing a variable resistance memory device includes forming a first conductive layer structure above a substrate. A preliminary first electrode is formed on the first conductive layer structure to extend in a second direction. The preliminary first electrode and the first conductive layer structure are etched using a first etching mask extending in a first direction crossing the second direction to form first electrodes and first conductive lines, respectively. Variable resistance patterns are formed on each of the first electrodes. Preliminary selection patterns are formed on each of the variable resistance patterns. Each of the preliminary selection patterns extend in the first direction. A second conductive layer is formed on the preliminary selection patterns. The second conductive layer and the preliminary selection patterns are etched using a second etching mask extending in the second direction to form second conductive lines and selection patterns, respectively.

According to an exemplary embodiment of the present inventive concept, a method of manufacturing a variable resistance memory device includes forming a first conductive layer structure above a substrate. A preliminary first electrode is formed on the first conductive layer structure to extend in a second direction. The preliminary first electrode and the first conductive layer structure are etched using a first etching mask extending in a first direction crossing the second direction to form first electrodes and first conductive lines, respectively. Variable resistance patterns are formed on each of the first electrodes. A selection layer and a second conductive layer are formed on each of the variable resistance patterns. The second conductive layer and the selection layer are etched using a second etching mask extending in a second direction to form second conductive lines and selection patterns, respectively.

According to an exemplary embodiment of the present inventive concept, a method of manufacturing a variable resistance memory device includes forming sequentially forming a first conductive layer structure and a selection layer above a substrate. Preliminary first electrodes are formed on the selection layer. Each of the preliminary first electrodes extends in a second direction substantially perpendicular to the first direction. The preliminary first electrodes, the selection layer, and the first conductive layer structure are etched to form first electrodes, selection patterns, and first conductive lines, respectively. The first electrodes are disposed in each of the first and second directions, and each of the selection patterns and the first conductive lines extend in the first direction. Upper portions of the first electrodes are removed. Variable resistance patterns are formed on each of the first electrodes. Second conductive lines are formed on the variable resistance patterns. Each of the second conductive lines extends in the second direction.

In the method of manufacturing the variable resistance memory device according to an exemplary embodiment of the present inventive concept, the variable resistance pattern need not be formed together with the overlying selection pattern, but may be formed by an independent damascence process. Thus, the variable resistance pattern may have less etching damage, and may have increased reliability.

The selection pattern need not be formed together with the variable resistance pattern having different etching conditions. Additionally, the selection pattern may extend in a direction, and thus may be formed by a single etching process. Accordingly, the selection pattern may have less etching damage, and may have increased reliability.

BRIEF DESCRIPTION OF THE DRAWINGS

The above and other features of the present inventive concept will become more apparent by describing in detail exemplary embodiments thereof with reference to the accompanying drawings, in which:

FIGS. 1 to 35 are plan views and cross-sectional views illustrating a method of manufacturing a variable resistance memory device according to an exemplary embodiment of the present inventive concept;

FIGS. 36 to 39 are cross-sectional views illustrating a method of manufacturing a variable resistance memory device according to an exemplary embodiment of the present inventive concept;

FIGS. 40 to 43 are cross-sectional views illustrating a method of manufacturing a variable resistance memory device according to an exemplary embodiment of the present inventive concept;

FIGS. 44 to 47 are cross-sectional views illustrating a method of manufacturing a variable resistance memory device according to an exemplary embodiment of the present inventive concept;

FIGS. 48 to 51 are cross-sectional views illustrating a method of manufacturing a variable resistance memory device according to an exemplary embodiment of the present inventive concept; and FIGS. 52 to 57 are cross-sectional views illustrating a method of manufacturing a variable resistance memory device according to an exemplary embodiment of the present inventive concept.

DETAILED DESCRIPTION OF THE EMBODIMENTS

Figure 1:
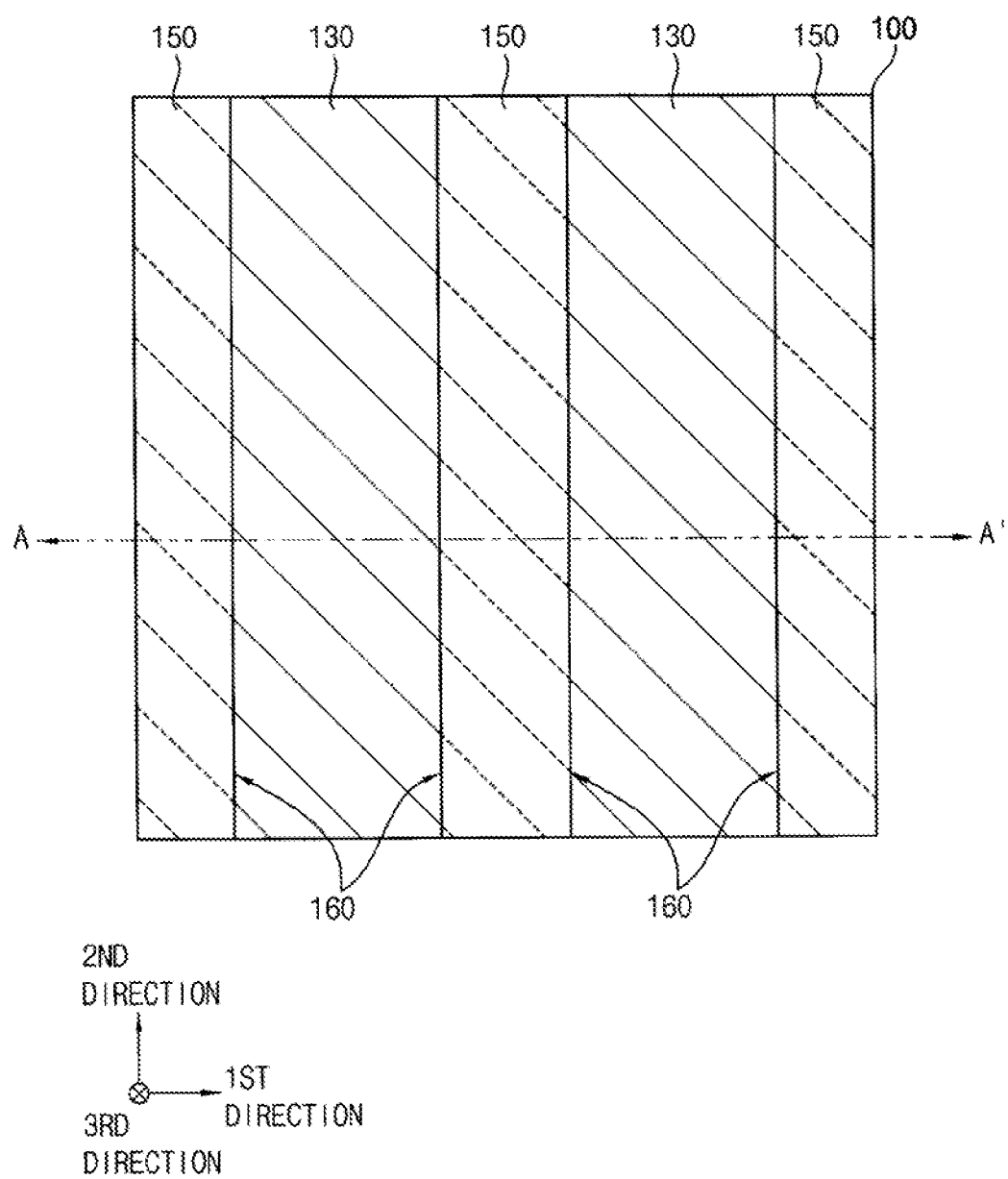

Like reference numerals may refer to like elements throughout the specification and drawings.

FIGS. 1 to 35 are plan views and cross-sectional views illustrating a method of manufacturing a variable resistance memory device according to an exemplary embodiment of the present inventive concept. FIGS. 1, 4, 6, 8, 13, 15, 18, 22, 25, 28 and 31 are plan views, and FIGS. 2-3, 5, 7, 9-12, 14, 16-17, 19-21, 23-24, 26-27, 29-20 and 32-35 are cross-sectional views. FIGS. 2, 3, 5, 7, 9, 16, 19, 21, 23, 26, 29, 32 and 34 are cross-sectional views taken along lines A-N, respectively, of corresponding plan views, and FIGS. 10, 11, 12, 14, 17, 20, 24, 27, 30, 33 and 35 are cross-sectional view taken along a line B-B' of a corresponding plan view.

Hereinafter, two directions substantially parallel to an upper surface of a substrate and crossing each other may be defined as first and second directions, respectively, and a direction substantially perpendicular to the upper surface of the substrate may be defined as a third direction. In an exemplary embodiment of the present inventive concept, the first and second directions may cross each other at a right angle so as to be substantially perpendicular to each other.

Figure 2:
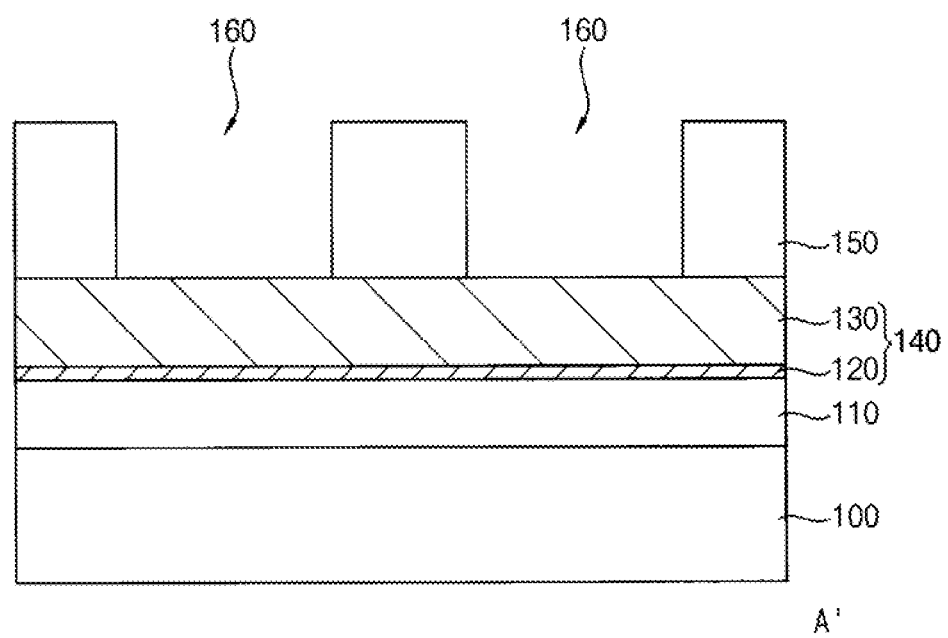

Referring to FIGS. 1 and 2, a first insulating interlayer 110, a first barrier layer 120 and a first conductive layer 130 may be stacked (e.g., sequentially stacked) on a substrate 100.

The substrate 100 may include a semiconductor material, e.g., silicon, germanium, or silicon-germanium, or III-V semiconductor compounds, e.g., GaP, GaAs, or GaSb. In an exemplary embodiment of the present inventive concept, the substrate 100 may be a silicon-on-insulator (501) substrate, or a germanium-on-insulator (GOI) substrate.

Various elements, e.g., gate structures, source/drain layers, contact plugs, or wirings may be formed on the substrate 100, and may be covered by the first insulating interlayer 110. The first insulating interlayer 110 may include an insulating material, e.g., silicon oxide, silicon nitride, or silicon oxynitride.

The first barrier layer 120 may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, tungsten carbonitride, titanium silicon carbonitride, titanium carbonitride and/or tantalum nitride.

The first conductive layer 130 may include metal, e.g., tungsten, platinum, palladium, rhodium, ruthenium, iridium, copper, aluminum, titanium, or tantalum, and may be referred to as a first metal layer.

The first barrier layer 120 and the first metal layer 130 may form a first conductive, layer structure 140, and in some cases, the first barrier layer 120 need not be formed.

A second insulating interlayer 150 may be formed on the first conductive layer structure 140.

The second insulating interlayer 150 may include a first opening 160 extending in the second direction and exposing an upper surface of the first conductive layer structure 140. In an exemplary embodiment of the present inventive concept, a plurality of first openings 160 may be formed in the first direction. The second insulating interlayer 150 may include a nitride, e.g., silicon nitride, or silicon oxynitride, or a metal oxide, e.g., aluminum oxide, or titanium oxide.

Referring to FIG. 3, a first electrode layer 170 and a first spacer layer 180 may be sequentially formed on a sidewall of the first opening 160, the exposed upper surface of the first conductive layer structure 140, and an upper surface of the second insulating interlayer 150.

The first electrode layer 170 may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, tungsten carbonitride, titanium silicon carbonitride, titanium carbonitride and/or tantalum nitride. The first spacer layer 180 may include an oxide, e.g., silicon oxide, or carbon, or a carbon-containing material, e.g., carbonitride, titanium carbonitride, titanium carbide, tungsten carbide, tungsten carbonitride, or tantalum carbonitride. In an exemplary embodiment of the present inventive concept, the first spacer layer 180 may include a plurality of layers sequentially stacked; however, exemplary embodiments of the present inventive concept are not limited thereto. For example, the first spacer layer 180 may include a single layer.

Figure 4:
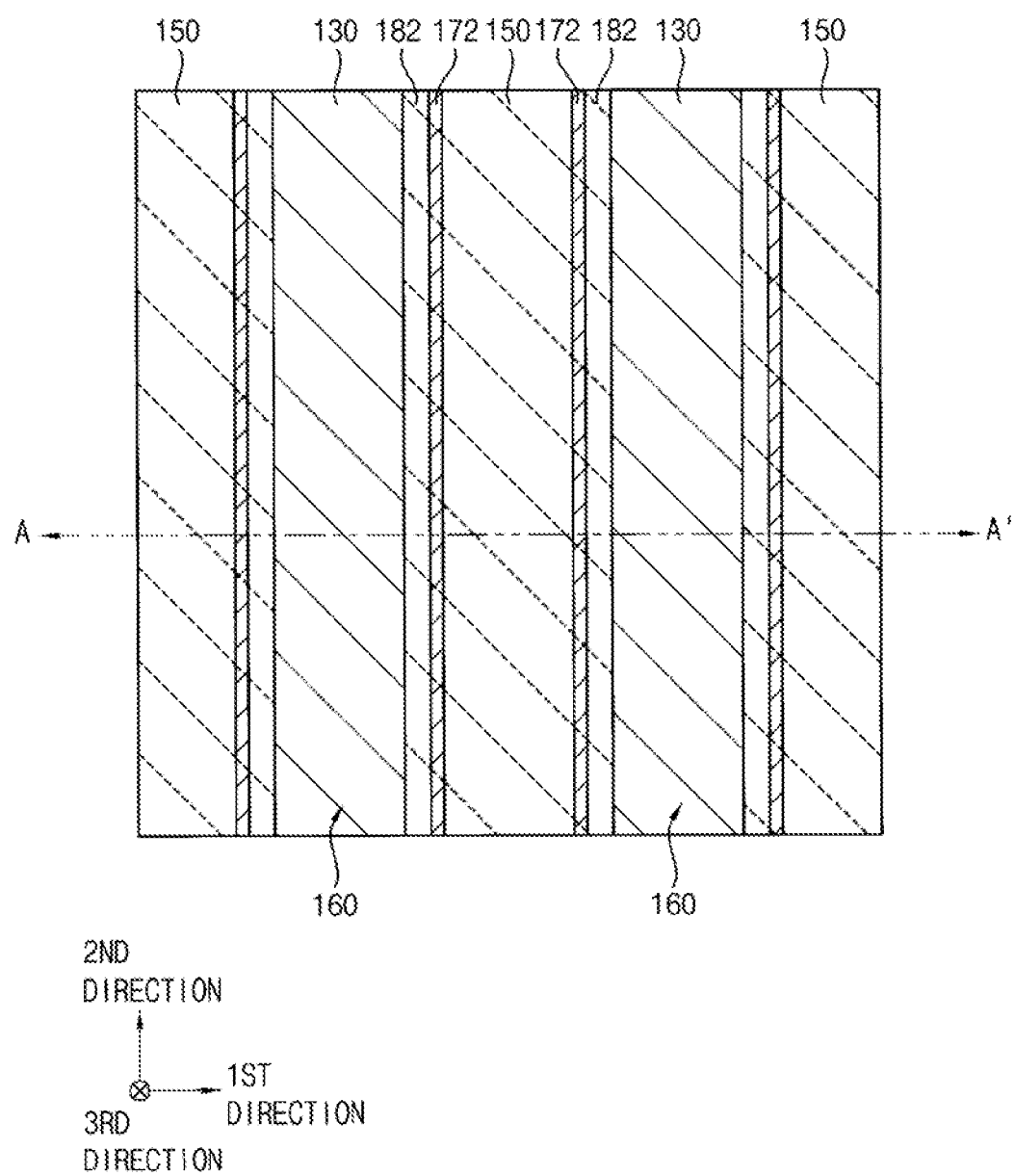

Referring to FIGS. 4 and 5, the first spacer layer 180 may be anisotropically etched to form a preliminary first spacer 182 on a portion of the first electrode layer 170 on the sidewall of the first opening 160.

In an exemplary embodiment of the present inventive concept, the preliminary first spacer layer 182 may be formed on a portion of the first electrode layer 170 on the sidewall of the first opening 160 and on a portion of the first electrode layer 170 on the upper surface of the first conductive layer structure 140 exposed by the first opening 160.

In an exemplary embodiment of the present inventive concept, the preliminary first spacer 182 may be formed on each of opposite sidewalls of the first opening 160 in the first direction, and each preliminary first spacer 182 may extend in the second direction.

The first electrode layer 170 may be etched using the preliminary first spacer 182 as an etching mask to form a preliminary first electrode 172.

The preliminary first spacer 182 may be formed on a sidewall and a portion of a bottom of the first opening 160. Thus, the preliminary first electrode 172 may be formed on the sidewall and substantially the same the portion of the bottom of the first opening 160 as the preliminary first spacer 182. Thus, the preliminary first electrode 172 may have a cross-section taken along the first direction having pan "L" shape. In an exemplary embodiment of the present inventive concept, the preliminary first electrode 172 may be formed on each of opposite sidewalks of the first opening 160 in the first direction, and each preliminary first electrode 172 may extend in the second direction. As an example, the first preliminary spacer 182 may be conformally formed on the "L" shaped preliminary first electrode 172, and thus the first preliminary spacer 182 may be spaced apart (e.g., may be above) a bottom surface of the first opening 160.

Referring to FIGS. 6 and 7, a third insulating interlayer 190 may be formed on the first conductive layer structure 140, the preliminary first electrode 172, the preliminary first spacer 182 and the second insulating interlayer 150 to substantially fill the first opening 160. The third insulating interlayer 190 may be planarized until the upper surface of the second insulating interlayer 150 is exposed.

The third insulating interlayer 190 may include a nitride, e.g., silicon nitride, or silicon oxynitride. In an exemplary embodiment of the present inventive concept, the third insulating interlayer 190 may include a material substantially the same as that of the second insulating interlayer 150.

The planarization process may include a chemical mechanical polishing (CMP) process and/or an etch back process. During the planarization process, upper portions of the second insulating interlayer 150, the preliminary first electrode 172 and the preliminary first spacer 182 may be removed, and thus each of the preliminary first electrode 172 and the preliminary first spacer 182 may have a substantially flat upper surface.

Figure 8:
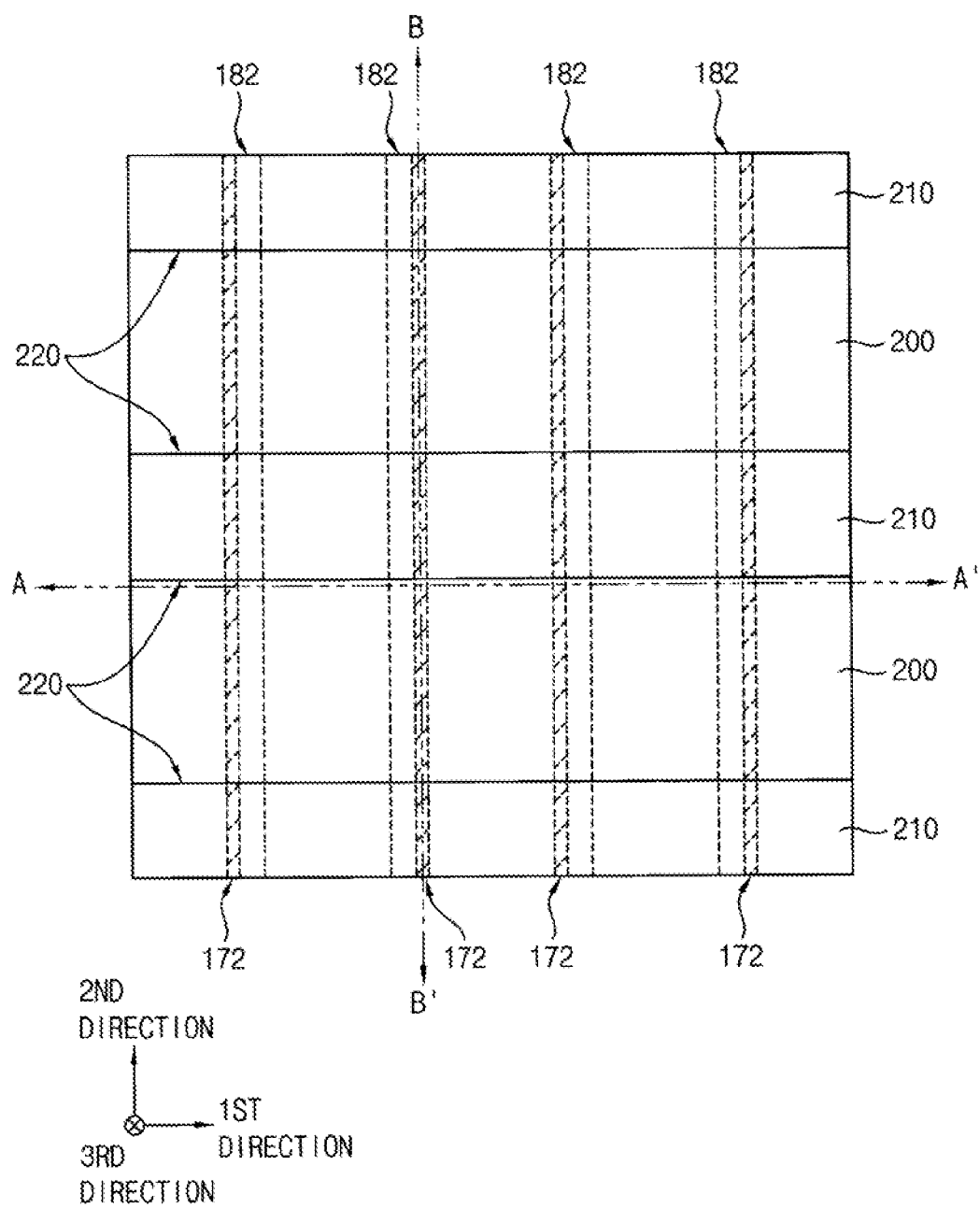
Figure 9:
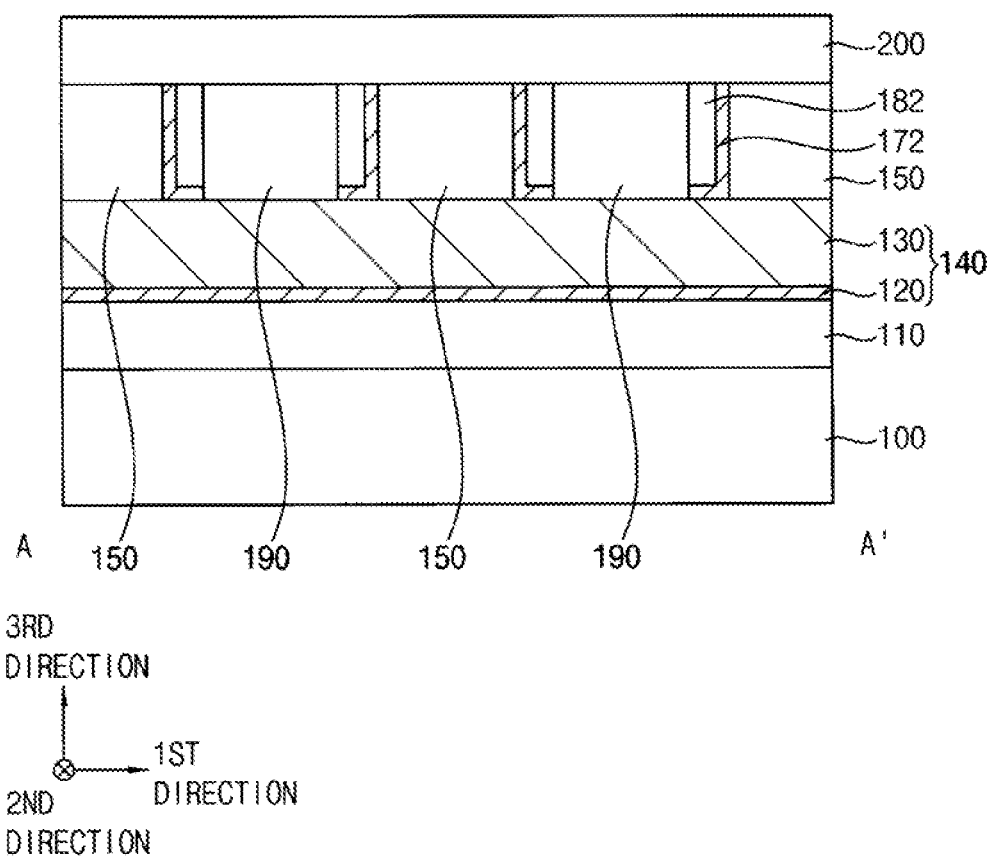
Figure 10:
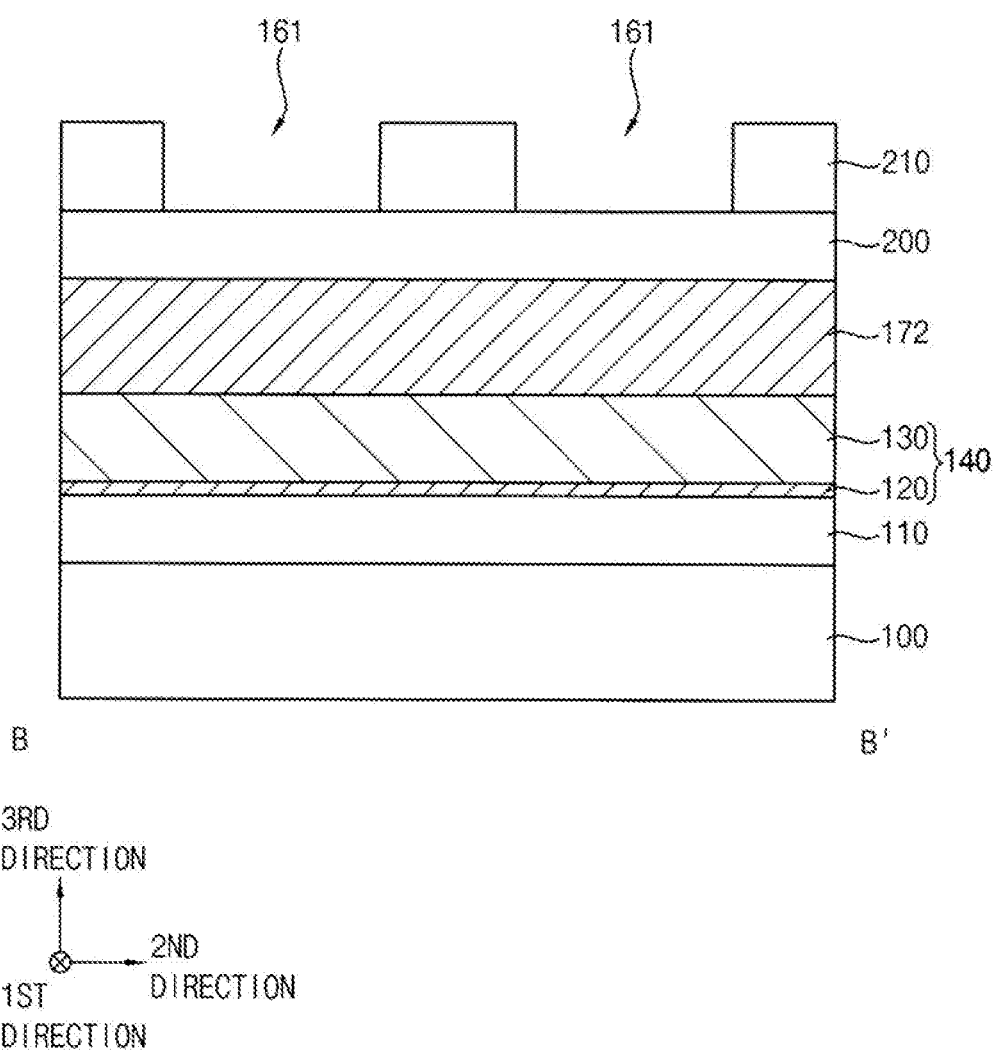

Referring to FIGS. 8 to 10, a first mask layer 200 and a sacrificial layer 210 may be sequentially formed on the second and third insulating interlayers 150 and 190, the preliminary first electrode 172 and the preliminary first spacer 182.

In an exemplary embodiment of the present inventive concept, the sacrificial layer 210 may have a second opening 161 extending in the first direction and exposing an upper surface of the first mask layer 200, and a plurality of second openings 161 may be formed in the second direction.

The first mask layer 200 may include, e.g., polysilicon, and the sacrificial layer 210 may include, e.g., amorphous carbon layer (ACL), spin-on organic hardmask (SOH), or silicon nitride; however, exemplary embodiments off the present inventive concept are not limited thereto.

Referring to FIG. 11, a second mask layer may be formed on a sidewall of the second opening 161, the exposed upper surface of the first mask layer 200, and the sacrificial layer 210, and may be anisotropically etched to form a second mask 223 on the sidewall of the second opening 161.

The second mask layer may include an oxide, e.g., silicon oxide. In an exemplary embodiment of the present inventive concept, the second mask layer may be formed by an atomic layer deposition (ALD) process.

The sacrificial layer 210 may be removed. In an exemplary embodiment of the present inventive concept, the sacrificial layer 210 may be formed by a wet etching process or a dry etching process.

Figure 12:
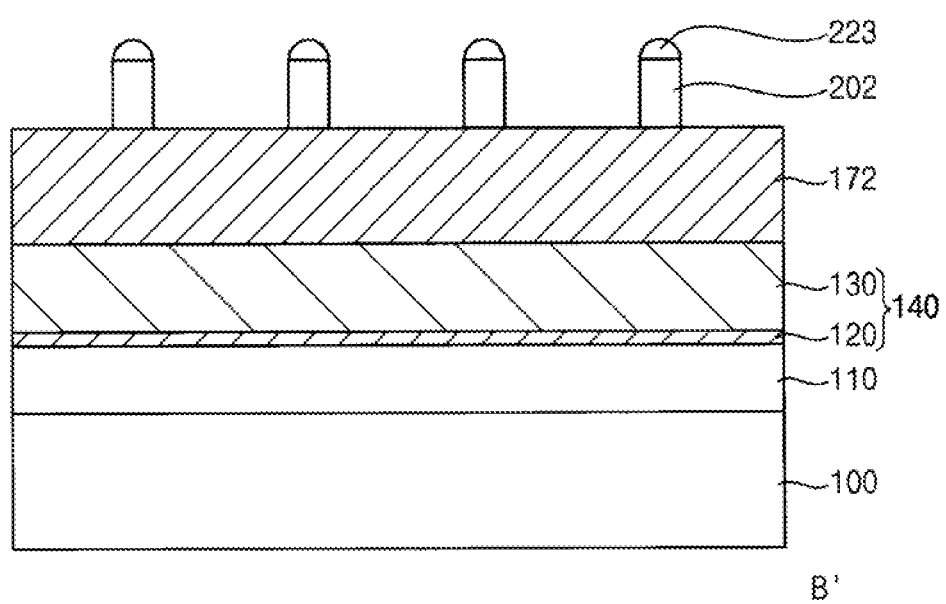

Referring to FIG. 12, the first mask layer 200 may be etched using the second mask 223 as an etching mask to form a first mask 202. The second mask 223 may be partially or substantially completely removed in the etching process.

In an exemplary embodiment of the present inventive concept, the first mask 202 may extend in the first direction, and a plurality of first masks 202 may be formed in the second direction.

Figure 13:
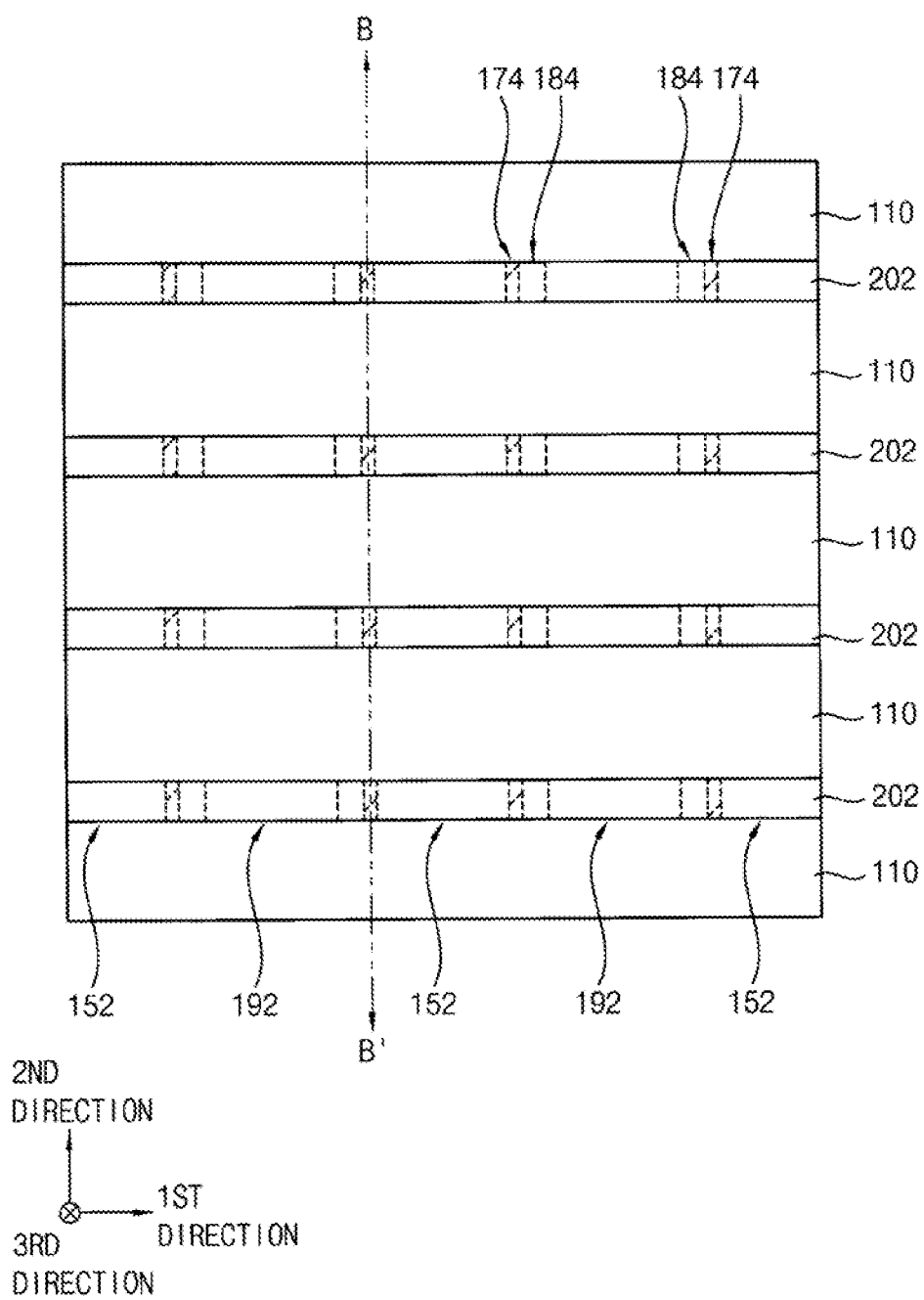

Referring to FIGS. 13 and 14, the preliminary first electrode 172, the preliminary first spacer 182, the second and third insulting interlayers 150 and 190, the first metal layer 130, and the first barrier layer 120 may be sequentially etched using the first mask 202 as an etching mask to form a first electrode 174, a first spacer 184, second and third insulating interlayer patterns 152 and 192, a first metal pattern 132, and a first barrier pattern 122, respectively.

The first barrier pattern 122 and the first metal pattern 132 may form a first conductive line 142. In an exemplary embodiment of the present inventive concept, the first conductive line 142 may extend in the first direction, and a plurality of first conductive lines 142 may be formed in the second direction. In an exemplary embodiment of the present inventive concept, the first conductive line 142 may serve as a word line of the variable resistance memory device. Alternatively; the first conductive line 142 may serve as a bit line of the variable resistance memory device.

In an exemplary embodiment of the present inventive concept, a plurality of first electrodes 174 may be formed in each of the first and second directions, and a plurality of first spacers 184 may be formed in each of the first and second directions.

Referring to FIGS. 8 to 14, the first conductive line 142 may be formed by a double patterning technology (DPT) process, and the first electrode 174 may be formed on the first conductive line 142.

Figure 15:
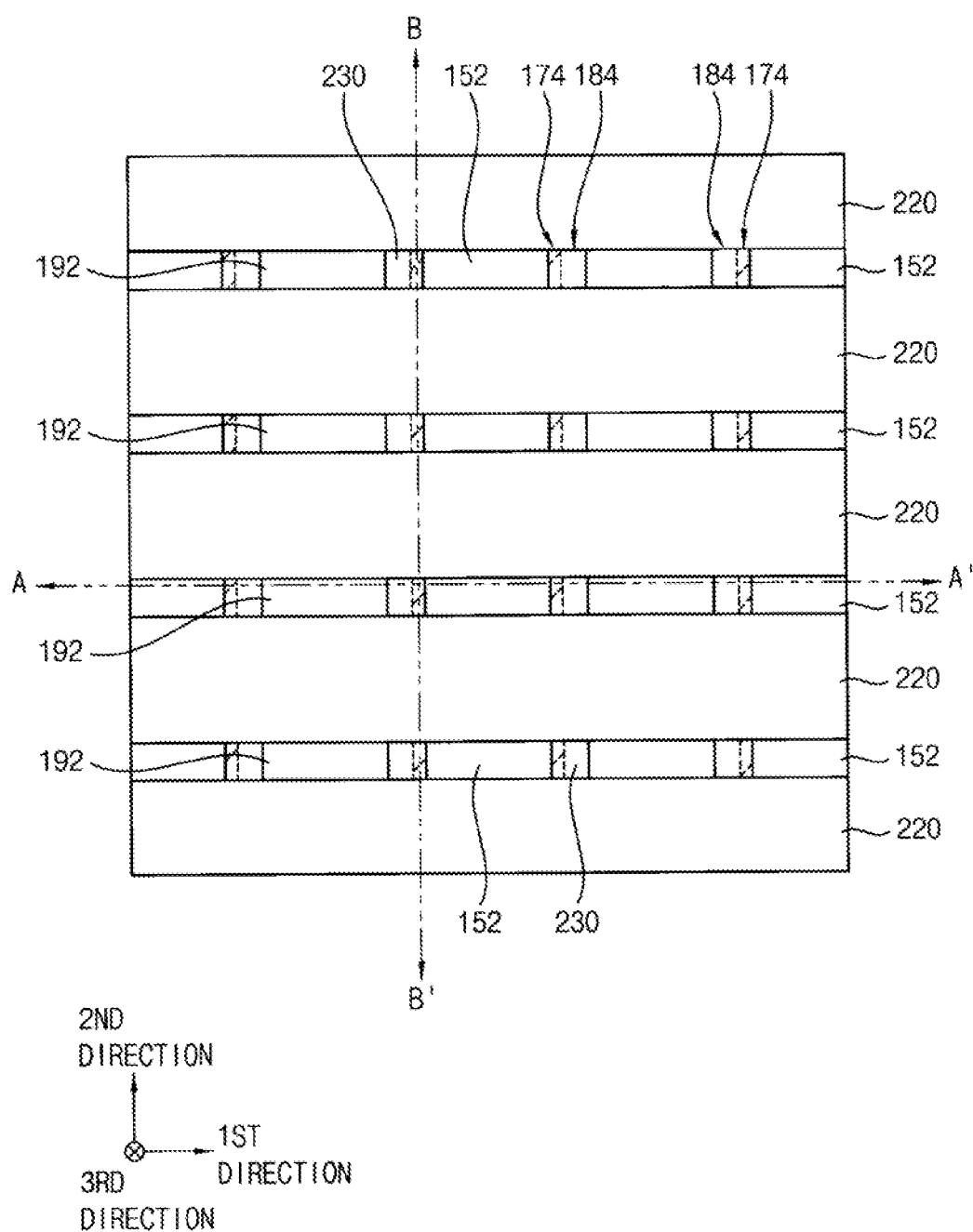
Figure 16:
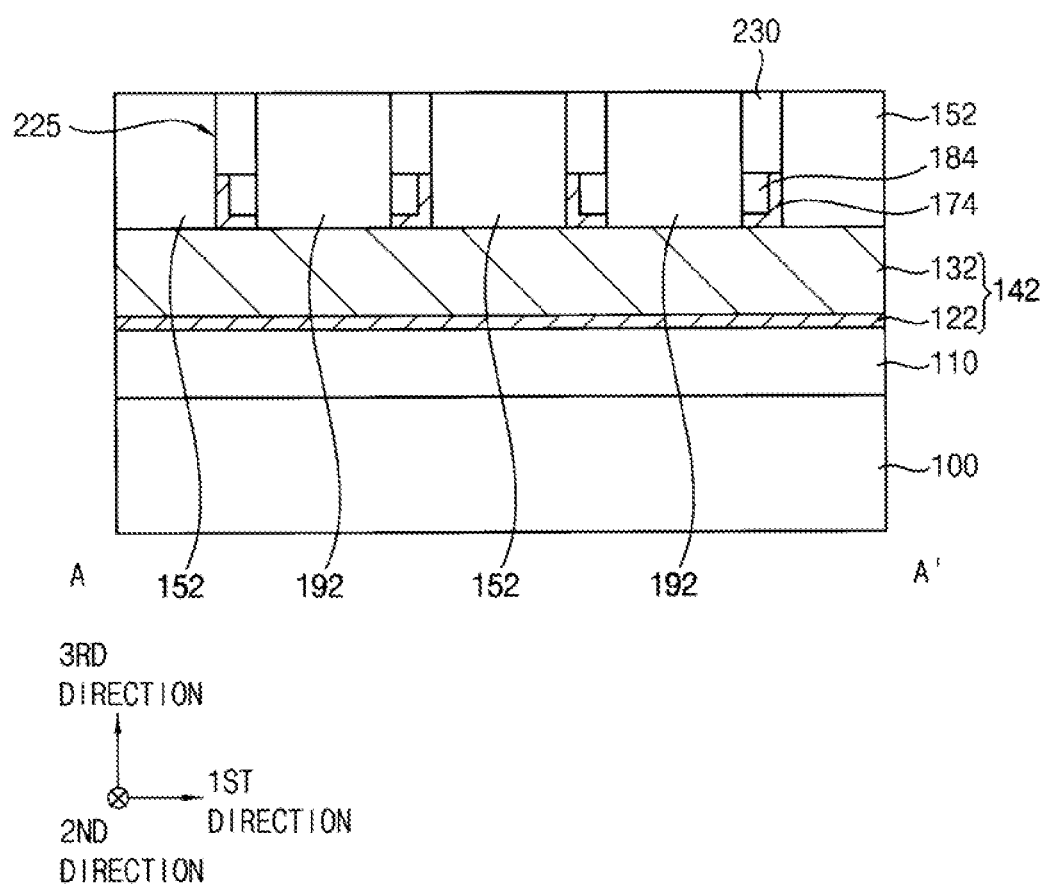

Referring to FIGS. 15 to 17, after removing the first mask 202, a fourth insulating interlayer 220 may be formed on the first insulating interlayer 110 to cover a first structure including the first electrode 174, the first spacer 184, the second and third insulating interlayer patterns 152 and 192, the first metal pattern 132, and the first barrier pattern 122, and may be planarized until upper surfaces of the first electrode 174 and the first spacer 184 are exposed.

The fourth insulating interlayer 220 may include a nitride, e.g., silicon nitride, or silicon oxynitride. In an exemplary embodiment of the present inventive concept, the fourth insulating interlayer 220 may include a material substantially the same as that of the second and third insulating interlayer patterns 152 and 192. Thus, the fourth insulating interlayer 220 and the second and third insulating interlayer patterns 152 and 192 may be a single continuous layer.

Upper portions of the first electrode 174 and the first spacer 184 may be removed to form a first recess 225, and a first variable resistance pattern 230 may be formed to fill the first recess 225.

The first variable resistance pattern 230 may be formed by forming a first variable resistance layer on the first electrode 174, the first spacer 184, the fourth insulating interlayer 220, and the second and third insulating interlayer patterns 152 and 192 to substantially fill the first recess 225, and planarizing the first variable resistance layer until an upper surface of the fourth insulating interlayer 220 are exposed.

In an exemplary embodiment of the present inventive concept, the first variable resistance layer may include a material whose resistance may be changed according to the phase change thereof. In an exemplary embodiment of the present inventive concept, the first variable resistance layer may include a chalcogenide material including germanium, antimony and/or tellurium. In an exemplary embodiment of the present inventive concept, the first variable resistance layer may include a super lattice having a germanium-tellurium layer and an antimony-tellurium layer alternately stacked. In an exemplary embodiment of the present inventive concept, the first variable resistance layer may include IST containing indium-antimony-tellurium or BST including bismuth-antimony-tellurium. The first variable resistance layer may further include carbon, nitrogen, boron, or oxygen.

In an exemplary embodiment of the present inventive concept, the first variable resistance layer may include a perovskite-based material or a transition metal. The perovskite-based material may include, e.g., STO ($SrTiO_3$), BTO ($BaTiO_3$), or PCMO ($Pr_{1-X}Ca_XMnO_3$). The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx) or zinc oxide (ZnOx), or a combination thereof.

The first variable resistance pattern 230 may be formed on the upper surfaces of the first electrode 174 and the first spacer 184, and thus a plurality of first variable resistance patterns 230 may be formed in each of the first and second directions. As an example, the first spacer 184 may be formed on the first electrode 174, and the upper surfaces of the first electrode 174 and the first variable resistance pattern 184 may be in direct contact with a lower surface of the first variable resistance pattern 230.

Figure 18:
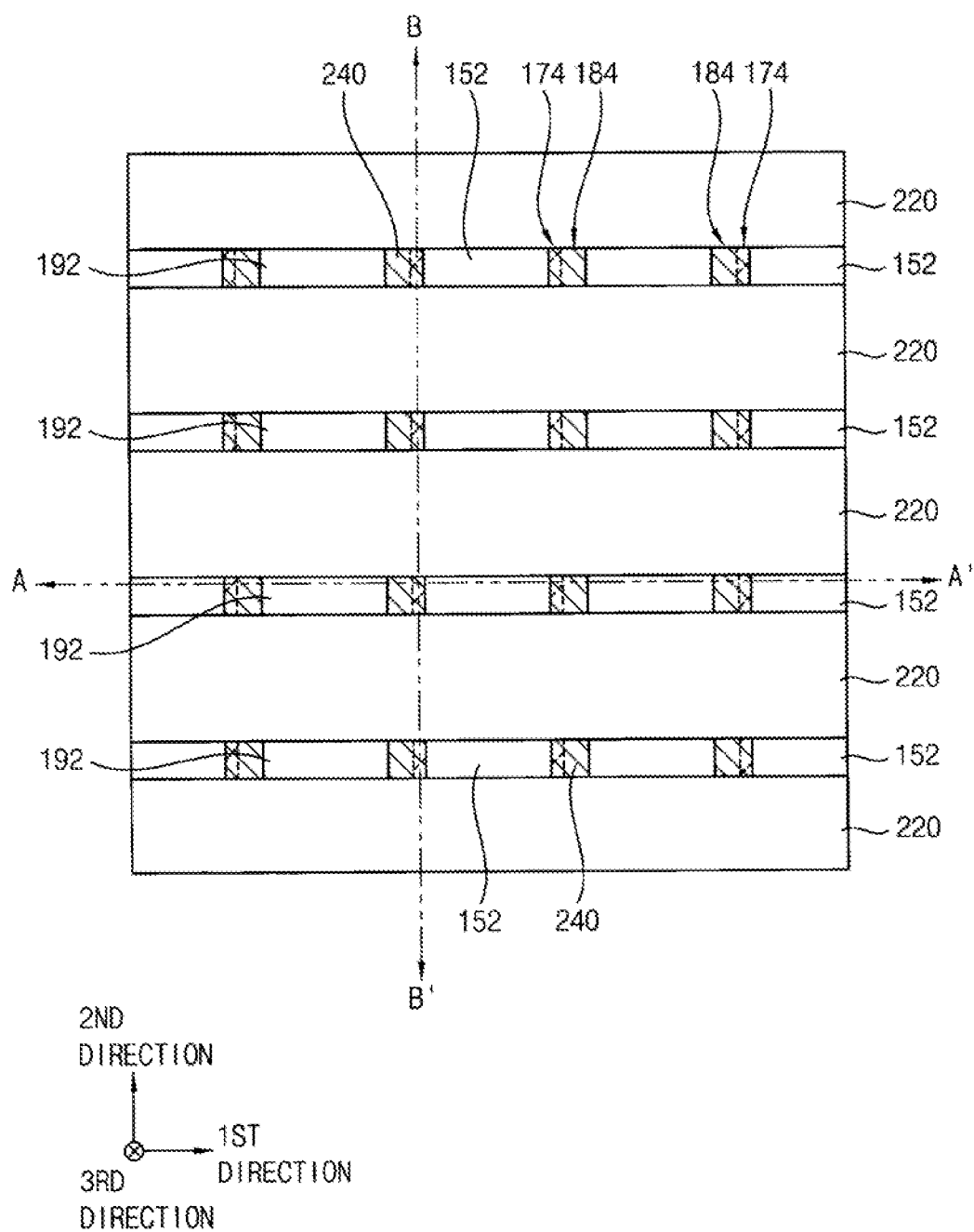
Figure 19:
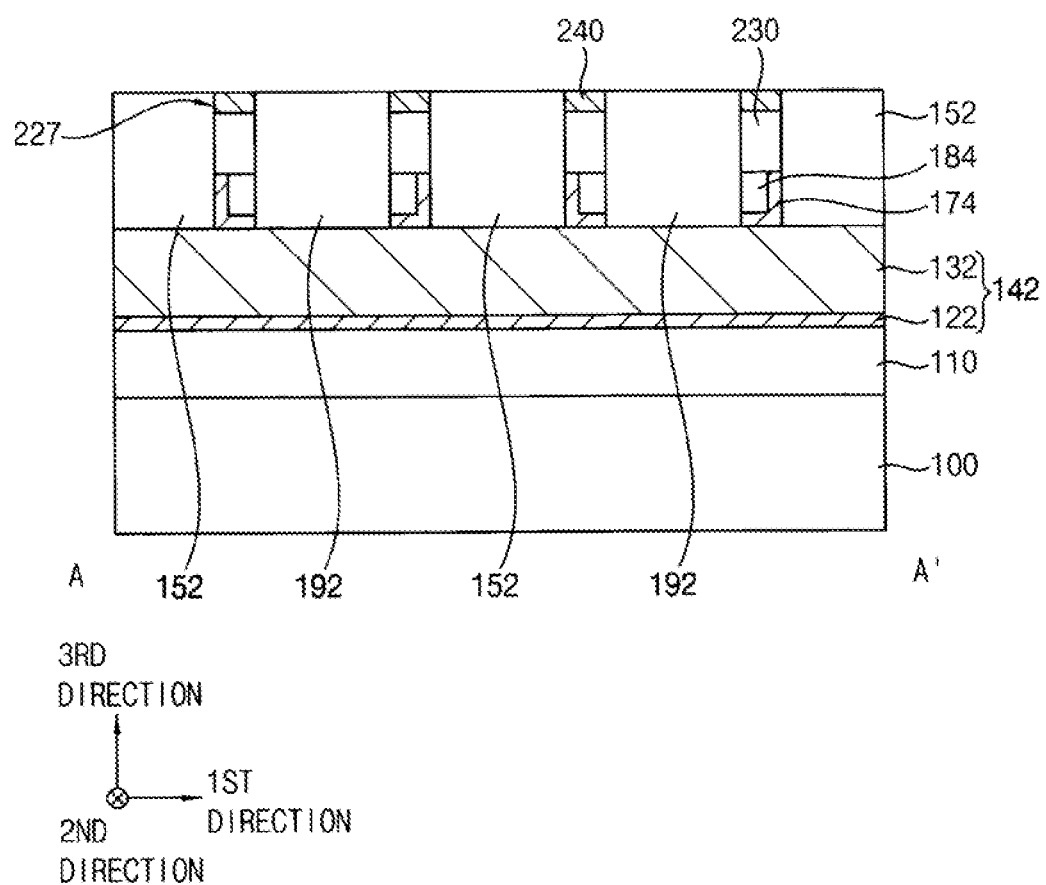

Referring to FIGS. 18 to 20, an upper portion of the first variable resistance pattern 230 may be removed to form a second recess 227, and a second electrode 240 may be formed to fill the second recess 727.

The second electrode 240 may be formed by forming a second electrode layer on the first variable resistance pattern 230, the fourth insulating interlayer 220, and the second and third insulating interlayer patterns 152 and 192 to substantially fill the second recess 227, and planarizing the second electrode layer until the upper surface of the fourth insulating interlayer 220 may be exposed.

The second electrode layer may include a metal nitride or a metal silicon nitride, e.g., titanium nitride, titanium silicon nitride, tungsten nitride, tungsten silicon nitride, tantalum nitride, tantalum silicon nitride, zirconium nitride, or zirconium silicon nitride.

The second electrode 240 may be formed on an upper surface of the first variable resistance pattern 230, and a plurality of second electrodes 240 may be formed in each of the first and second directions. In an exemplary embodiment of the present inventive concept, a lower surface of the second electrode 240 may have a shape and an area substantially the same as that of the first variable resistance pattern 230.

The first electrode 174, the first variable resistance pattern 230 and the second electrode 240 may form a first memory unit.

Figure 21:
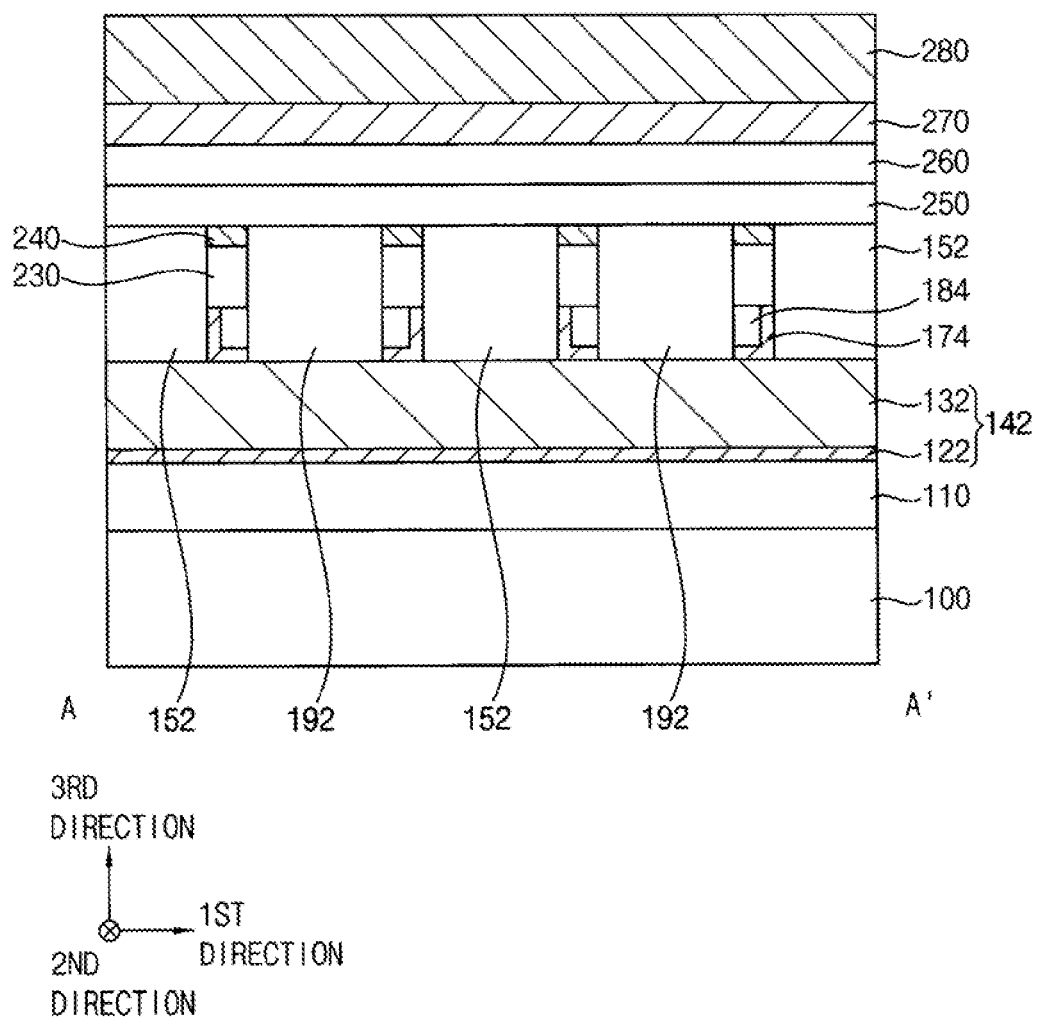

Referring to FIG. 21, a first selection layer 250, a first buffer layer 260, a third electrode layer 270 and a second metal layer 280 may be sequentially formed on the second electrode layer, the fourth insulating interlayer 220, and the second and third insulating interlayer patterns 152 and 192.

In an exemplary embodiment of the present inventive concept, the first selection layer 250 may include an ovonic threshold switch (OTS) material that may serve as a switching element by the resistance difference due to the temperature difference in an amorphous state.

The OTS material may include, e.g., germanium, silicon, arsenic and/or tellurium, and may further include selenium, sulfur, carbon, nitrogen, indium, or boron.

The OTS material may include, e.g., AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAs-BiTe, GeAsBiSe, or $Ge_xSe_{1-x}$.

Alternatively, the first selection layer 250 may include a polysilicon layer doped with n-type impurities and a polysilicon layer doped with p-type impurities sequentially stacked, e.g., a diode.

The first buffer layer 260 may include carbon or a metal including carbon. For example, the first buffer layer 260 may include carbon, carbonitride, titanium carbonitride and/or tantalum carbonitride.

The third electrode layer 270 may include a metal nitride or a metal silicon nitride.

The second metal layer 280 may include a metal, e.g., tungsten, platinum, palladium, rhodium, ruthenium, iridium, copper, aluminum, titanium, or tantalum.

The third electrode layer 270 may be etched subsequently, and may serve as an electrode.

The third electrode 270 may serve as a barrier layer that may reduce or prevent a metal component of the second metal layer 280 from moving into neighboring layers. Thus, the third electrode layer 270 and the second metal layer 280 may form a second conductive layer structure. As an example, the third electrode layer 270 need not be formed and the second metal layer may form a second conductive layer structure.

Figure 22:
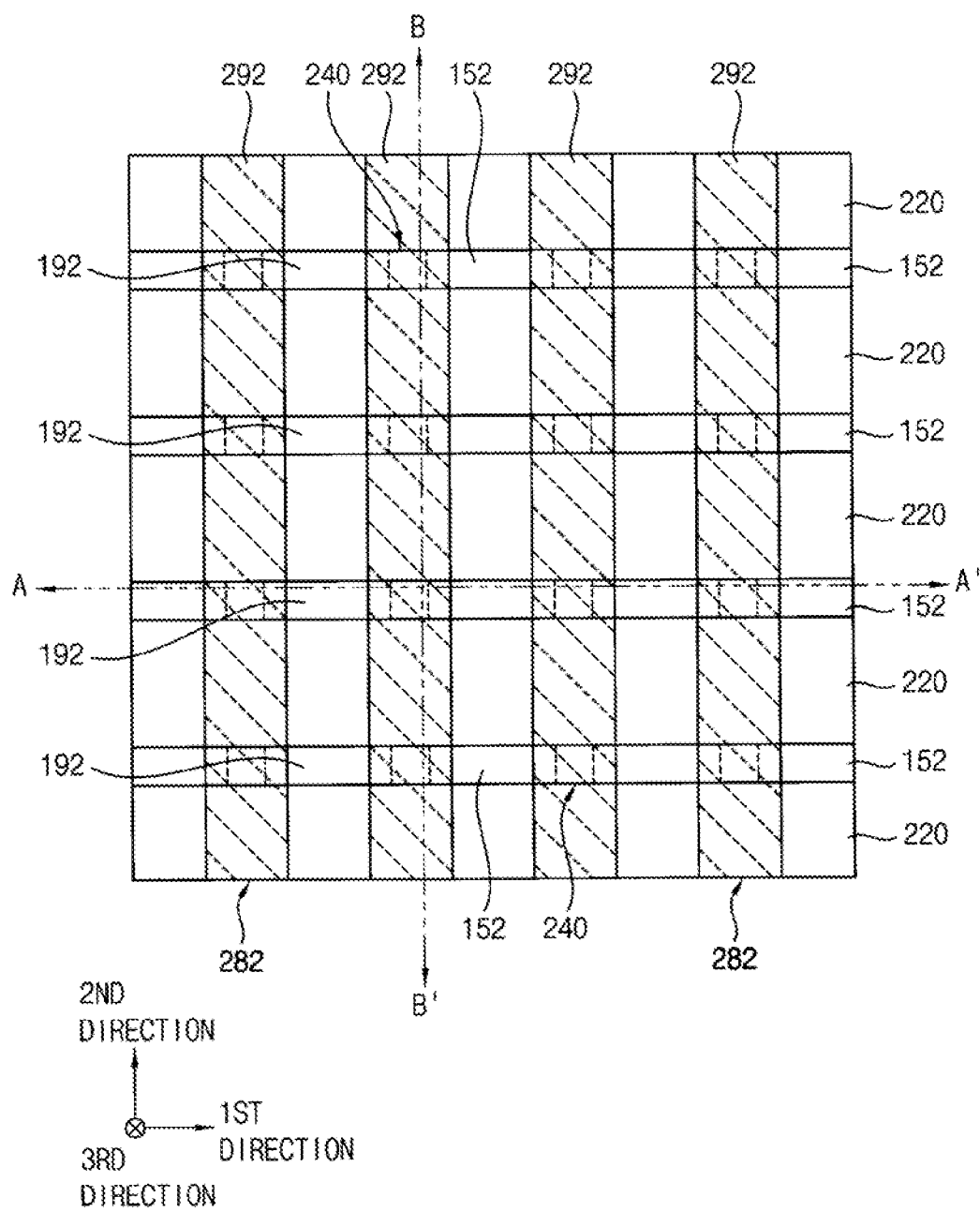
Figure 23:
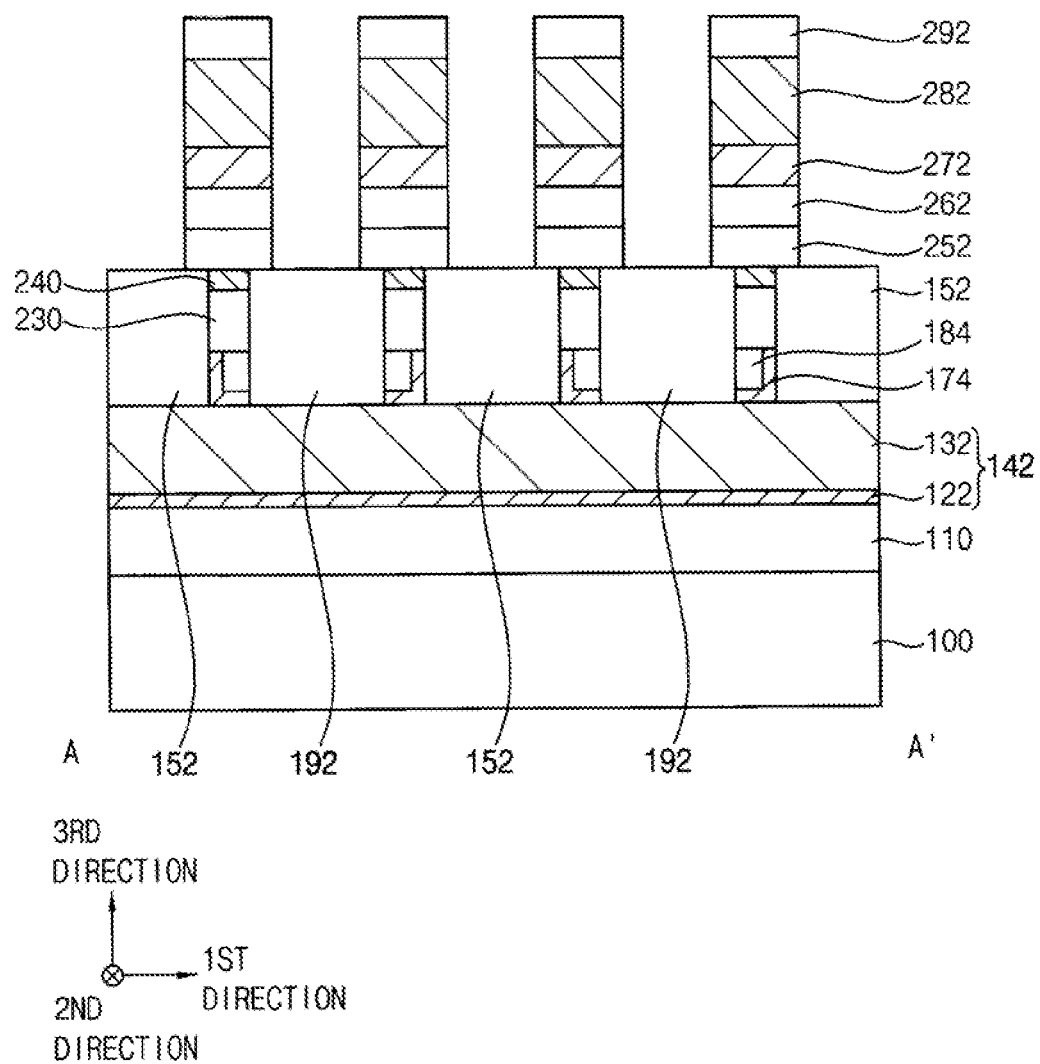

Referring to FIGS. 22 to 24, a DPT process substantially the same as or similar to that described with reference to FIGS. 8 to 14 may be performed to form a second structure including a first selection pattern 252, a first buffer 262, a third electrode 272, a second metal pattern 282, and a third mask sequentially stacked on the second electrode 240, the fourth insulating interlayer 220, and the second and third insulating interlayer patterns 152 and 192.

In an exemplary embodiment of the present inventive concept, the second metal layer 280, the third electrode layer 270 and the first buffer layer 260 may be etched with a first etching gas using the third mask as an etching mask, and the first selection layer 250 may be etched with a second etching gas to form the second structure. Thus, when the etching process is performed using the first etching gas, the first buffer layer 260 may be on the first selection layer 250, and thus the first selection layer 250 need not be damaged. The first selection layer 250 may be etched using the second etching gas, and thus the first selection pattern 252 may be formed. The first buffer layer 260 need not be formed in some cases.

In an exemplary embodiment of the present inventive concept, the second structure may extend in the second direction, and a plurality of second structures may be formed in the first direction. Thus, each of the first selection pattern 252, the first buffer 262, the third electrode 272, and the second metal pattern 282 may extend in the second direction, and a plurality of first selection patterns 252, a plurality of first buffers 262, a plurality of third electrodes 272, and a plurality of second metal patterns 282 may be formed in the first direction.

The third electrode 272 and the second metal pattern 282 sequentially stacked may form a second conductive line. Alternatively, the second metal pattern 282 with the third electrode 272 omitted may be referred to as the second conductive line. In an exemplary embodiment of the present inventive concept, the first conductive line 142 may serve as the word line of the variable resistance memory device, and the second conductive line may serve as the bit line thereof. Alternatively, the first conductive line 142 may serve as the bit line of the variable resistance memory device, and the second conductive line may serve as the word line thereof.

The first selection pattern 252 may be formed by a single etching process using a third mask 292 extending in the second direction. Thus, the first selection pattern 252 may be damaged less than that formed by a plurality of etching processes, and thus the first selection pattern 252 may have increased reliability.

The third mask 292 may include an insulating material, e.g., polysilicon, silicon nitride and/or silicon oxide.

Figure 25:
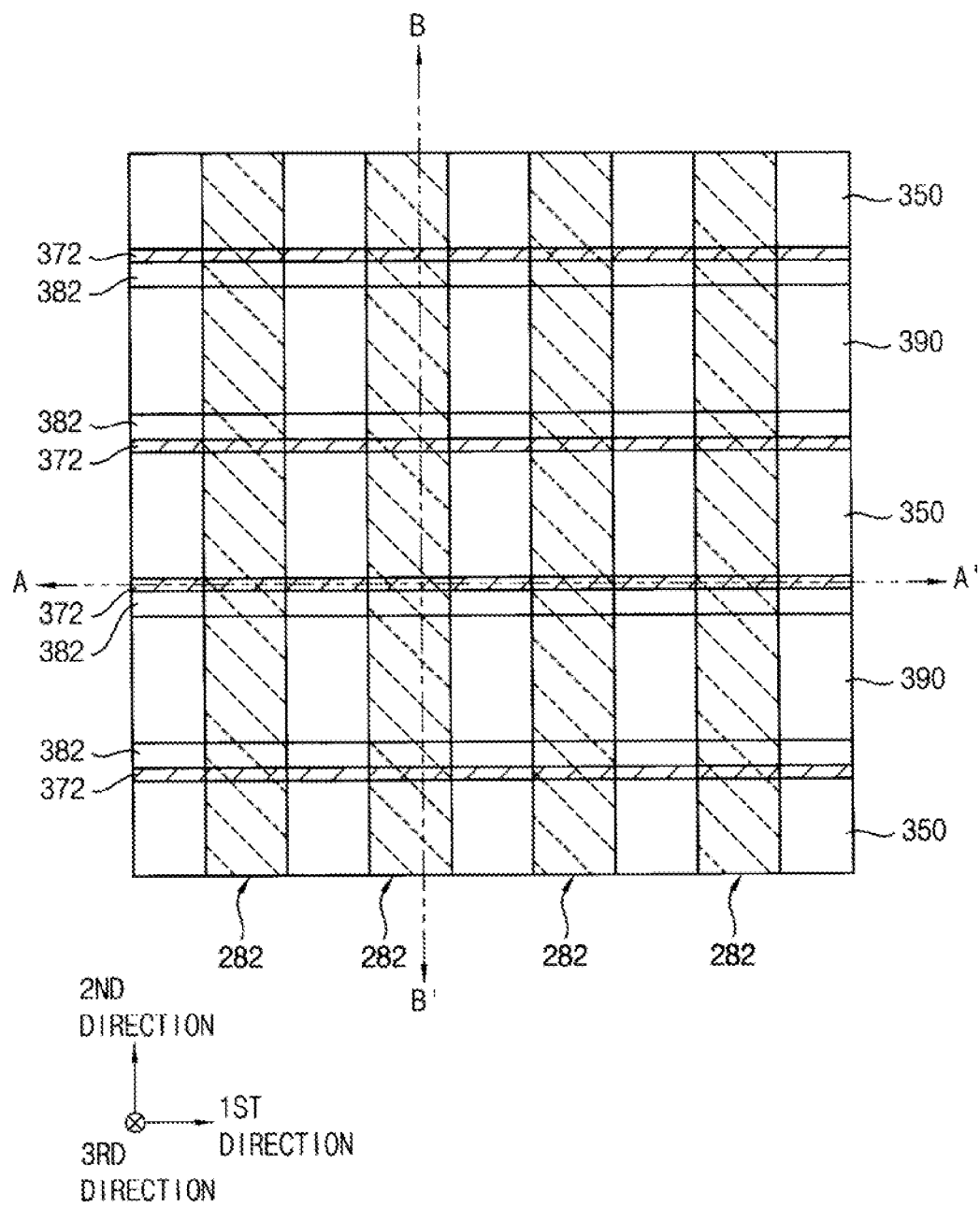
Figure 26:
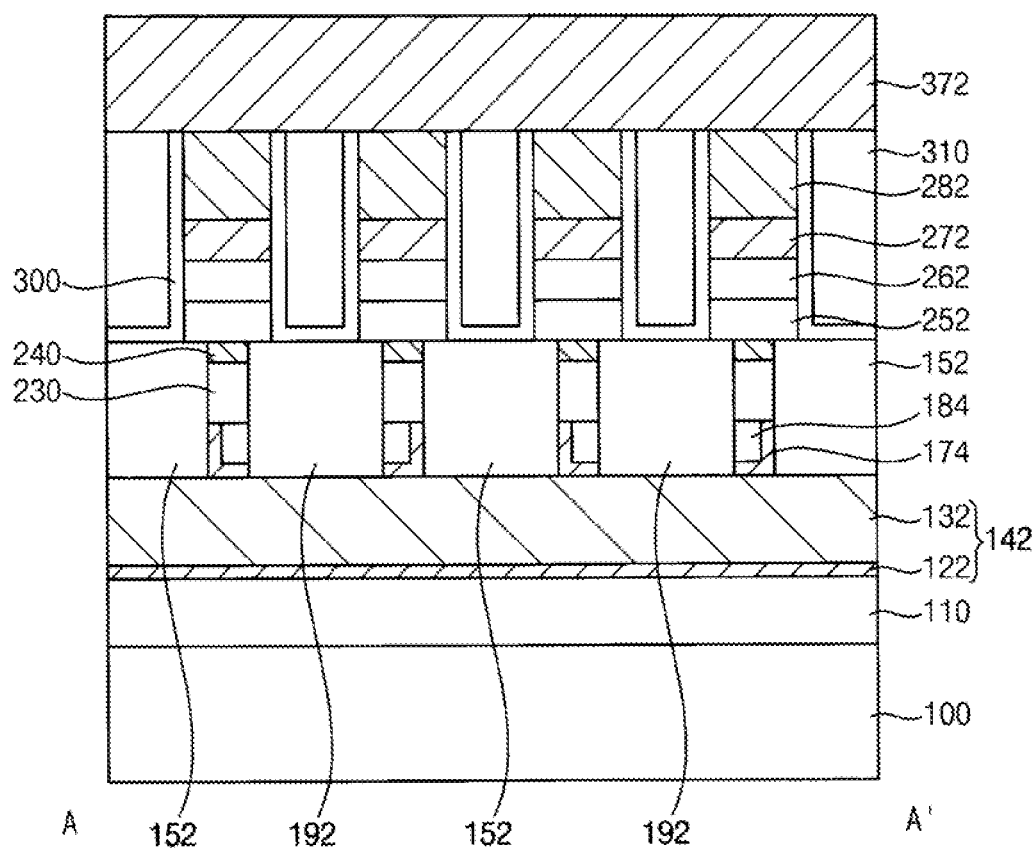
Figure 27:
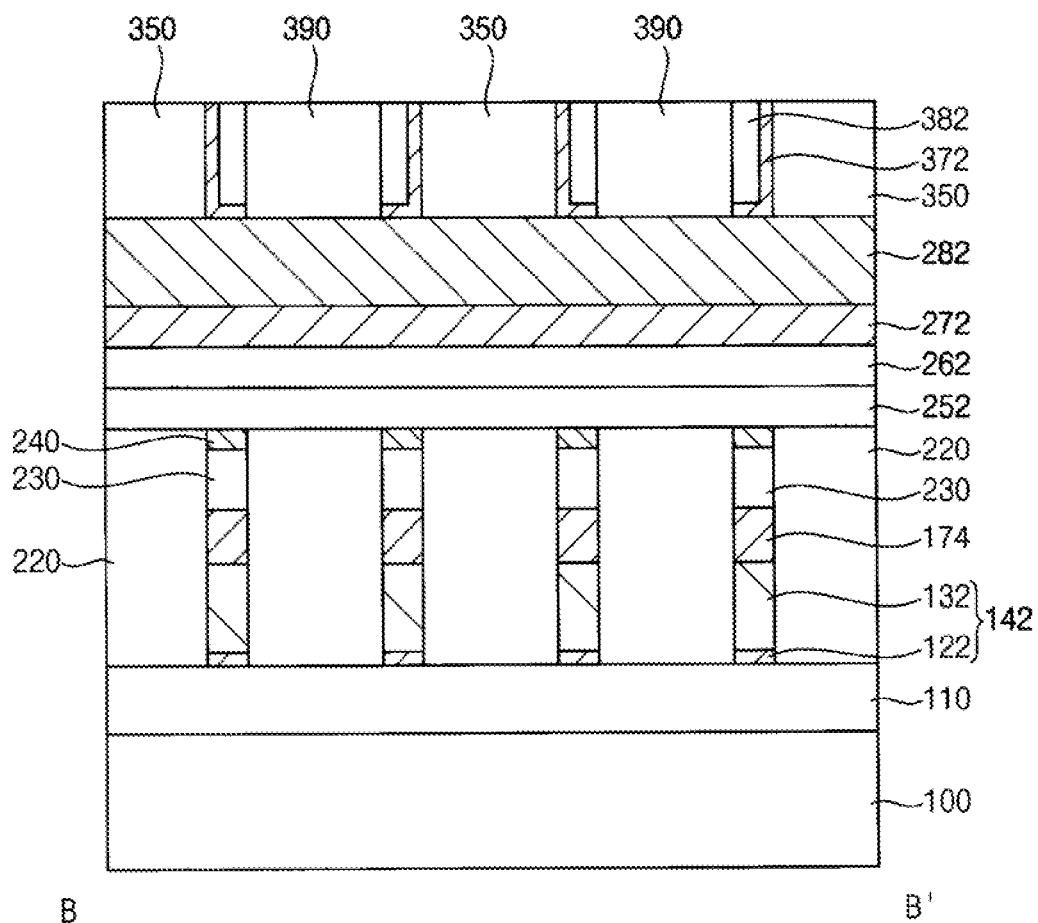

Referring to FIGS. 25 to 27, a first capping layer 300 may be formed on the fourth insulating interlayer 220, and the second and third insulating interlayer patterns 152 and 192 to cover the second structures, and a fifth insulating interlayer 310 may be formed on the first capping layer 300 to substantially fill a space between the second structures.

The first capping layer 300 may include an insulating material, e.g., silicon nitride, or silicon oxide. The fifth insulating interlayer 310 may include a nitride, e.g., silicon nitride. In an exemplary embodiment of the present inventive concept, the fifth insulating interlayer 310 may include a material substantially the same as that of the first capping layer 300. Thus, the fifth insulating interlayer 310 and the first capping layer 300 may be formed as a single continuous layer.

The variable resistance memory device may be manufactured by the processes described above; however, exemplary embodiments of the present invention are not limited thereto.

The first variable resistance pattern 230 need not be formed together with the overlying first selection pattern 252, but may be formed by a damascene process in which the first variable resistance pattern 230 may substantially fill the first recess 225 formed by removing the upper portions of the underlying first electrode 174 and the first spacer 184. Thus, the first variable resistance pattern 230 need not be damaged by an etching process of the first variable resistance pattern 230 and the first selection pattern 252, and thus the first variable resistance pattern 230 may have increased reliability.

The first selection pattern 252 need not be formed simultaneously with the first variable resistance pattern 230. The first selection pattern 252 may extend in the second direction, and thus may be formed by a single etching process. Thus, the first selection pattern 252 may have little or no etching damage.

A method of manufacturing a variable resistance memory device according to an exemplary embodiment of the present invention may include the first memory units that may be formed between the first conductive lines 142 each extending in the first direction and the second conductive lines 282 each extending in the second direction, specifically, at a region where the first and second conductive lines 142 and 282 overlap each other in the third direction.

A method of manufacturing a variable resistance memory device including memory units at a plurality of levels will be described below in more detail. As an example, a variable resistance memory device including first and second memory units at two levels, respectively, will be described; however exemplary embodiments of the present invention are not limited thereto, and more than two memory units at more than two levels may be included in the variable resistance memory device.

Referring to FIGS. 25 to 27, the fifth insulating interlayer 310 may be planarized until an upper surface of the second metal pattern 282 of the second structure is exposed, and upper portions of the first capping layer 300 and the third mask 292 may be removed.

Processes substantially the same as or similar to those described above with reference to FIGS. 1 to 7 may be performed.

Thus, a preliminary fourth electrode 372, a preliminary second spacer 382, and sixth and seventh insulating interlayers 350 and 390 may be formed on the second metal pattern 282, the first capping layer 300 and the fifth insulating interlayer 310.

In an exemplary embodiment of the present inventive concept, each of the preliminary fourth electrode 372 and the preliminary second spacer 382 may extend in the first direction, and a plurality of preliminary fourth electrodes 372 and a plurality of preliminary second spacers 382 may be formed in the second direction.

Figure 28:
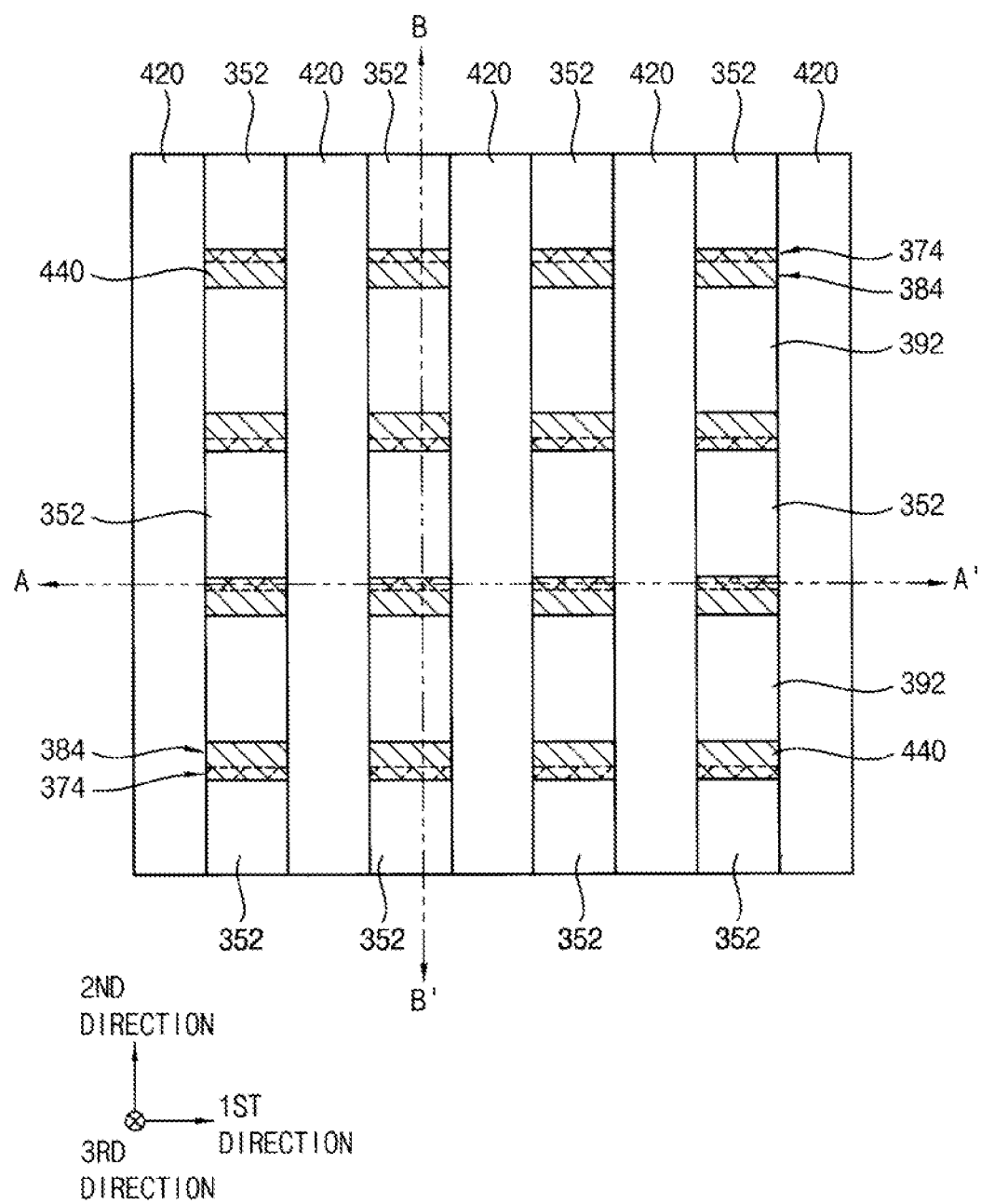
Figure 29:
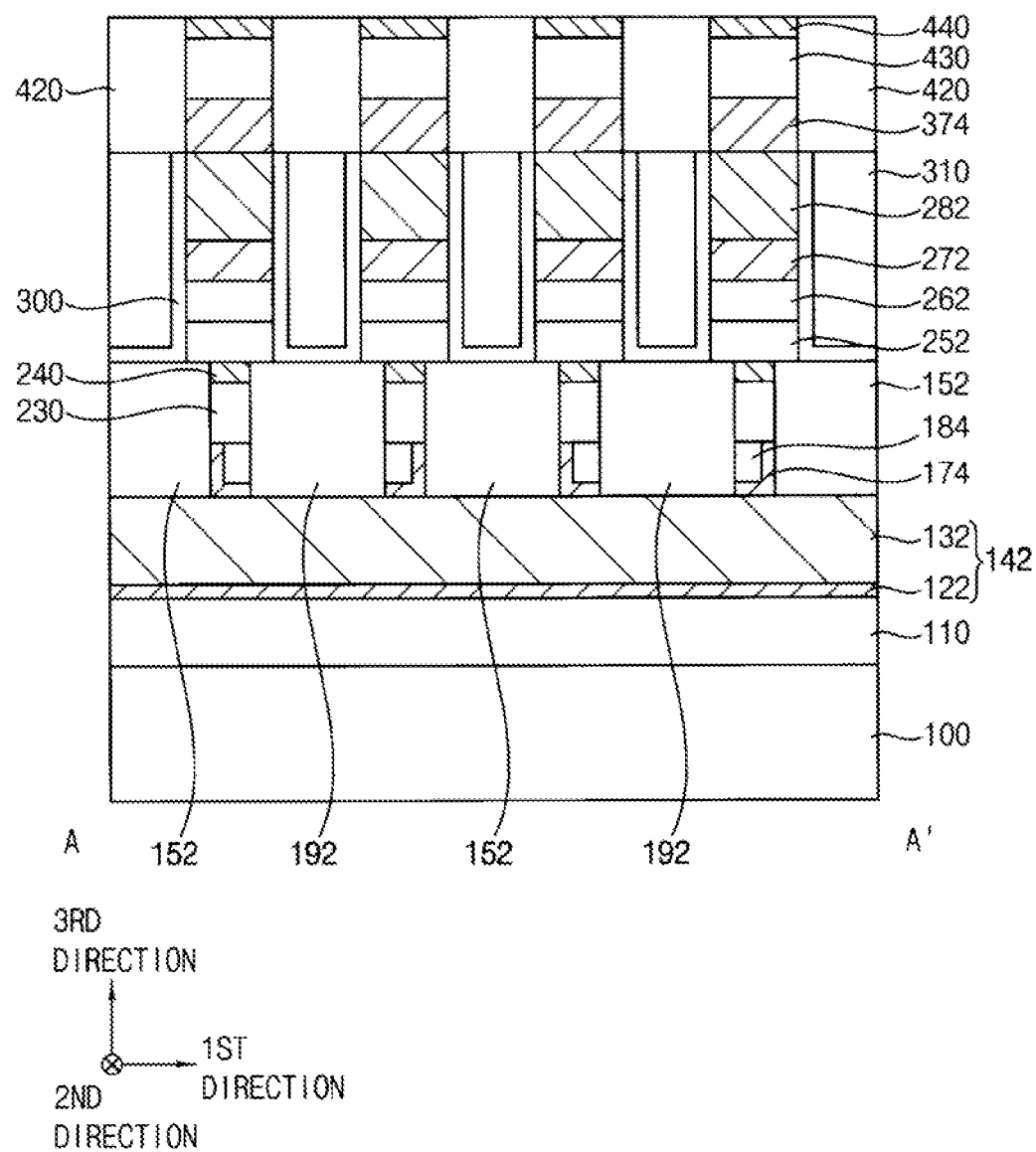

Referring to FIGS. 28 to 30, processes substantially the same as or similar to those described above with reference to FIGS. 8 to 20 may be performed.

Thus, a second memory unit including a fourth electrode 374, a second variable resistance pattern 430 and a fifth electrode 440 sequentially stacked may be formed in each of the first and second directions. In an exemplary embodiment of the present inventive concept, the fourth electrode 374 may have a cross-section taken along the second direction having an "L" shape, and a second spacer 384 may be formed on the fourth electrode 374. Upper surfaces of the fourth electrode 374 and the second spacer 384 may be in direct contact with a lower surface of the second variable resistance pattern 430.

Sixth and seventh insulating interlayer patterns 352 and 392 disposed on and substantially covering sidewalls of the second memory unit and the second spacer 384 in the second direction may be formed on the second metal pattern 282, the first capping layer 300 and the fifth insulating interlayer 310. An eighth insulating interlayer 420 disposed on and substantially covering sidewalls of a third structure including the second memory unit, the second spacer 384, and the sixth and seventh insulating interlayer patterns 352 and 392 in the first direction may be formed to extend in the second direction.

Figure 31:
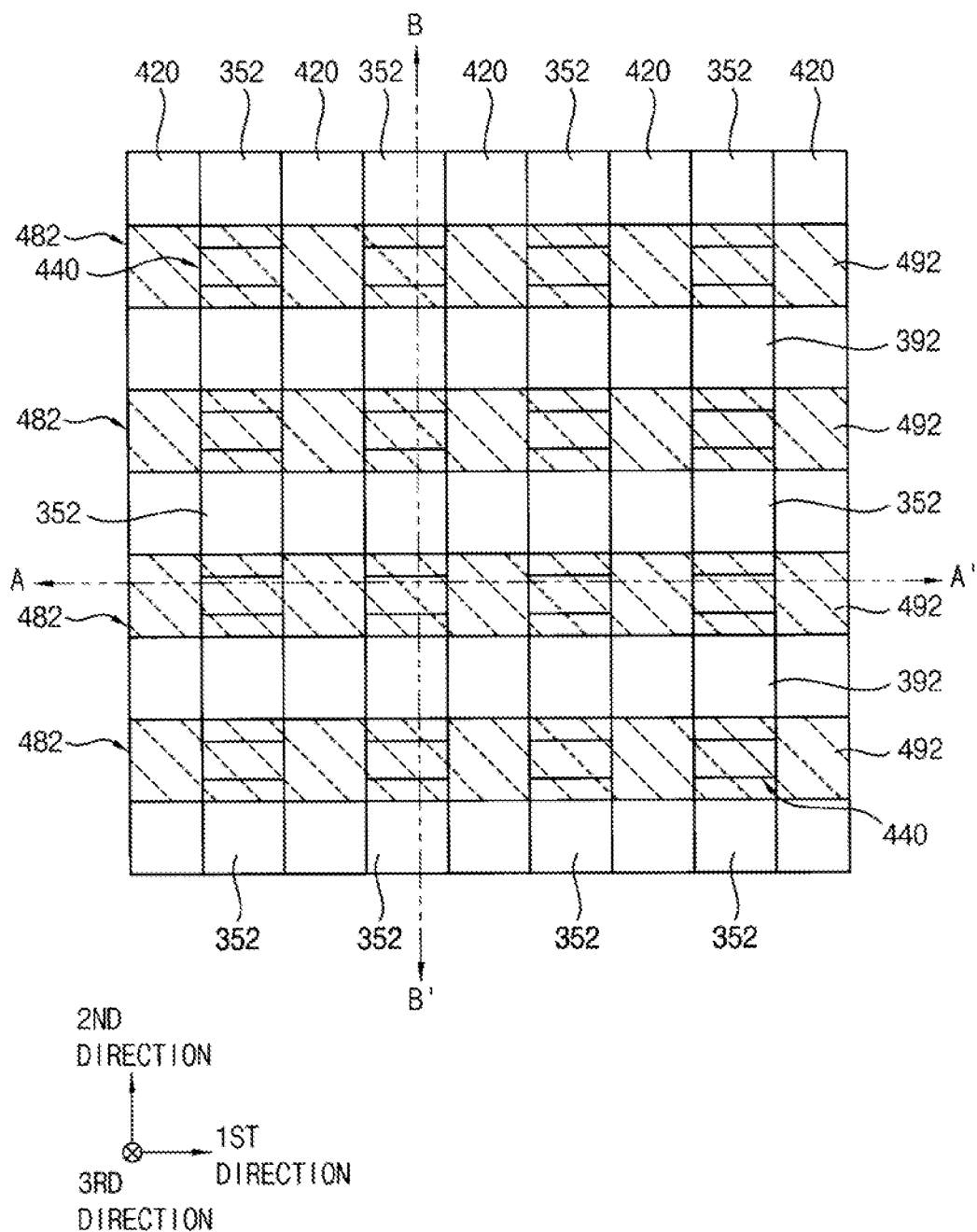
Figure 32:
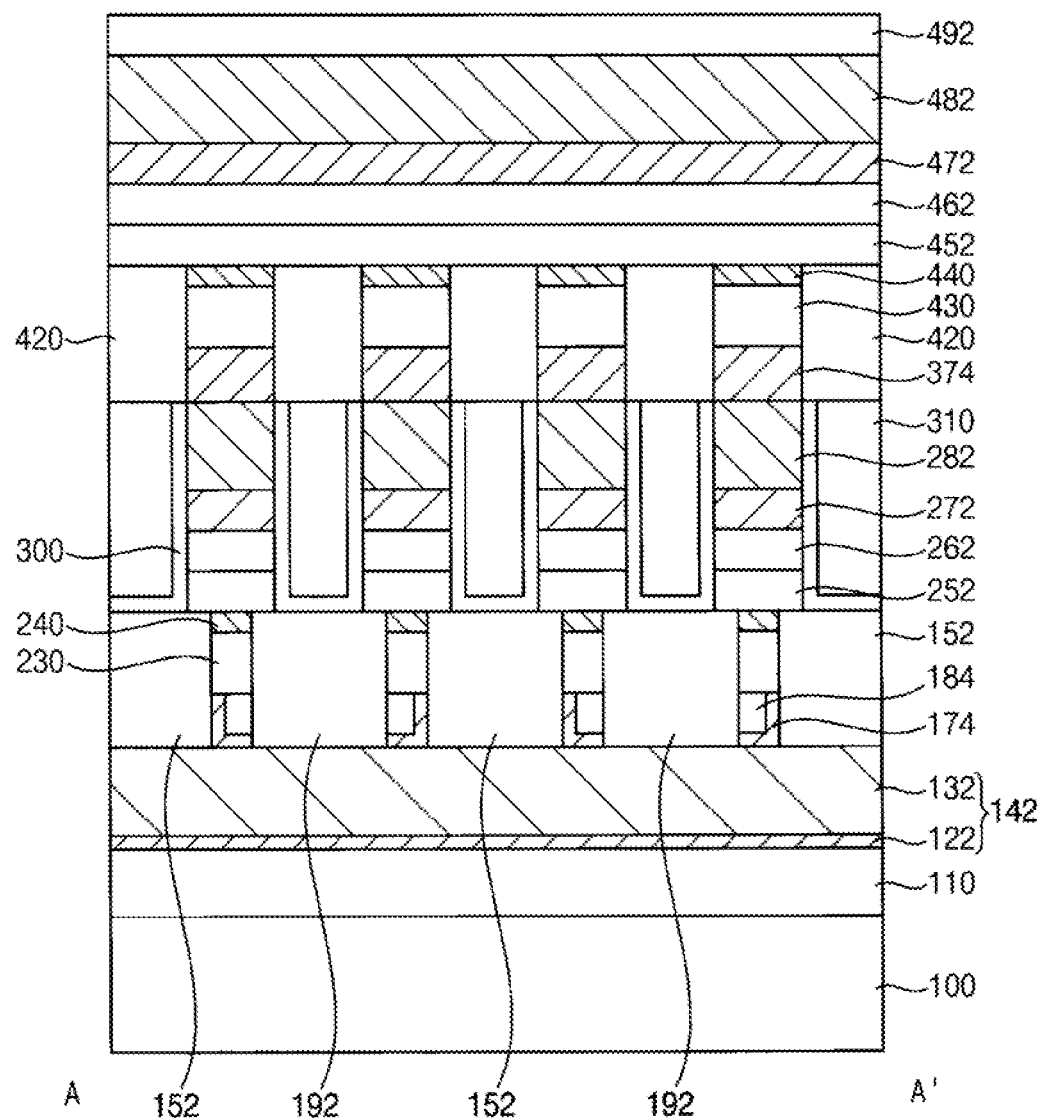
Figure 33:
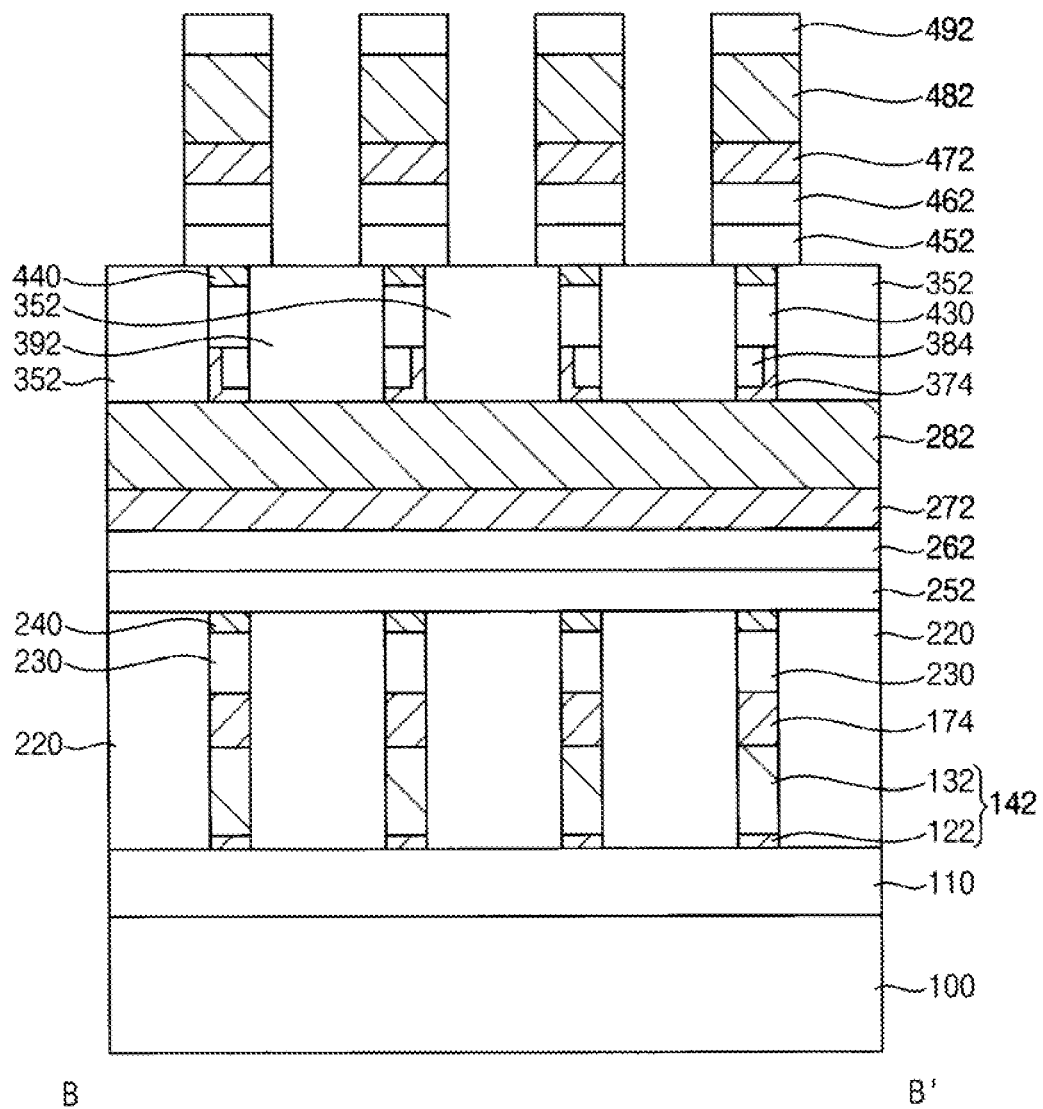

Referring to FIGS. 31 to 33, processes substantially the same as or similar to those described above with reference to FIGS. 21 to 24 may be performed.

Thus, a fourth structure including a second selection pattern 452, a second buffer 462, a sixth electrode 472, a third metal pattern 482, and a fourth mask 492 sequentially stacked may be formed on the fifth electrode 440, the eighth insulating interlayer 420, and the sixth and seventh insulating interlayer patterns 352 and 392.

In an exemplary embodiment of the present inventive concept, the fourth structure may extend in the first direction, and a plurality of fourth structures may be formed in the second direction. Thus, each of the second selection pattern 452, the second buffer 462, the sixth electrode 472 and the third metal pattern 482 may extend in the first direction, and a plurality of fourth structures may be formed in the second direction.

In an exemplary embodiment of the present inventive concept, the fourth structure may be in direct contact with upper surfaces of the fifth electrodes 440 disposed in the first direction.

The sixth electrode 472 and the third metal pattern 482 may form a third conductive line. Alternatively, the sixth electrode 472 may be omitted and the third metal pattern 482 may be referred to as the third conductive line. In an exemplary embodiment of the present inventive concept, the third conductive line may serve as a word line or a bit line of the variable resistance memory device.

The second selection pattern 452 may be formed by a single etching process, which may be performed independently from an etching process for forming the underlying second variable resistance pattern 450. Thus, the second selection pattern 452 may have little or no etching damage, and the second selection pattern 452 may have increased reliability.

Figure 34:
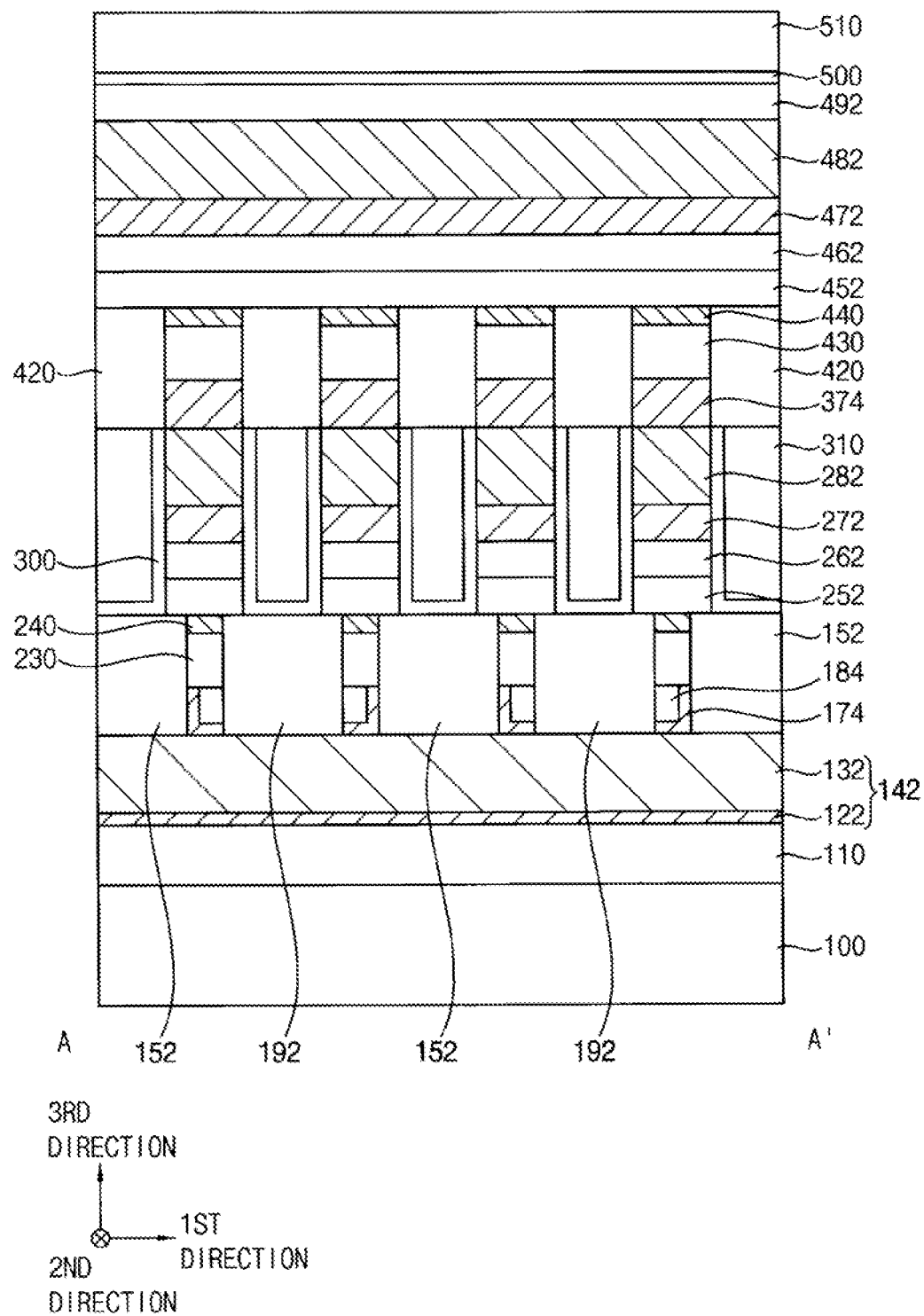

Referring to FIGS. 34 and 35, processes substantially the same as or similar to those described with reference to FIGS. 25 to 27 may be performed.

As an example, a second capping layer 500 may be formed on the eighth insulating interlayer 420, and the sixth and seventh insulating interlayer patterns 352 and 392 may be formed to cover the fourth structures. A ninth insulating interlayer 510 may be formed to substantially fill a space between the fourth structures, and thus the variable resistance memory device may be formed.

Figure 37:
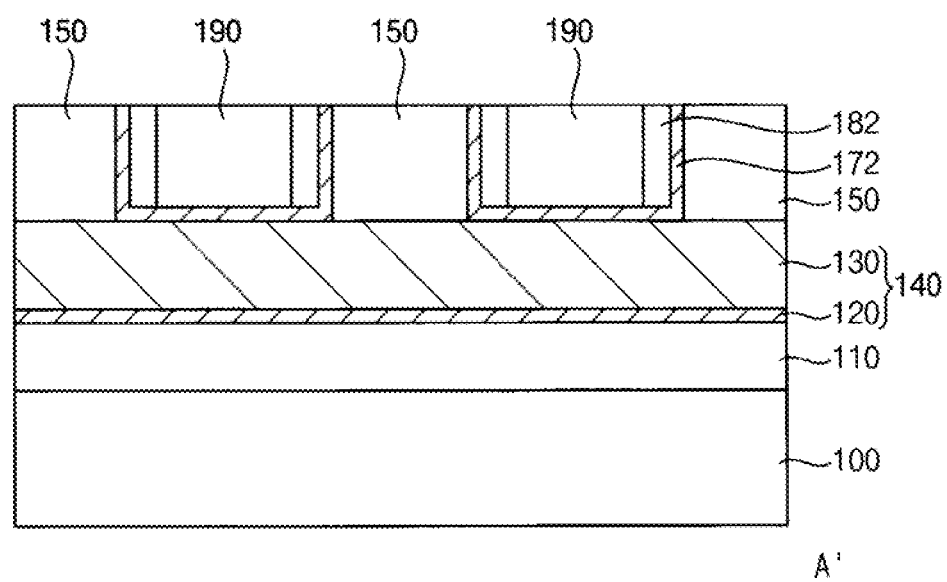
Figure 38:
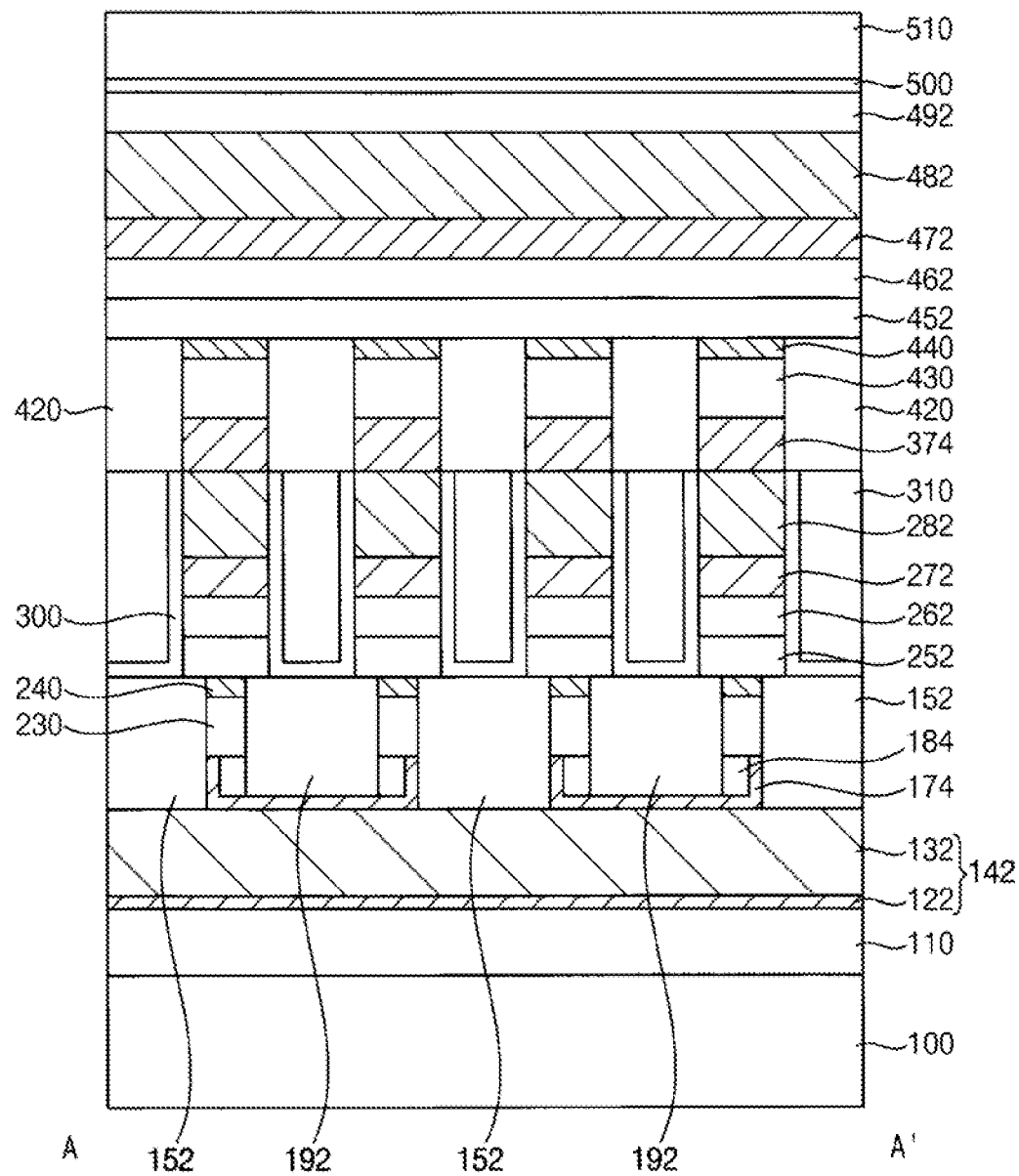

FIGS. 36 to 39 are cross-sectional views illustrating a method of manufacturing a variable resistance memory device in accordance with an exemplary embodiment of the present inventive concept. FIGS. 36 to 38 are cross-sectional views taken along a line A-A' of corresponding plan views, respectively, and FIG. 39 is a cross-sectional view taken along a line B-B' of a corresponding plan view. The method of manufacturing the variable resistance memory device may include processes substantially the same as or similar to those described with reference to FIGS. 1 to 35. Like reference numerals may refer to like elements, and duplicative descriptions may be omitted.

Referring to FIG. 36, processes substantially the same as or similar to those described with reference to FIGS. 1 to 3 may be performed, and processes substantially the same as or similar to those described with reference to FIGS. 4 and 5 may be performed.

However, after forming the preliminary first spacer 182, the etching process for etching the underlying the first electrode layer 170 using the preliminary first spacer 182 as an etching mask need not be performed.

Referring to FIG. 37, processes substantially the same as or similar to those described with reference to FIGS. 6 and 7 may be performed.

Thus, after forming the third insulating interlayer 190 on the preliminary first spacer 182 and the first electrode layer 170 to substantially fill the first opening 160, the third insulating interlayer 190 may be planarized until the upper surface of the second insulating interlayer 150 is exposed.

An upper portion of the first electrode layer 170 on the upper surface of the second insulating interlayer 150 may be removed in the etching process, and thus the preliminary first electrode 172 may be formed on the sidewall and the bottom of the first opening 160.

In an exemplary embodiment of the present inventive concept, the preliminary first electrode 172 may extend in the second direction. The preliminary first electrode 172 may include a horizontal portion in direct contact with an upper surface of the first conductive layer structure 140, and a vertical portion extending from the horizontal potion in the third direction. As an example, the preliminary first electrode 172 need not be divided into two portions having "L" shapes, but may have a single layer structure.

Referring to FIGS. 38 and 39, processes substantially the same as or similar to those described with reference to FIGS. 8 to 35 may be performed and thus the variable resistance memory device may be formed.

The first electrode 174 of the variable resistance memory device need not be divided into two portions having "L"

shapes, but may form a plurality of first electrodes 174. Additionally, the fourth electrode 374 may form a plurality of fourth electrodes 374.

Figure 40:
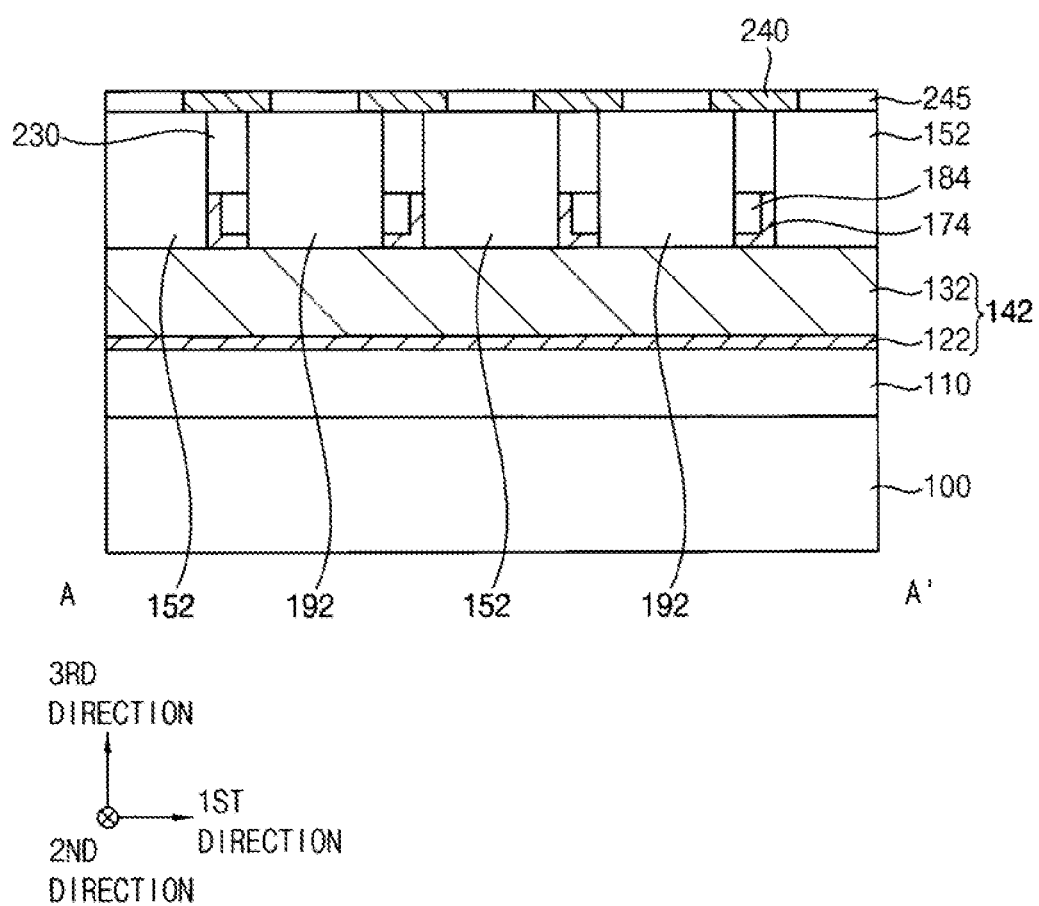
Figure 41:
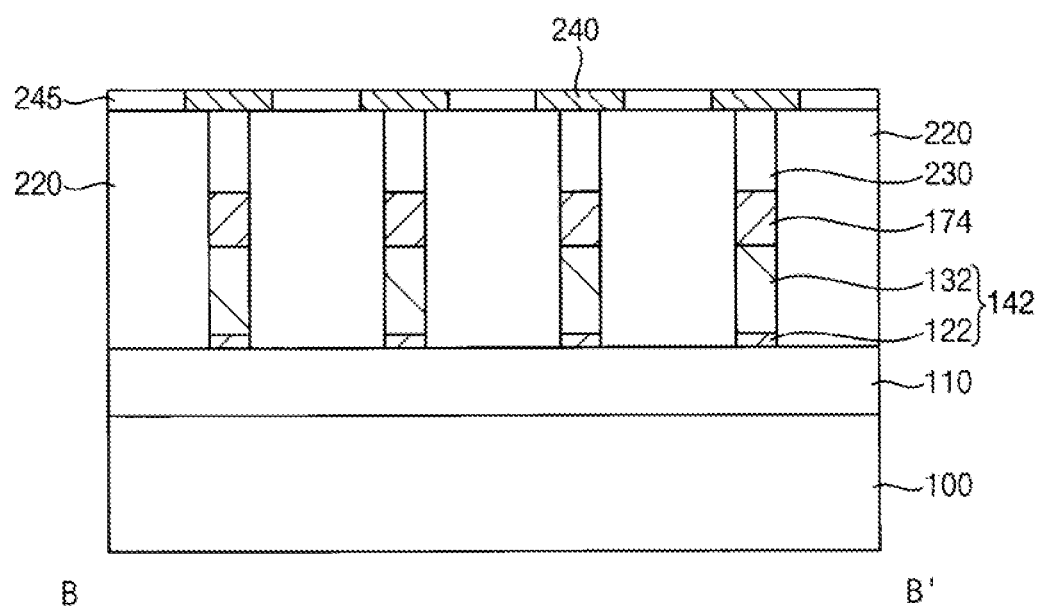

FIGS. 40 to 43 are cross-sectional views illustrating a method of manufacturing a variable resistance memory device in accordance with an exemplary embodiment of the present inventive concept. FIGS. 40 and 42 are cross-sectional views taken along a line A-A' of corresponding plan views, respectively, and FIGS. 41 and 43 are cross-sectional views taken along a line B-B' of corresponding plan views. The method of manufacturing the variable resistance memory device may include processes substantially the same as or similar to those described with reference to FIGS. 1 to 35. Thus, like reference numerals may refer to like elements, and duplicative descriptions may be omitted.

Referring to FIGS. 40 and 41, processes substantially the same as or similar to those described with reference to FIGS. 1 to 17 may be performed.

The second electrode 240 may be formed on the first variable resistance pattern 230.

As an example, a second electrode layer may be formed on the first variable resistance pattern 230, the fourth insulating interlayer 220, and the second and third insulating interlayer patterns 152 and 192, and may be patterned to form the second electrode 240.

In an exemplary embodiment of the present inventive concept, a plurality of second electrodes 240 may be formed in each of the first and second directions. A lower surface of the second electrode 240 may have an area equal to or greater than that of an upper surface of the first variable resistance pattern 230.

After forming the second electrode 240, a tenth insulating interlayer 245 may be formed on the fourth insulating interlayer 220, and the second and third insulating interlayer patterns 152 and 192 to cover the second electrode 240. The tenth insulating interlayer 245 may be planarized until an upper surface of the second electrode 240 may be exposed.

Alternatively, after forming the tenth insulating interlayer 245, the tenth insulating interlayer 245 may be partially etched to form a third opening exposing an upper surface of the first variable resistance pattern 230, and the second electrode 240 may be formed to substantially fill the third opening.

Referring to FIGS. 42 and 43, processes substantially the same as or similar to those described with reference to FIGS. 18 to 35 may be performed, and thus the variable resistance memory device may be formed.

A lower surface of the second electrode 240 or the fifth electrode 440 in the variable resistance memory device need not have an area equal to that of an upper surface of the underlying first variable resistance pattern 230.

Sidewalls of the fifth electrode 440 may be substantially covered by an eleventh insulating interlayer 445.

Figure 44:
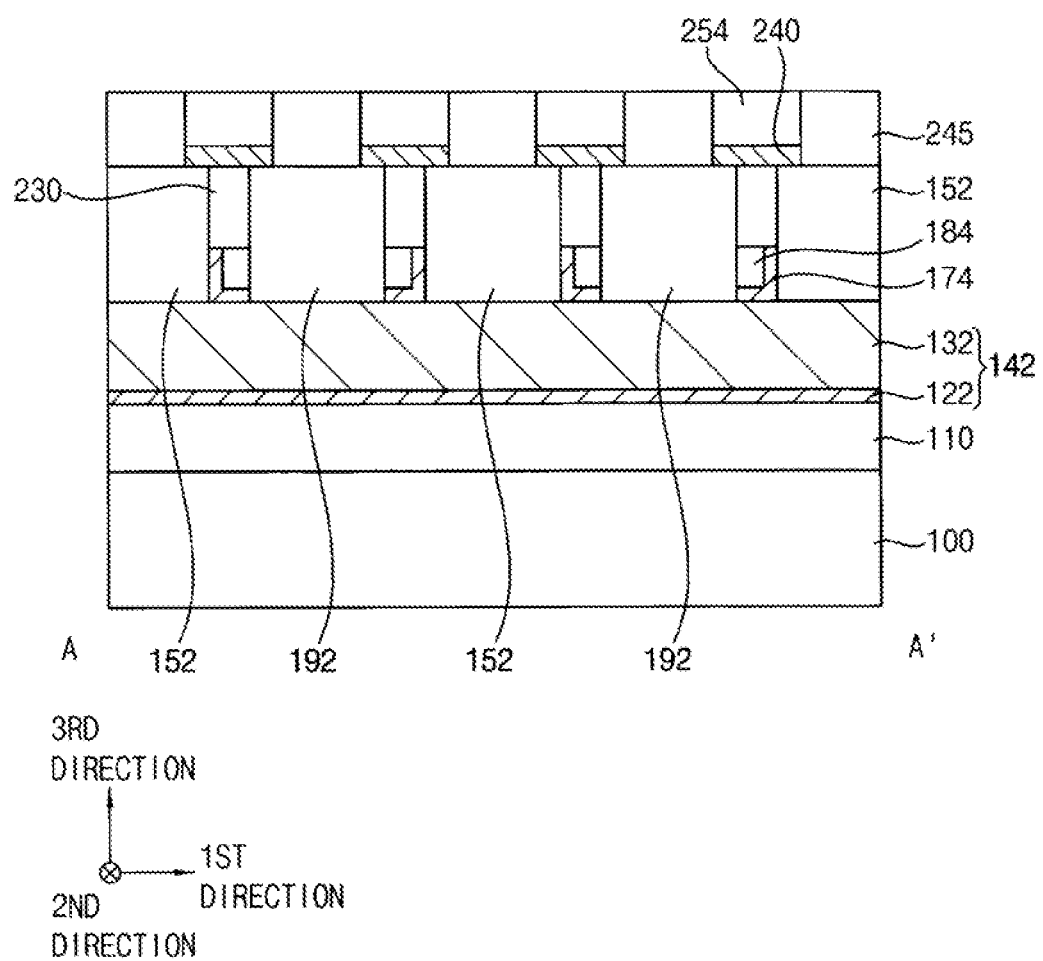
Figure 47:
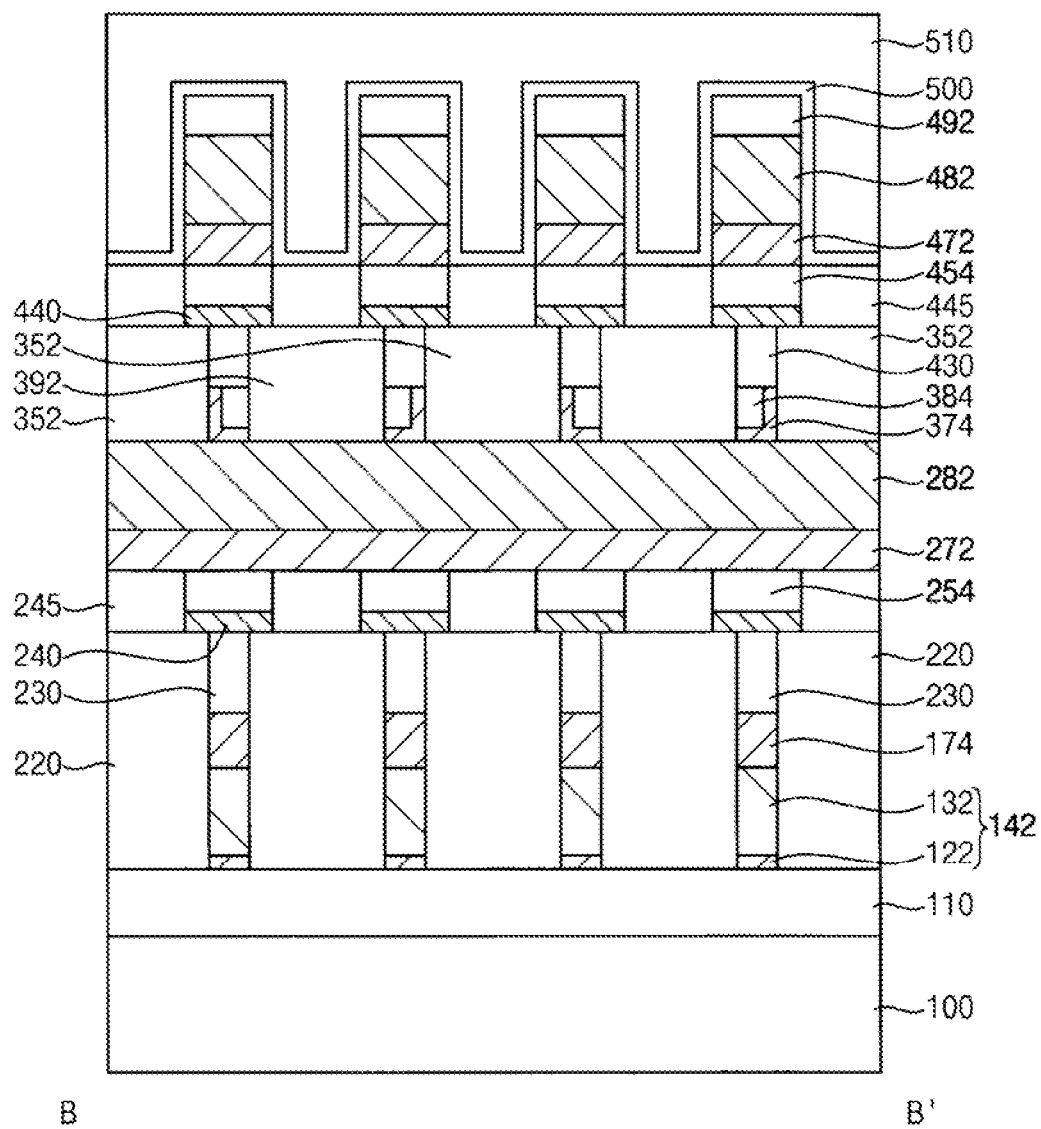

FIGS. 44 to 47 are cross-sectional views illustrating stages of a method of manufacturing a variable resistance memory device in accordance with an exemplary embodiment of the present inventive concept. FIGS. 44 and 46 are cross-sectional views taken along a line A-A' of corresponding plan views, respectively, and FIGS. 45 and 47 are cross-sectional views taken along a line B-B' of corresponding plan views. The method of manufacturing the variable resistance memory device may include processes substantially the same as or similar to those described with reference to FIGS. 40 to 43. Thus, like reference numerals may refer to like elements, and duplicative descriptions may be omitted.

Referring to FIGS. 44 and 45, processes substantially the same as or similar to those described with reference to FIGS. 40 to 41 may be performed.

A first selection pattern 254 and the second electrode 240 may be formed. The second electrode 240 may be in direct contact with an upper surface of the first variable resistance pattern 230.

As an example, a second electrode layer and a first selection layer may be sequentially formed on the first variable resistance pattern 230, the fourth insulating interlayer 220, and the second and third insulating interlayer patterns 152 and 192. The second electrode layer and the first selection layer may be patterned to form the second electrode 240 and the first selection pattern 254, respectively.

In an exemplary embodiment of the present inventive concept, a plurality of second electrodes 240 and a plurality of first selection patterns 254 may be formed in each of the first and second directions. A lower surface of the second electrode 240 may have an area equal to or greater than that of an upper surface of the first variable resistance pattern 230.

After forming the second electrode 240 and the first selection pattern 254, the tenth insulating interlayer 245 may be formed on the fourth insulating interlayer 220, and the second and third insulating interlayer patterns 152 and 192 to cover the second electrode 240 and the first selection pattern 254. The tenth insulating interlayer 245 may be planarized until an upper surface of the first selection pattern 254 is exposed.

Referring to FIGS. 46 and 47, processes substantially the same as or similar to those described with reference to FIGS. 42 and 43 may be performed, and thus the variable resistance memory device may be formed.

As an example, a buffer may be omitted on the first selection pattern 254 or a second selection pattern 454.

The first selection pattern 254 or the second selection pattern 454 in the variable resistance memory device described with reference to FIGS. 46 to 47 need not extend in the second direction or in the first direction, but a plurality of first selection patterns 254 or a plurality of second selection patterns 454 may be formed in each of the first and second directions. A buffer may be omitted on each the first and second selection patterns 254 and 454.

FIGS. 48 to 51 are cross-sectional views illustrating a method of manufacturing a variable resistance memory device in accordance with an exemplary embodiment of the present inventive concept. FIGS. 48 to 50 are cross-sectional views taken along a line A-A' of corresponding plan views, respectively, and FIG. 51 is a cross-sectional view taken along a line B-B' of a corresponding plan view. The method of manufacturing the variable resistance memory device may include processes substantially the same as or similar to those described with reference to FIGS. 1 to 35. Thus, like reference numerals may refer to like elements, and duplicative descriptions may be omitted.

Referring to FIG. 48, processes substantially the same as or similar to those described with reference to FIGS. 1 and 2 may be performed.

After sequentially forming the first insulating interlayer 110, the first barrier layer 120, the first metal layer 130, the third electrode layer 270, and the first selection layer 250 on the substrate 100, the second insulating interlayer 150 having the first opening 160 may be formed on the first selection layer 250.

Referring to FIG. 49, processes substantially the same as or similar to those described with reference to FIGS. 3 to 21 may be performed.

Thus, the first selection layer 250, the third electrode layer 270, and the first conductive layer structure 140 may be etched to form a first selection pattern 253, a third electrode 273, and the first conductive line 142.

The second metal layer 280 may be formed on the second electrode 240, the fourth insulating interlayer 220, and the second and third insulating interlayer patterns 152 and 192.

Referring to FIGS. 50 and 51, processes substantially the same as or similar to those described with reference to FIGS. 22 to 35 may be performed, and thus the variable resistance memory device may be formed.

The first selection pattern 253 in the variable resistance memory device described with reference to FIGS. 48 and 51 need not extend in the second direction under the second conductive line 282. The first selection pattern 253 may extend in the first direction on the first conductive line 142. The third electrode 273 may be formed between the first conductive line 142 and the first selection pattern 253.

The second selection pattern 453 may extend in the second direction on the second conductive line 282. A sixth electrode 473 may be formed between the second conductive line conductive line 282 and the second selection pattern 453.

Figure 52:
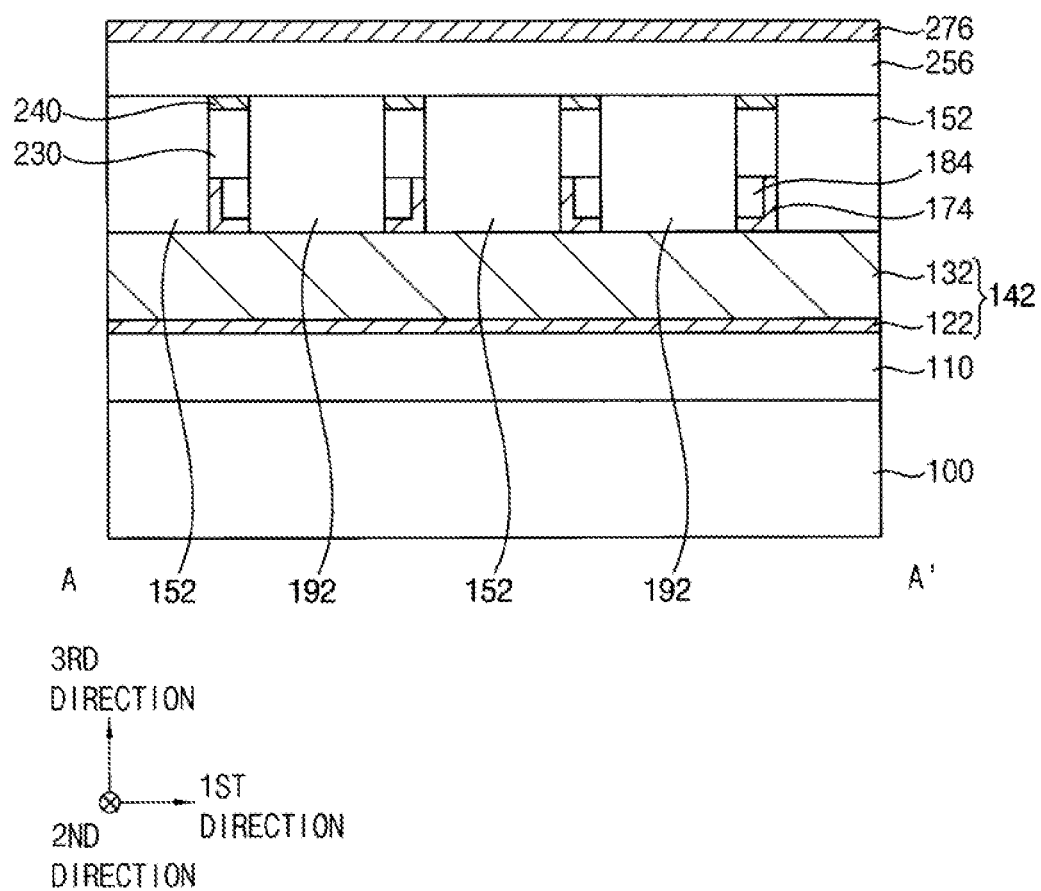
Figure 54:
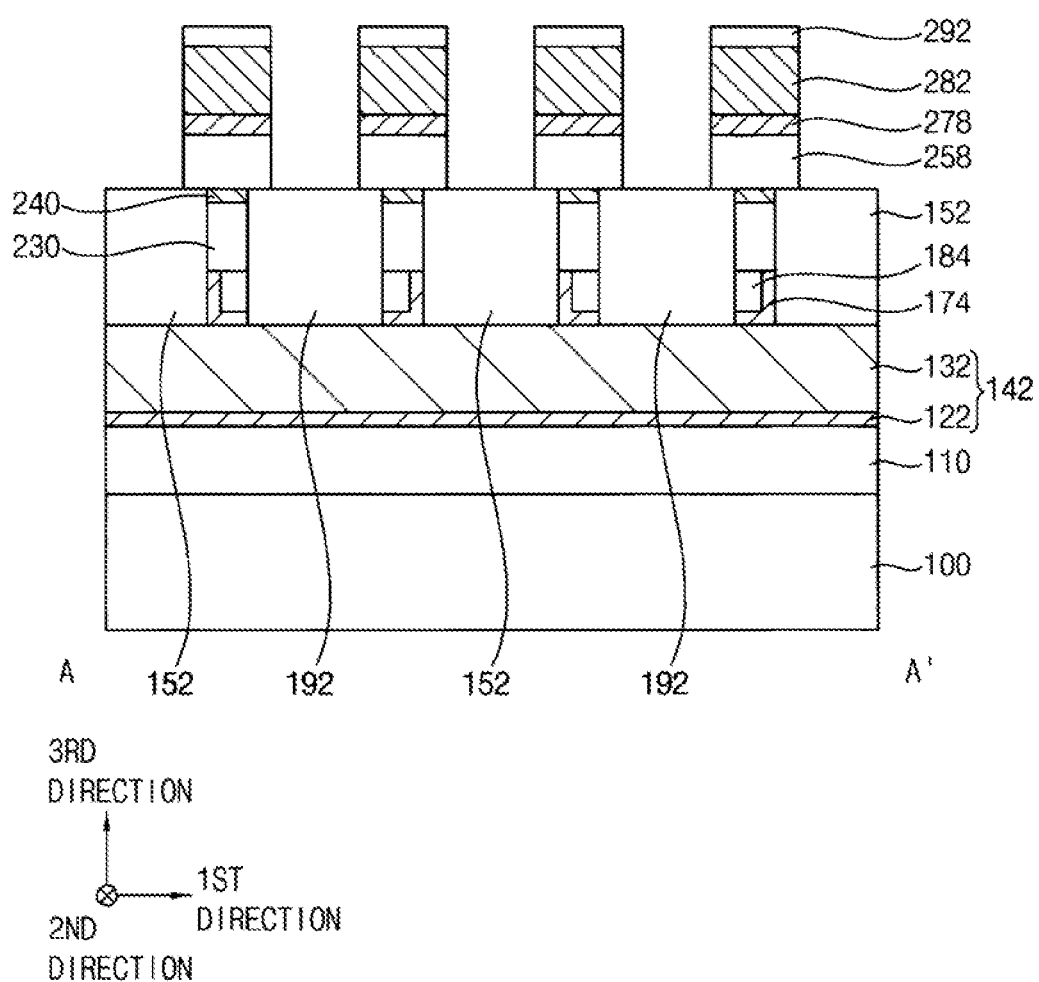
Figure 55:
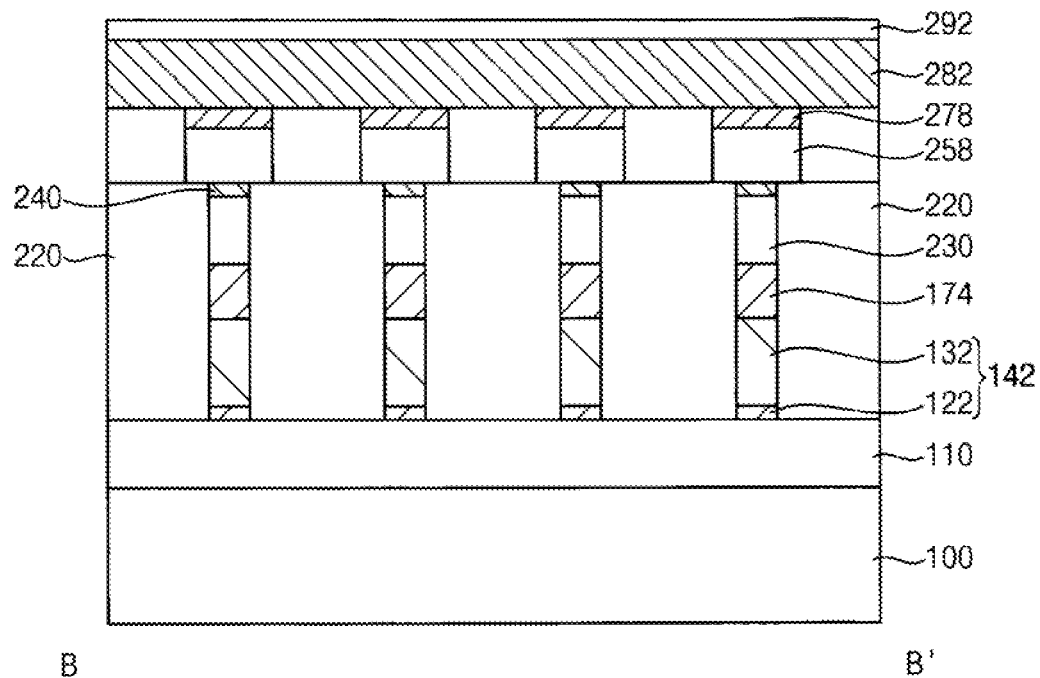

FIGS. 52 to 57 are cross-sectional views illustrating a method of manufacturing a variable resistance memory device in accordance with an exemplary embodiment of the present inventive concept. FIGS. 52, 54 and 56 are cross-sectional views taken along a line A-A' of corresponding plan views, respectively, and FIGS. 53, 55 and 57 are cross-sectional views taken along a line B-B' of corresponding plan views. The method of manufacturing the variable resistance memory device may include processes substantially the same as or similar to those described with reference to FIGS. 1 to 35. Thus, like reference numerals may refer to like elements, and duplicative descriptions may be omitted.

Referring to FIGS. 52 and 53, processes substantially the same as or similar to those described with reference to FIGS. 1 and 20 may be performed.

The first selection layer 250 and the third electrode layer 270 may be sequentially formed on the second electrode 240, the fourth insulating interlayer 220, and the second and third insulating interlayer patterns 152 and 192, and may be etched along the first direction to form a preliminary first selection pattern 256 and a preliminary third electrode 276 extending in the first direction.

The tenth insulating interlayer 245 may be formed on the fourth insulating interlayer 220, and the second and third insulating interlayer patterns 152 and 192 to substantially cover sidewalk of the preliminary first selection pattern 256 and the preliminary third electrode 276.

Alternatively, after forming the tenth insulating interlayer 245, the tenth insulating interlayer 245 may be partially etched to form a fourth opening extending in the first direction and exposing an upper surface of the second electrode 240, and the preliminary first selection pattern 256 and the preliminary third electrode 276 may be formed to fill the fourth opening.

Referring to FIGS. 54 and 55, the second metal layer 280 may be formed on the preliminary third electrode 276 and the tenth insulating interlayer 245, and a DPT process (e.g., the DPI process described with reference to FIGS. 8 to 14) may be performed to form the third mask 292 on the second metal layer 280. The second metal layer 280 the preliminary third electrode 276, the preliminary first selection pattern 256 and the tenth insulating interlayer 245 may be etched using the third mask 292 as an etching mask.

Thus, the second metal pattern 282 extending in the second direction, and a plurality of third electrodes 278 and a plurality of first selection pattern 258 disposed in each of the first and second directions may be formed. The first selection pattern 258 need not extend in the second direction, however, the plurality of first selection pattern 258 may be spaced apart from each other in each of the first and second directions, and thus interference between neighboring memory cells may be reduced or eliminated. Even if the first selection pattern 258 is formed by performing an etching process two or more times, the first selection pattern 258 need not be etched together with the first variable resistance pattern 230 in the same etching process, and thus an occurrence of damage to the first selection pattern 258 or a redaction in reliability of the first selection pattern 258 may be reduced or eliminated.

Referring to FIGS. 56 and 57, processes substantially the same as or similar to those described with reference to FIGS. 25 to 27 may be performed, and thus the variable resistance memory device may be formed.

A plurality of second selection patterns 458 and a plurality of sixth electrodes 478 may be formed in each of the first and second directions.

Referring to FIGS. 52 to 57, each of the first and second selection patterns 258 and 458 might not extend in a direction but a plurality of first selection patterns 258 and a plurality of second selection patterns 458 may be formed. The variable resistance memory device described with reference to FIGS. 36 to 39 and the variable resistance memory device described with reference to FIGS. 40 to 43 may include the plurality of first selection patterns 258 and the plurality of second selection patterns 458.

As an example, the variable resistance memory device in accordance with an exemplary embodiment of the present inventive concept may be applied to PRAM devices, ReRAM devices, or MRAM devices.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:
1. A variable resistance memory device, comprising:
first conductive lines positioned above a substrate, wherein each of the first conductive lines extends in a first direction and the first conductive lines are disposed in a second direction crossing the first direction and wherein the first and second directions are substantially parallel to an upper surface of the substrate;
second conductive lines each extending in the second direction, wherein the second conductive lines are disposed in the first direction, and wherein the second conductive lines are positioned above the first conductive lines;
a memory unit positioned between the first and second conductive lines, wherein the memory unit overlaps the first and second conductive lines in a third direction substantially perpendicular to the upper surface of the substrate, and wherein the memory unit includes:
a first electrode;
a variable resistance pattern positioned on the first electrode; and
a second electrode positioned on the variable resistance pattern; and a selection pattern positioned on each of the first conductive lines, wherein the selection pattern extends in the first direction and is in contact with lower surfaces of the memory units,
wherein the selection pattern has a first width along the first direction wider than a second width of the variable resistance pattern along the first direction, the second width being substantially constant in the third direction,
wherein a cross-section of the first electrode taken along the first direction has an "L" shape.

2. The variable resistance memory device of claim 1, further comprising a third electrode extending in the first direction between the selection pattern and a corresponding one of the first conductive lines.

3. The variable resistance memory device of claim 2, wherein a lower surface of the selection pattern and an upper surface of the third electrode have substantially a same shape and width as each other.

4. The variable resistance memory device of claim 1, wherein a lower surface of the second electrode and an upper surface of the variable resistance pattern have substantially a same shape and width as each other.

5. The variable resistance memory device of claim 1, wherein a lower surface of the second electrode has an area greater than that of an upper surface of the variable resistance pattern.

6. The variable resistance memory device of claim 1, wherein the second electrode has a third width along the first direction equal to the second width of the variable resistance pattern along the first direction.

7. The variable resistance memory device of claim 1, wherein the selection pattern and the memory unit have substantially a same width along the second direction.

8. The variable resistance memory device of claim 7, wherein the width of the selection pattern and the memory unit along the second direction is substantially constant in the third direction.

9. The variable resistance memory device of claim 1, wherein the selection pattern includes an ovonic threshold switch (OTS) material including germanium, silicon, arsenic and tellurium.

10. The variable resistance memory device of claim 9, wherein the selection pattern further includes at least one of selenium, sulfur, carbon, nitrogen, indium, or boron.

11. The variable resistance memory device of claim 1, wherein the selection pattern includes at least one of AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, or $Ge_xSe_{1-x}$.

12. A variable resistance memory device, comprising:
first conductive lines positioned above a substrate, wherein each of the first conductive lines extends in a first direction and the first conductive lines are disposed in a second direction crossing the first direction, and wherein the first and second directions are substantially parallel to an upper surface of the substrate;
second conductive lines each extending in the second direction, wherein the second conductive lines are disposed in the first direction, and wherein the second conductive lines are positioned above the first conductive lines;
a memory unit positioned between the first and second conductive lines, wherein the memory unit overlaps the first and second conductive lines in a third direction substantially perpendicular to the upper surface of the substrate, and wherein the memory unit includes:
a first electrode;
a variable resistance pattern positioned on the first electrode; and
a second electrode positioned on the variable resistance pattern; and
a selection pattern positioned on each of the first conductive lines, wherein the selection pattern extends in the first direction and is in contact with lower surfaces of the memory units,
wherein a width of the selection pattern along the first direction is wider than a width of the variable resistance pattern along the first direction, and
wherein a width of an upper surface of the selection pattern along the first direction is wider than a width of a lower surface of the first electrode along the first direction, the upper surface of the selection pattern and the lower surface of the second electrode directly contacting each other, and
wherein a cross-section of the first electrode taken along the first direction has an "L" shape.

13. The variable resistance memory device of claim 12, further comprising a third electrode extending in the first direction between the selection pattern and a corresponding one of the first conductive lines.

14. The variable resistance memory device of claim 13, wherein a lower surface of the selection pattern and an upper surface of the third electrode have substantially a same shape and width as each other.

15. The variable resistance memory device of claim 12, wherein a lower surface of the second electrode and an upper surface of the variable resistance pattern have substantially a same shape and width as each other.

16. The variable resistance memory device of claim 12, wherein a width of the second electrode along the first direction is equal to the width of the variable resistance pattern along the first direction.

17. The variable resistance memory device of claim 12, wherein a width of the selection pattern along the second direction is equal to a width of corresponding ones of the memory unit along the second direction.

18. The variable resistance memory device of claim 12, wherein the selection pattern includes an ovonic threshold switch (OTS) material including germanium, silicon, arsenic and tellurium.

19. The variable resistance memory device of claim 18, wherein the selection pattern further includes at least one of selenium, sulfur, carbon, nitrogen, indium, or boron.

20. The variable resistance memory device of claim 12, wherein the selection pattern includes at least one of AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, or $Ge_xSe_{1-x}$.

* * * * *